US012600903B2

(12) United States Patent
Kwon et al.

(10) Patent No.: US 12,600,903 B2
(45) Date of Patent: Apr. 14, 2026

(54) DELAYED FLUORESCENCE COMPOUND, AND ORGANIC LIGHT-EMITTING DEVICE COMPRISING SAME

(71) Applicant: UNIVERSITY-INDUSTRY COOPERATION GROUP OF KYUNG HEE UNIVERSITY, Yongin-si (KR)

(72) Inventors: Jang Hyuk Kwon, Seongnam-si (KR); Ju Young Lee, Suwon-si (KR); Ramanaskanda Braveenth, Seoul (KR); Kijoon Yang, Seoul (KR); Hyuna Lee, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 402 days.

(21) Appl. No.: 18/039,108

(22) PCT Filed: Apr. 20, 2021

(86) PCT No.: PCT/KR2021/004966

§ 371 (c)(1),
(2) Date: May 26, 2023

(87) PCT Pub. No.: WO2022/114407

PCT Pub. Date: Jun. 2, 2022

(65) Prior Publication Data

US 2024/0147855 A1 May 2, 2024

(30) Foreign Application Priority Data

Nov. 26, 2020 (KR) ........................ 10-2020-0161697

(51) Int. Cl.

| | |
|---|---|
| ***C09K 11/06*** | (2006.01) |
| ***C07F 5/02*** | (2006.01) |
| ***H10K 85/60*** | (2023.01) |
| *H10K 50/12* | (2023.01) |
| *H10K 101/20* | (2023.01) |

(52) U.S. Cl.

CPC .............. *C09K 11/06* (2013.01); *C07F 5/027* (2013.01); *H10K 85/658* (2023.02); *C09K 2211/1018* (2013.01); *H10K 50/12* (2023.02); *H10K 2101/20* (2023.02)

(58) Field of Classification Search

CPC ........ C09K 11/06; C07F 5/027; H10K 85/658
See application file for complete search history.

(56) References Cited

U.S. PATENT DOCUMENTS

2023/0098353 A1 3/2023 Li et al.

FOREIGN PATENT DOCUMENTS

| | | | |
|---|---|---|---|
| CN | 110790782 A | * | 2/2020 |
| CN | 110903311 A | | 3/2020 |
| CN | 110981899 A | | 4/2020 |
| CN | 111864098 A | | 10/2020 |
| KR | 10-2019-0119701 A | | 10/2019 |
| KR | 10-2063221 B1 | | 1/2020 |
| KR | 10-2020-0107848 A | | 9/2020 |
| KR | 10-2022-0064002 A | | 5/2022 |

OTHER PUBLICATIONS

Korean Office Action for 10-2020-0161697, dated Oct. 19, 2022.
International Search Report for PCT/KR2021/004966, dated Aug. 13, 2021.

* cited by examiner

*Primary Examiner* — Shawquia Jackson
(74) *Attorney, Agent, or Firm* — Sughrue Mion, PLLC

(57) ABSTRACT

The present specification relates to a delayed fluorescence compound represented by chemical formula 1 and an organic light-emitting device comprising same, and achieves delayed fluorescence light sensitive hyperfluorescence properties by the use of a compound that exhibits deep blue properties and has a low singlet-triplet energy difference, and a fluorescence compound which, relative to conventional delayed fluorescence material, exhibits deep blue properties, has a narrow half-width, and has excellent color purity.

7 Claims, 3 Drawing Sheets

[FIG. 1]
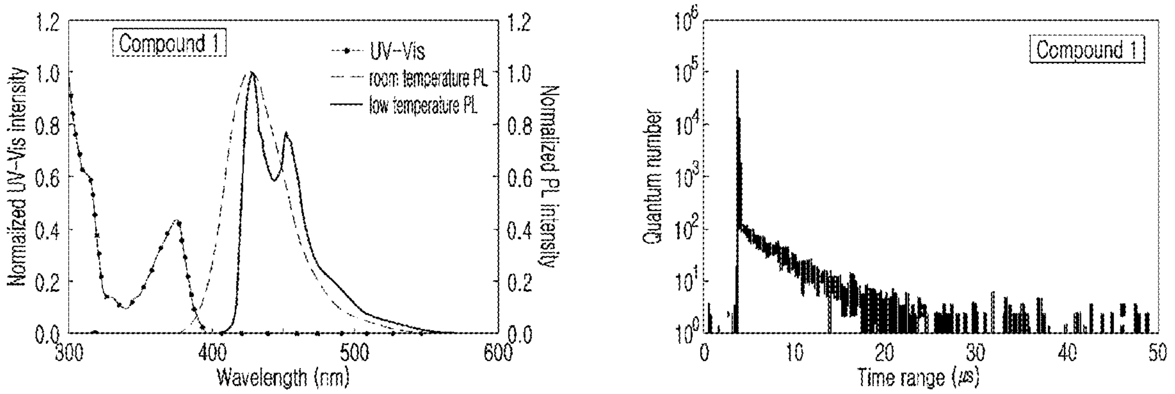
[FIG. 2]
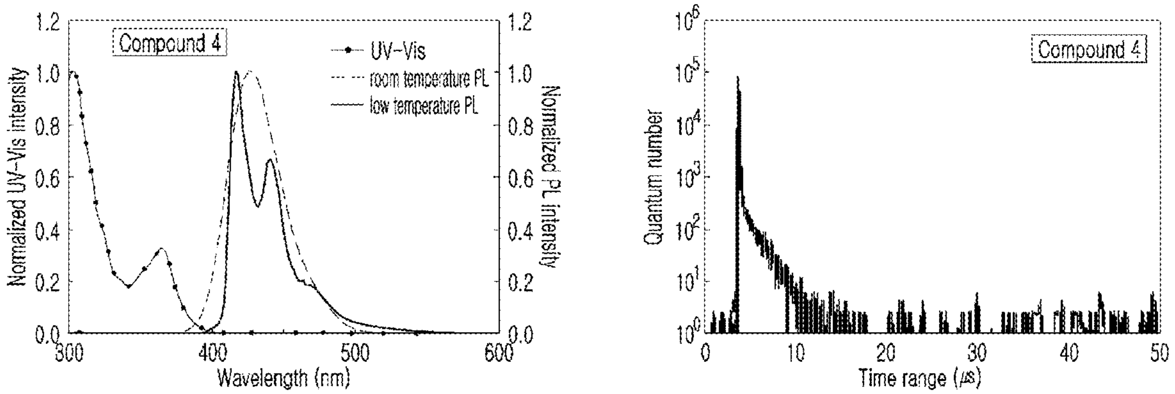

[FIG. 3]
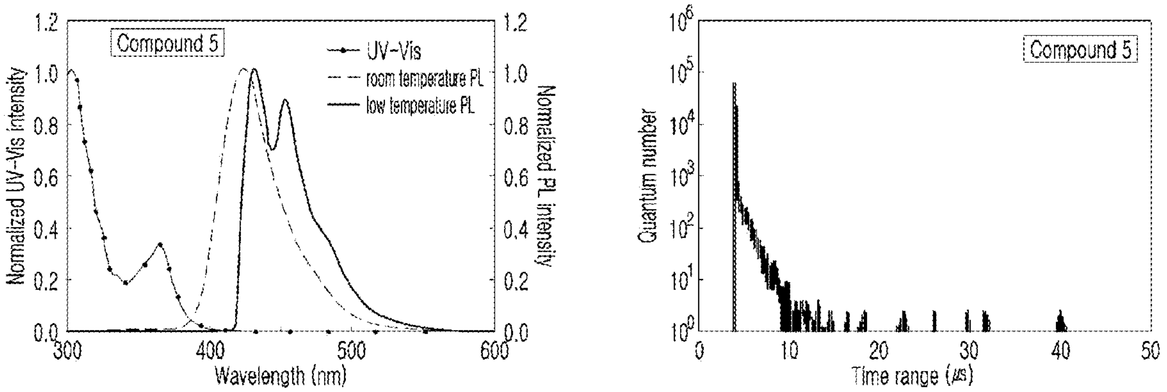
[FIG. 4]
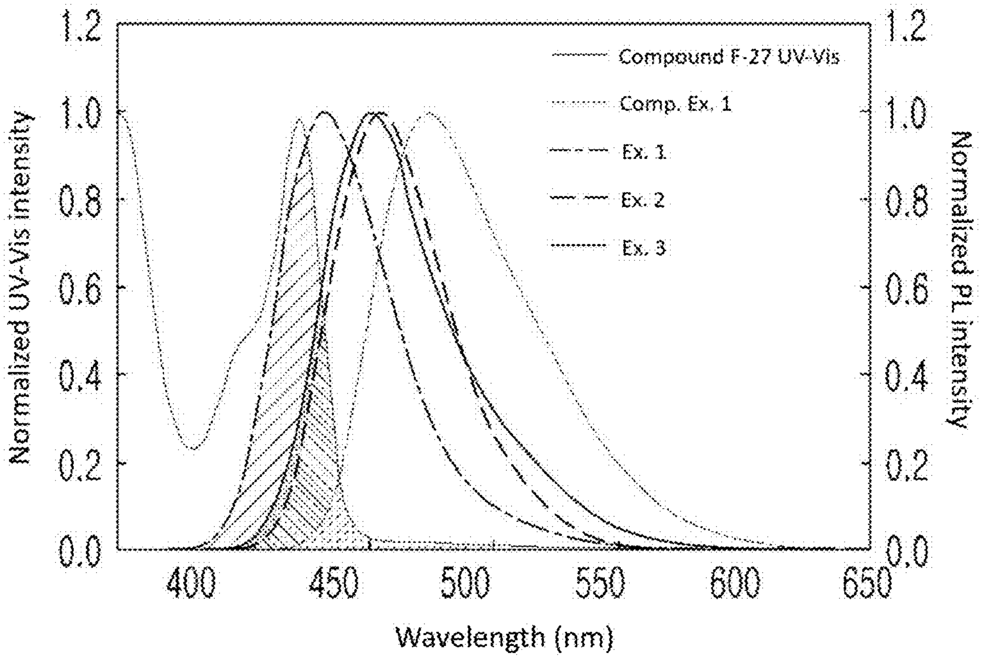

[FIG. 5]
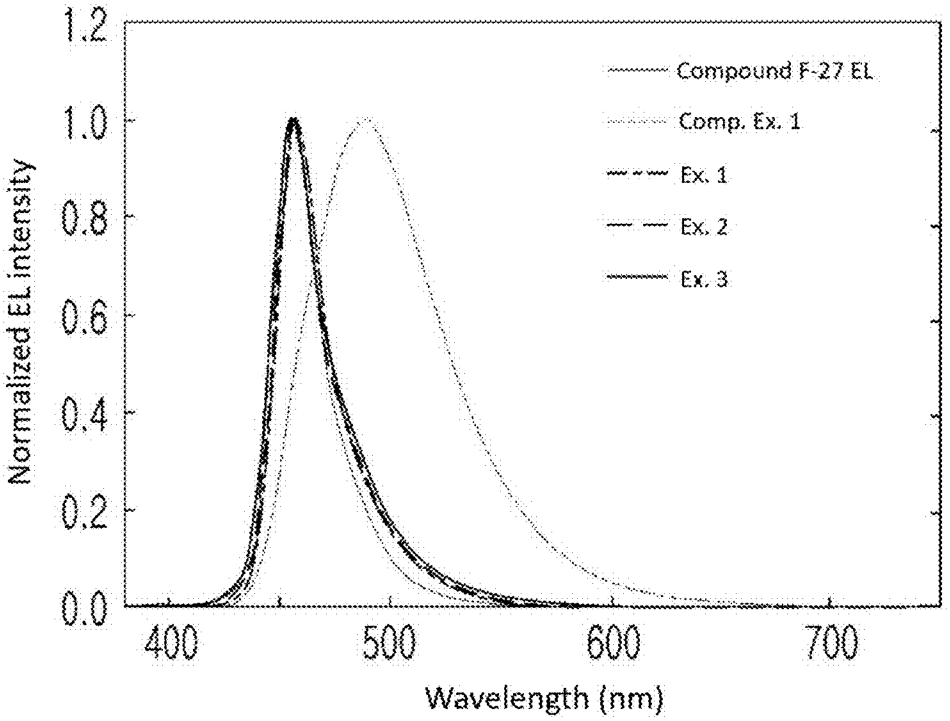

DELAYED FLUORESCENCE COMPOUND, AND ORGANIC LIGHT-EMITTING DEVICE COMPRISING SAME

CROSS REFERENCE TO RELATED APPLICATIONS

This application is a National of Application No. PCT/KR2021/004966 filed Apr. 20, 2021, claiming priority based on Korean Patent Application No. 10-2020-0161697 filed Nov. 26, 2020, the entire disclosures of which are incorporated herein by reference.

TECHNICAL FIELD

The present invention relates to a compound and an organic light-emitting device including the same, and more specifically, to a compound exhibiting thermally activated delayed fluorescence (TADF) properties, a delayed fluorescence organic light-emitting device including the same, and a hyperfluorescence organic light-emitting device including the compound and a fluorescent material.

BACKGROUND ART

Organic light emission refers to a phenomenon in which electrical energy is converted into light energy using organic materials. An organic light-emitting device (OLED) is manufactured by interposing an organic material between an anode and a cathode using such organic light emission, and has a characteristic of emitting light when electrical energy is applied. The OLED includes multiple organic layers to improve efficiency and stability, and generally consists of a hole injection layer (HIL), a hole transfer layer (HTL), a light-emitting layer, and an electron transfer layer (ETL), and an electron injection layer (EIL).

Materials used as organic layers can be classified into light-emitting materials and charge transport materials according to their functions, and the light-emitting materials may be classified into a fluorescent material using a fluorescence phenomenon derived from a singlet excited state of electrons and a phosphorescent material using a phosphorescence phenomenon derived from a triplet excited state, according to a light-emitting mechanism. In addition, the light-emitting material may be divided into blue, green, and red light-emitting materials according to the light-emitting color, and the phosphorescent material has been developed and used in the industry for the remaining colors except blue. However, in the case of blue materials, only fluorescent materials are used due to limitations in lifetime and color properties, and a blue phosphorescent material using a triplet using a heavy metal such as iridium or platinum, and a delayed fluorescence material using a triplet only as pure organic materials by making the energy difference between a singlet and triplet small are being developed. However, in the case of using a phosphorescent material using heavy metals, high efficiency can be achieved, but economic feasibility is insufficient due to heavy metals for implementing phosphorescence, and there are difficulties in mining due to social problems.

Therefore, interest in delayed fluorescent materials is increasing, and research is ongoing on various color gamuts such as green, yellow, orange, and red, not limited to blue. Unlike conventional fluorescence, in which 75% of the triplet energy is lost using only singlet energy, in delayed fluorescence, the energy of both the triplet and singlet can be utilized by designing the molecule so that the energy difference between the singlet and triplet is small, and inducing reverse inter-system crossing from the triplet to singlet with only thermal energy at room temperature. Therefore, since the triplet can be used without a heavy metal material like the phosphorescent material, the efficiency of the material is higher than that of a fluorescent material, and fluorescence light emission is realized via the triplet, so that it is called delayed fluorescence.

The properties of the OLED may depend on a dopant material of the light-emitting layer, and a dopant for delayed fluorescent should have a small overlap between the highest occupied molecular orbital (HOMO) and the lowest unoccupied molecular orbital (LUMO) in order to minimize the energy difference between the singlet and triplet. To this end, a donor-acceptor structure is mainly used, and in the case of this structure, there is a problem in that the electroluminescence spectrum is widened due to a light emitting method through intra-molecule charge transfer. Therefore, when a compound having a conventional donor-acceptor structure is applied as a delayed fluorescent material, there is a disadvantage in that a luminescence spectrum is wide and color purity is inferior.

In addition, a delayed fluorescence light sensitive hyperfluorescence device in which a small amount of a fluorescence compound is added to the light-emitting layer of the delayed fluorescence device is being studied. The delayed fluorescence light sensitive hyperfluorescence device can realize high efficiency by transferring excitons obtained through the reverse inter-system crossing of the delayed fluorescence compound to a fluorescence compound, and simultaneously realize high color purity by emitting a fluorescence compound having a narrow half-width.

At this time, as the light-emitting wavelength of the delayed fluorescence compound and an absorption wavelength of the fluorescence compound overlap, since it is advantageous for energy transfer from the delayed fluorescence compound to the fluorescence compound, it is necessary to develop a delayed fluorescence compound having deep blue light emitting properties and a fluorescence compound having narrow Stoke's shift properties.

DISCLOSURE

Technical Problem

The present invention is to solve the problems of the related art, and one object of the present invention is to provide a delayed fluorescence compound.

Another object of the present invention is to provide an organic light-emitting device including the delayed fluorescence compound having improved color properties.

In addition, another object of the present invention is to provide an organic light-emitting device exhibiting hyperfluorescence properties capable of effective energy transfer by increasing spectral overlap between the delayed fluorescence compound and a fluorescent material through improved color properties.

Technical Solution

One aspect of the present invention provides a delayed fluorescence compound represented by Chemical Formula 1 below:

[Chemical Formula 1]

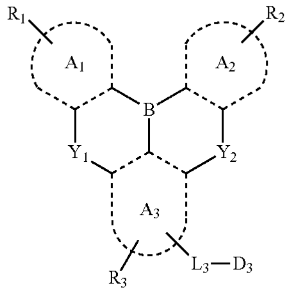

in Chemical Formula 1, $D_3$ is represented by Chemical Formula 2 below,

[Chemical Formula 2]

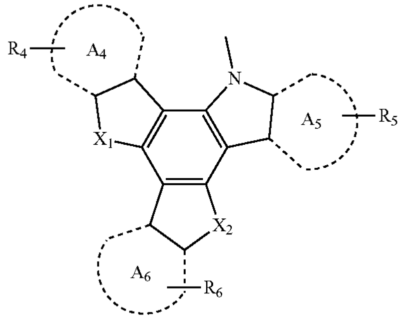

in the above Chemical Formulae, $A_1$ to $A_6$ are each independently a ring structure selected from a substituted or unsubstituted $C_5$-$C_{60}$ carbocyclic group, a substituted or unsubstituted $C_2$-$C_{60}$ heterocyclic group, a $C_6$-$C_{60}$ aryl group, and a $C_5$-$C_{60}$ heteroaryl group, $X_1$ and $X_2$ are each independently O, N—$R_7$, $C(R_8)_2$, or S; at least one of $X_1$ and $X_2$ is not N—$R_7$; $Y_1$ and $Y_2$ are each independently selected from O or S; $L_3$ is a single bond or $C_6$-$C_{60}$ arylene; $R_1$ to $R_6$ are each independently selected from hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted monovalent non-aromatic condensed polycyclic group, and a substituted or unsubstituted monovalent non-aromatic heterocondensed polycyclic group; and $R_7$ and $R_8$ are each independently selected from hydrogen, deuterium, a substituted or unsubstituted $C_1$-$C_{60}$ alkyl group, a substituted or unsubstituted $C_3$-$C_{10}$ cycloalkyl group, a substituted or unsubstituted $C_6$-$C_{60}$ aryl group, and a substituted or unsubstituted $C_6$-$C_{60}$ heteroaryl group.

In one embodiment, the delayed fluorescence compound may be represented by any one of the following Chemical Formulas T-1 to T-144:

Compound T-1

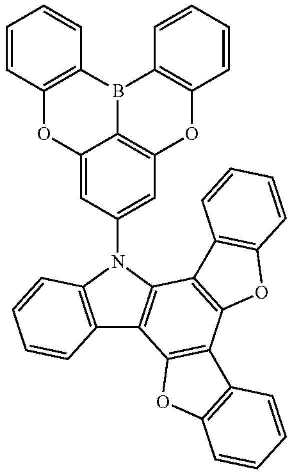

Compound T-2

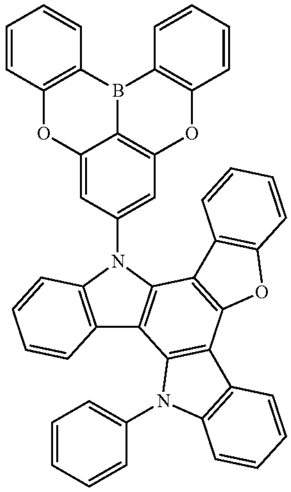

Compound T-3

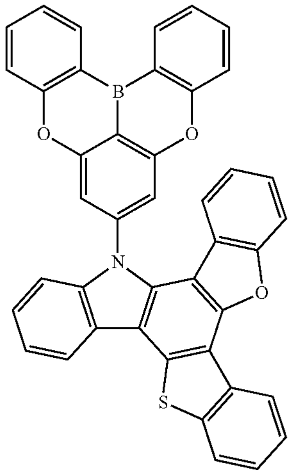

-continued
Compound T-4
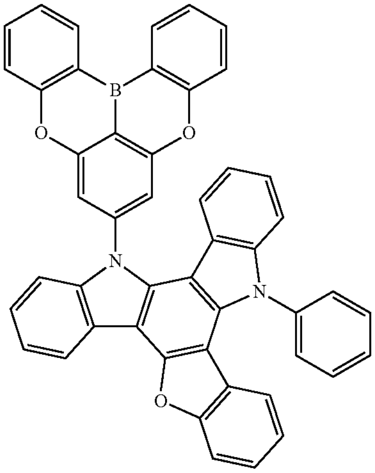
Compound T-5
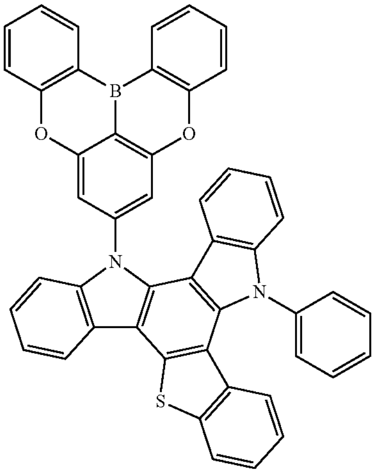
Compound T-6
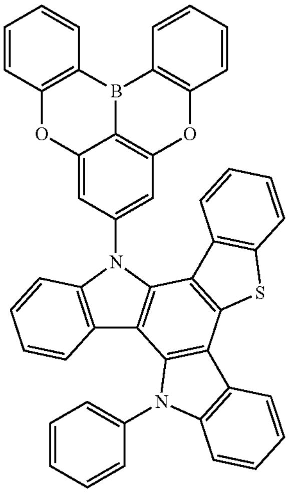
-continued
Compound T-7
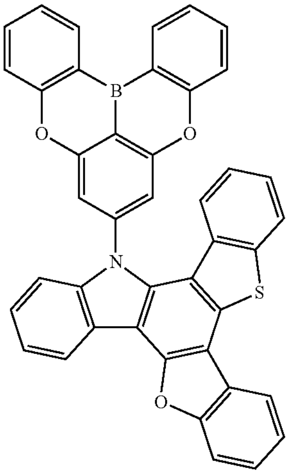
Compound T-8
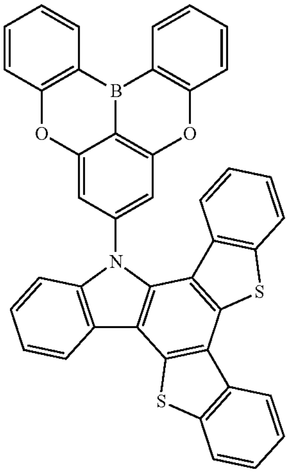
Compound T-9
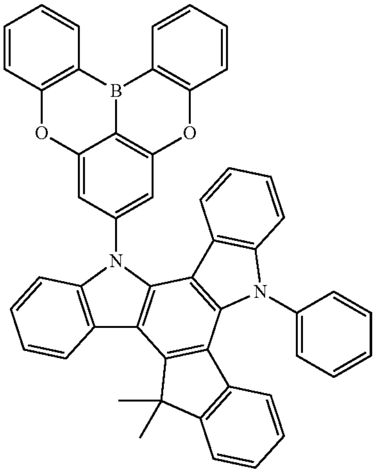

Compound T-10
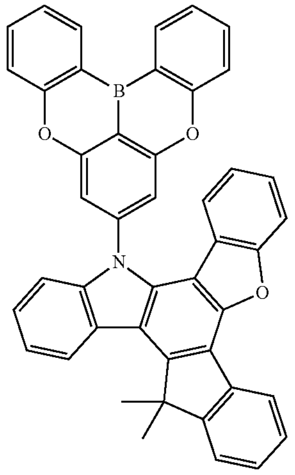
Compound T-11
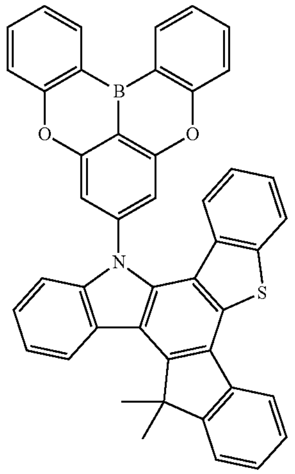
Compound T-12
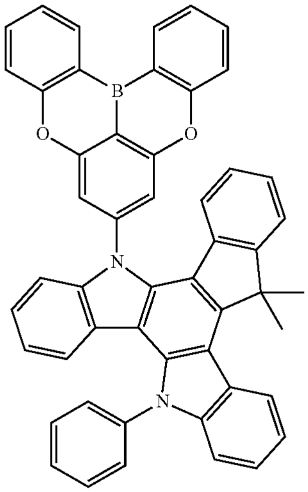
Compound T-13
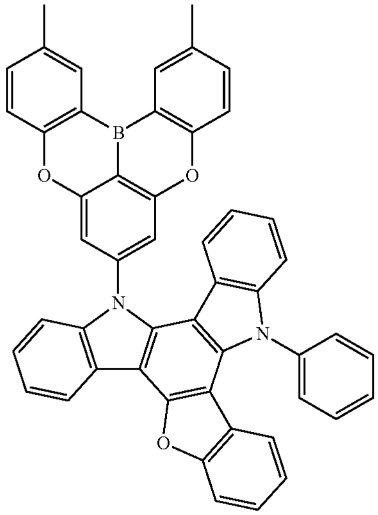
Compound T-14
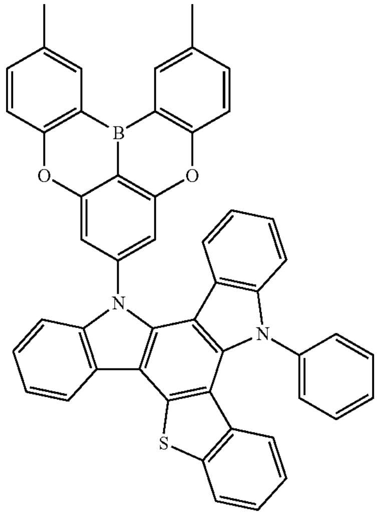
Compound T-15
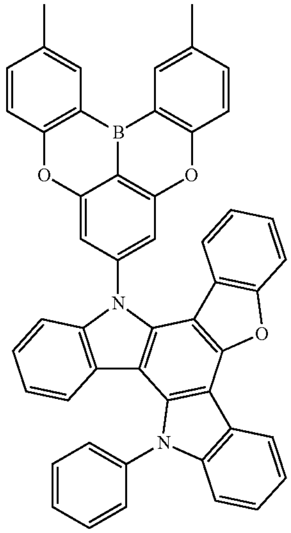

-continued
Compound T-16
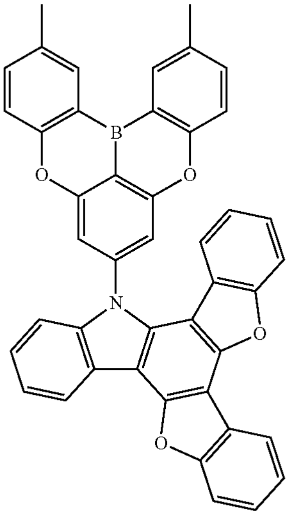
Compound T-17
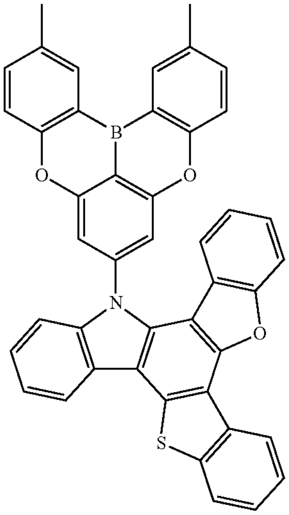
Compound T-18
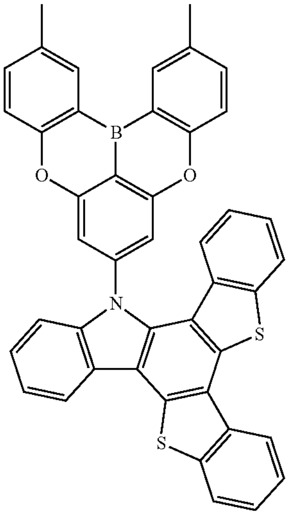
-continued
Compound T-19
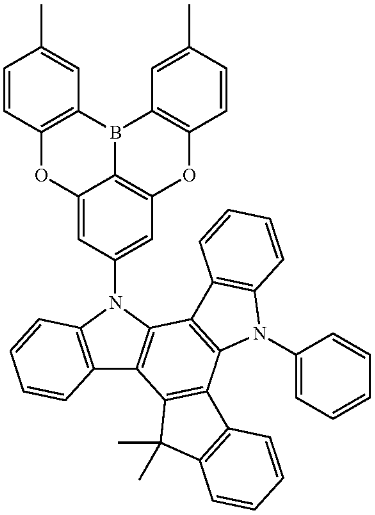
Compound T-20
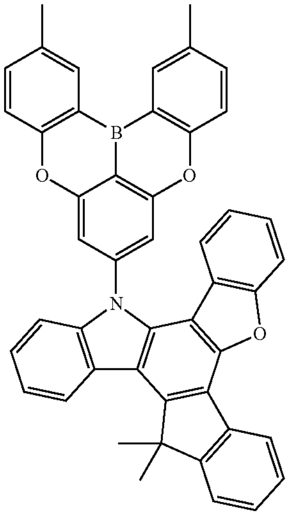
Compound T-21
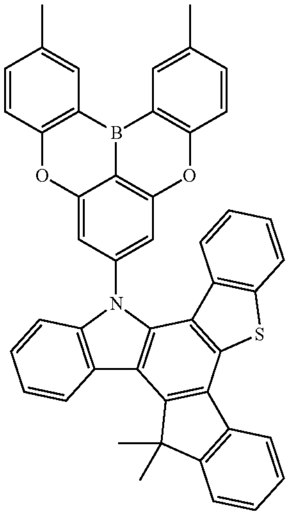

-continued
Compound T-22
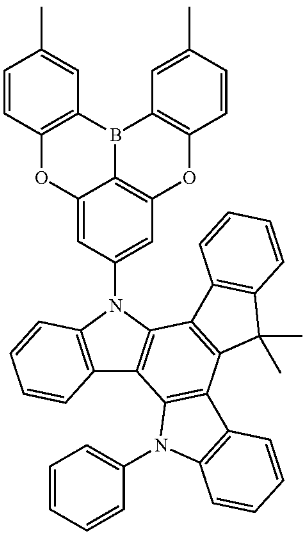
Compound T-23
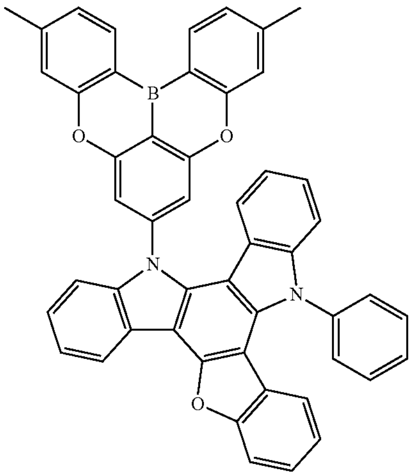
Compound T-24
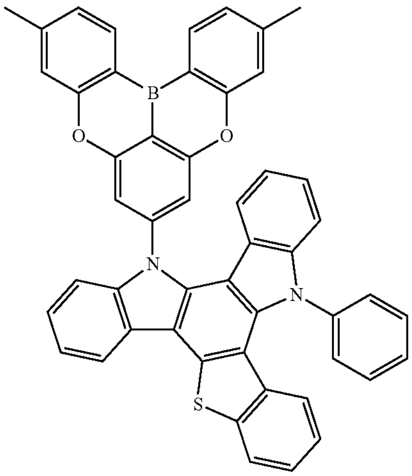
-continued
Compound T-25
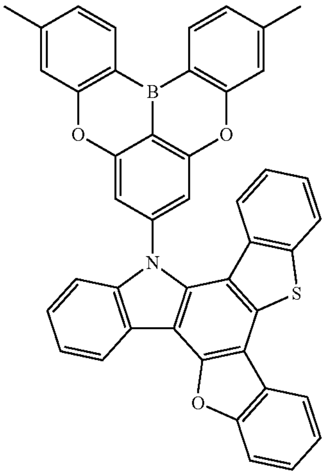
Compound T-26
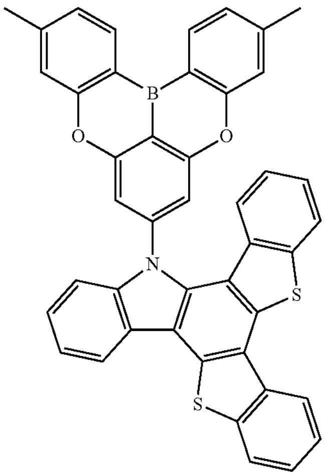
Compound T-27
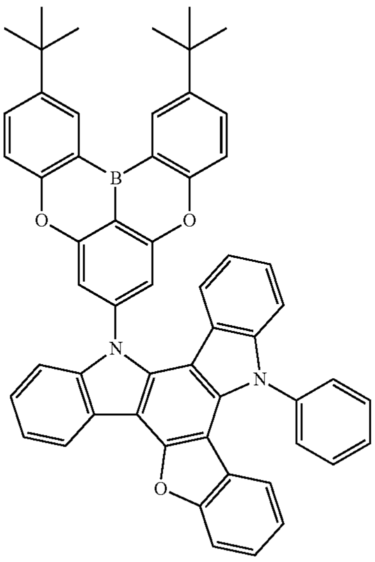

-continued
Compound T-28
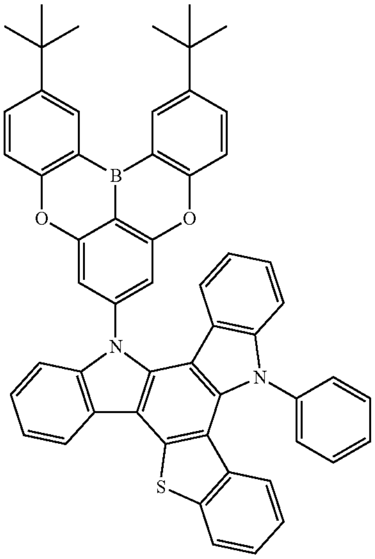
Compound T-30
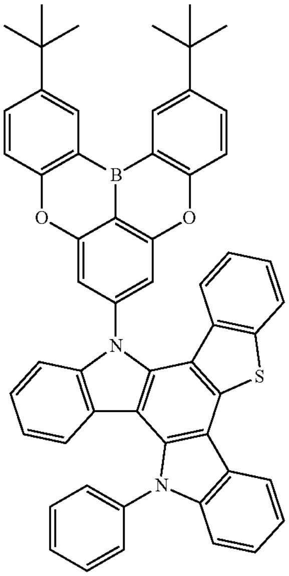
Compound T-29
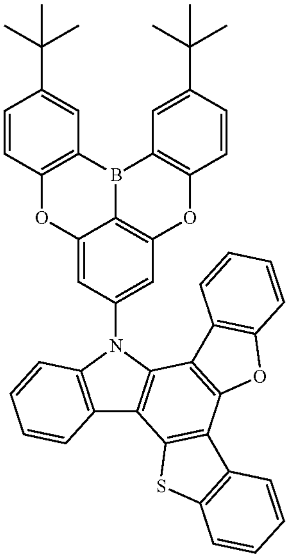
Compound T-31
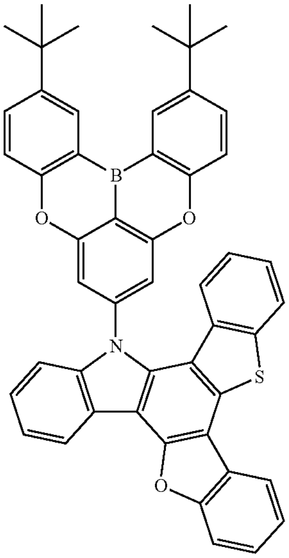

-continued
Compound T-32
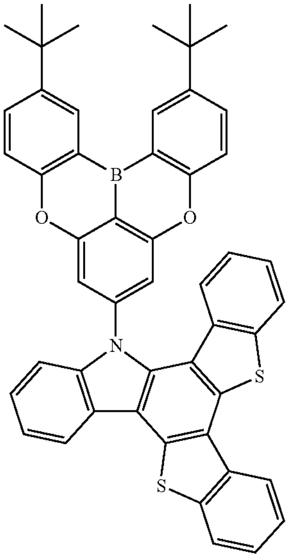
Compound T-33
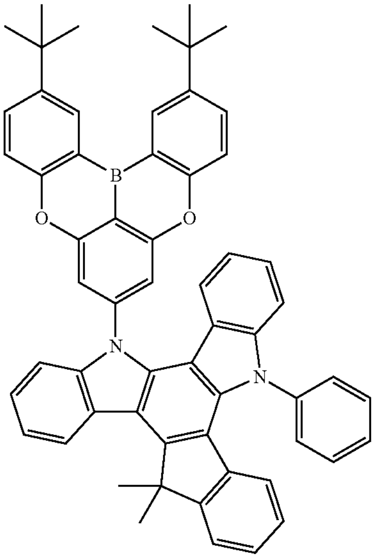
-continued
Compound T-34
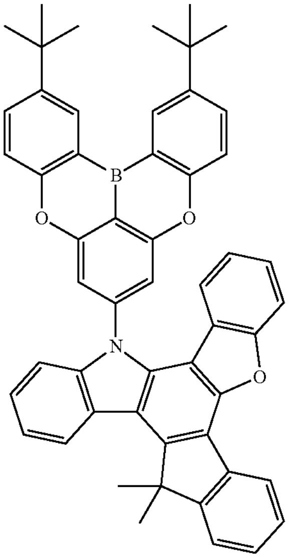
Compound T-35
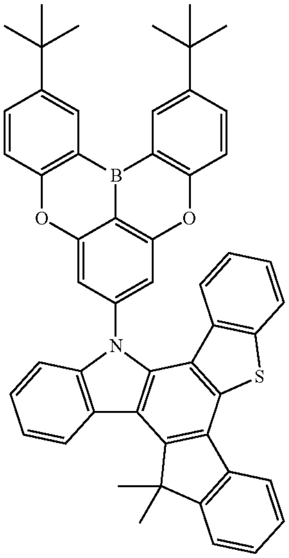

-continued
Compound T-36
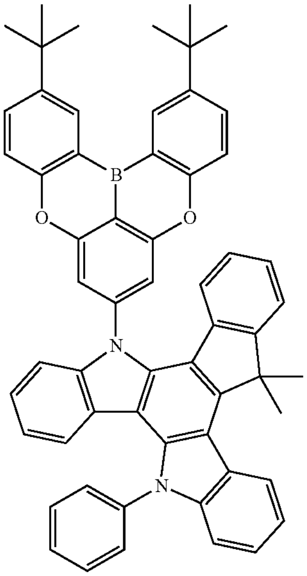
Compound T-37
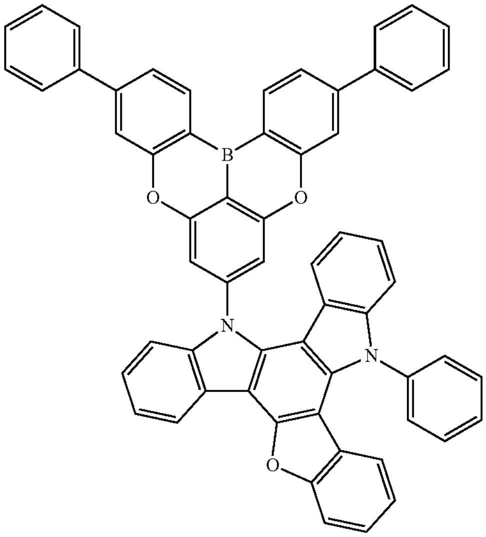
-continued
Compound T-38
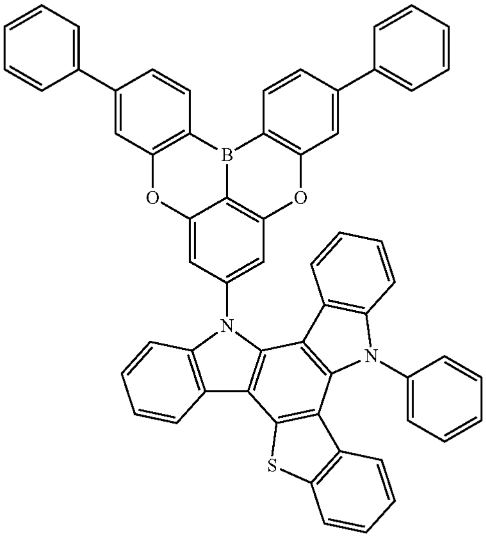
Compound T-39
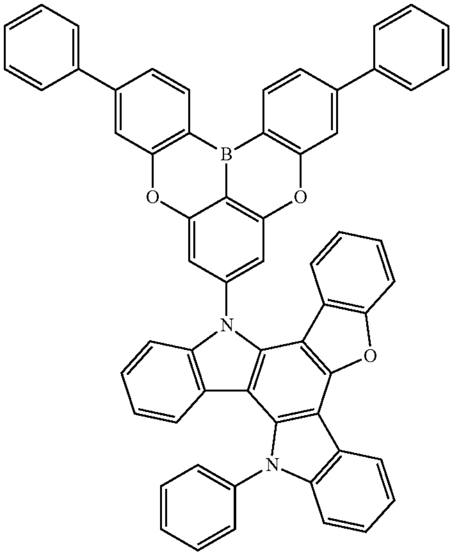

-continued
Compound T-40
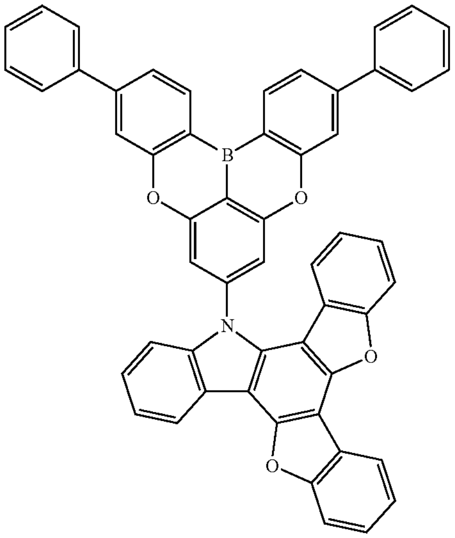
Compound T-41
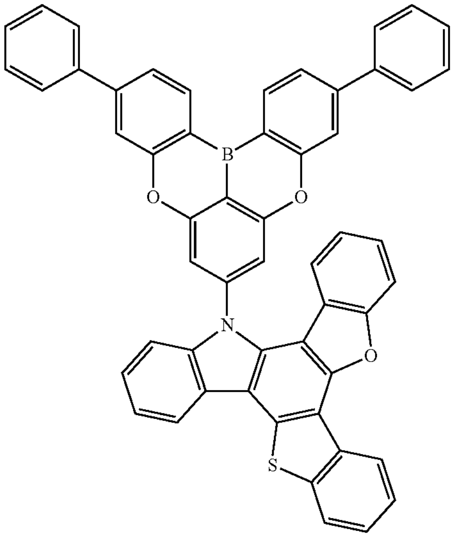
-continued
Compound T-42
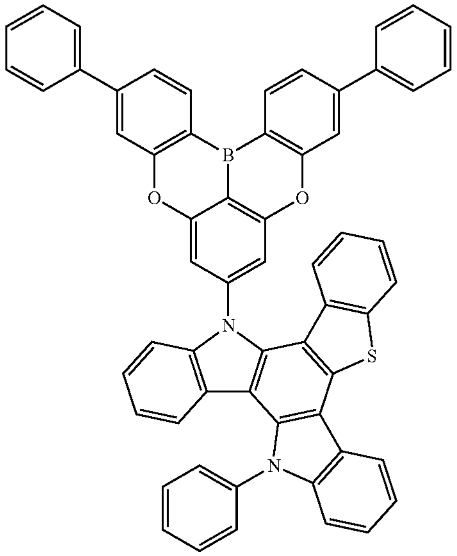
Compound T-43
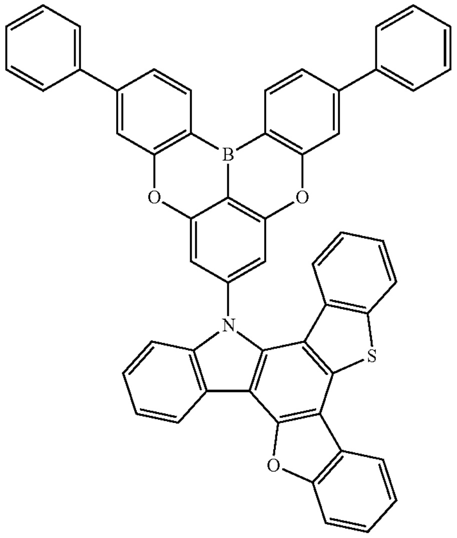

-continued
Compound T-44
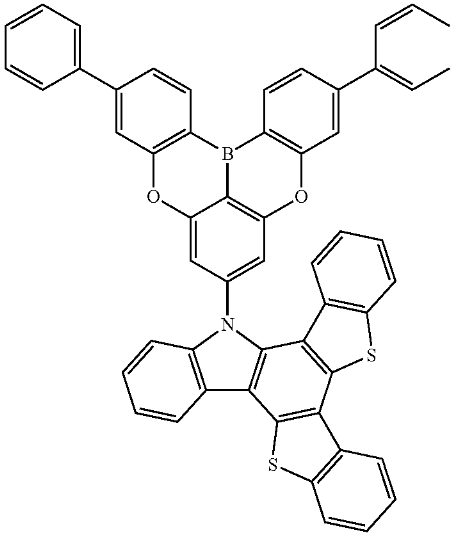
Compound T-45
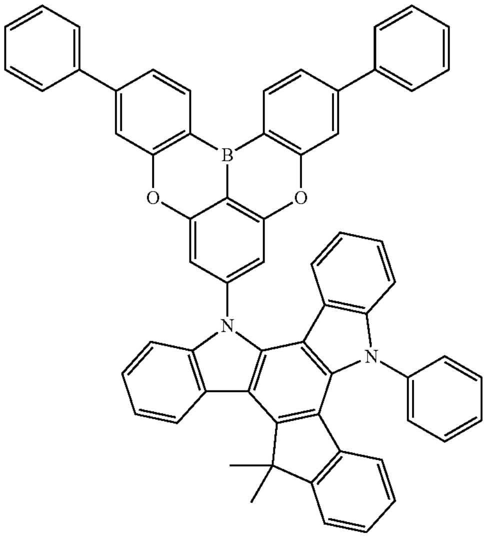
-continued
Compound T-46
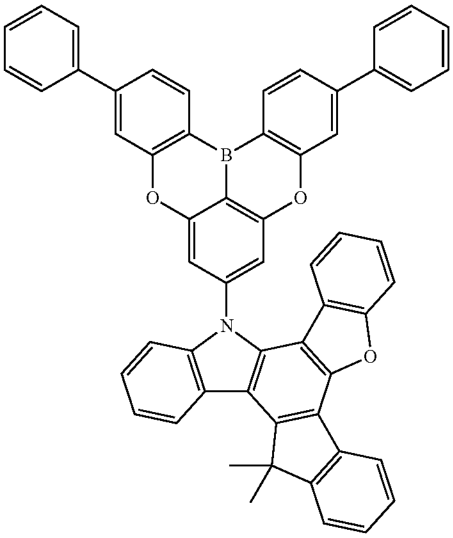
Compound T-47
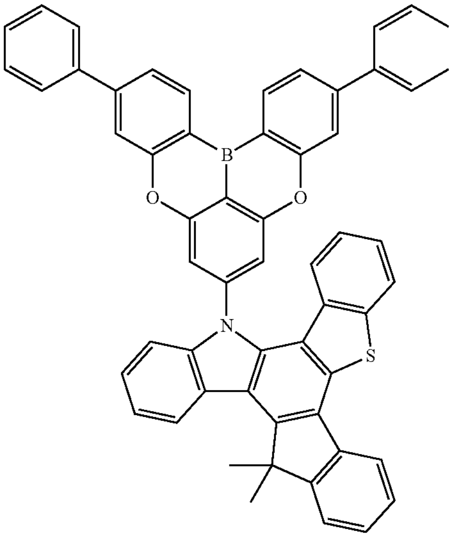

Compound T-48
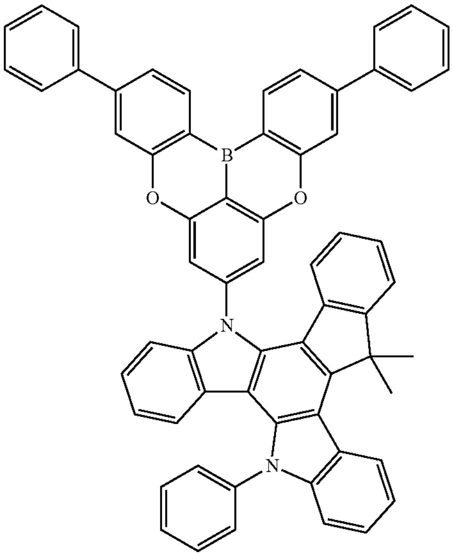
Compound T-49
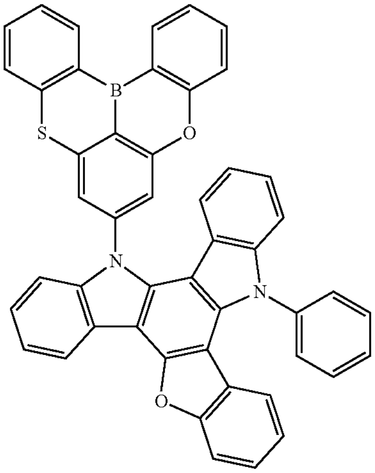
Compound T-50
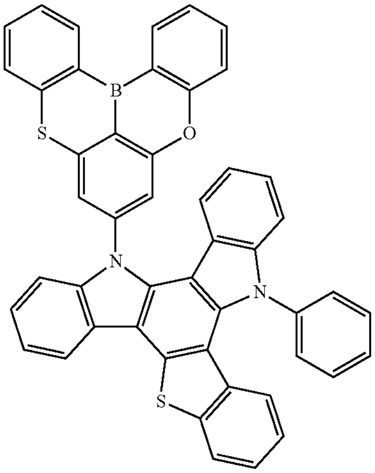
Compound T-51
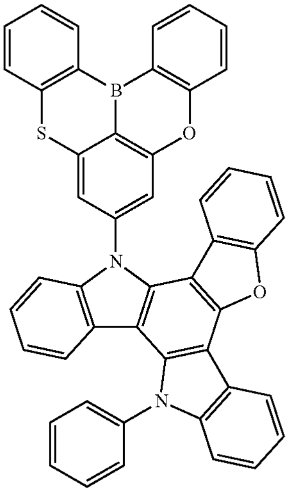
Compound T-52
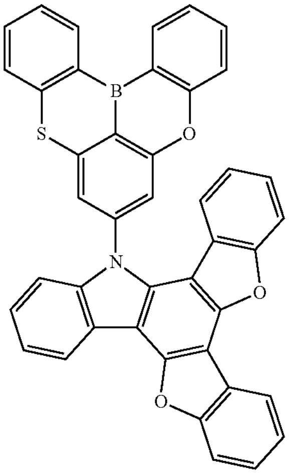
Compound T-53
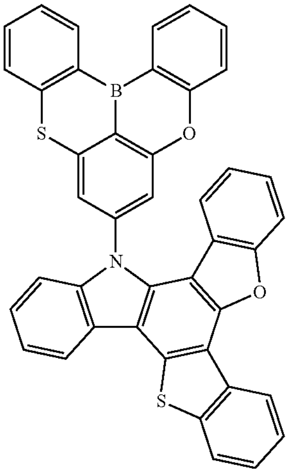

-continued
Compound T-54
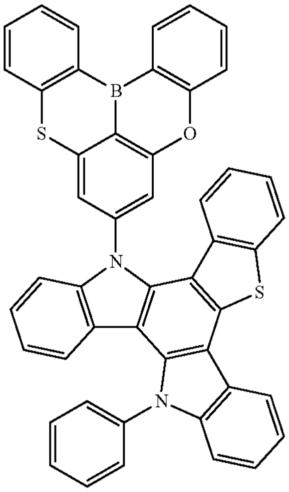
Compound T-55
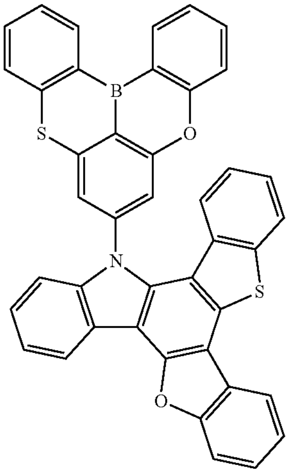
Compound T-56
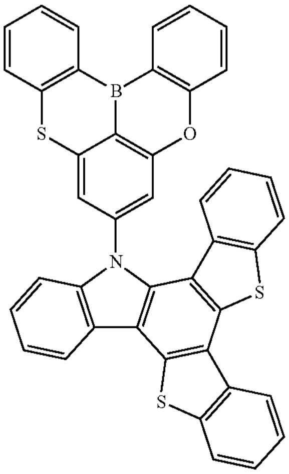
-continued
Compound T-57
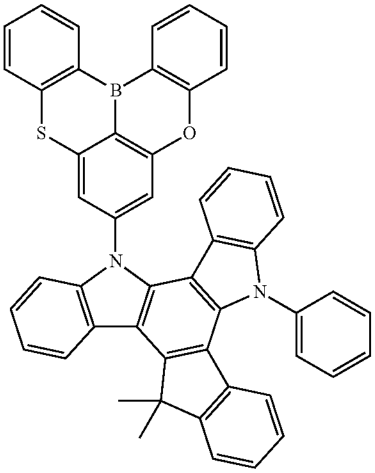
Compound T-58
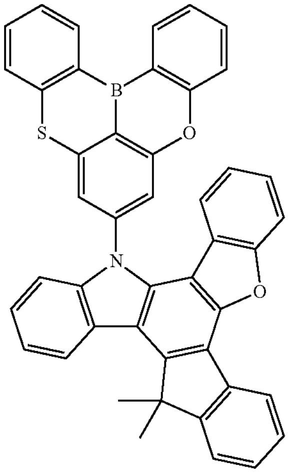
Compound T-59
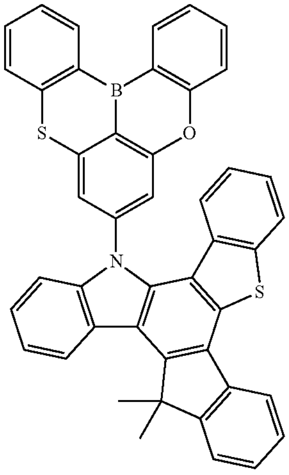

-continued
Compound T-60
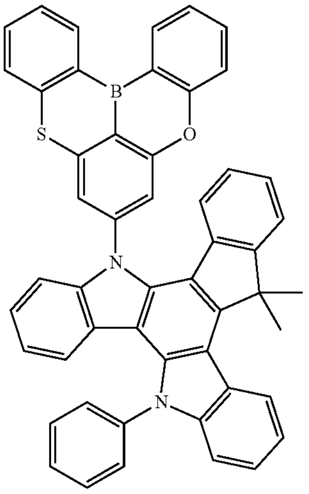
Compound T-61
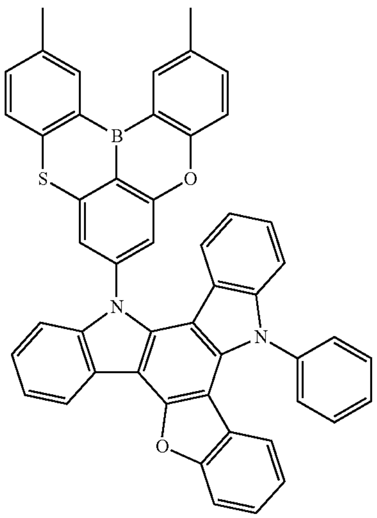
Compound T-62
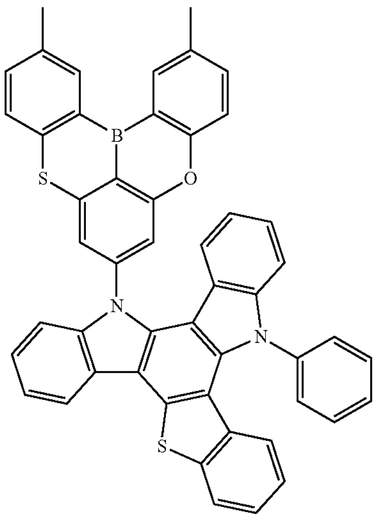
-continued
Compound T-63
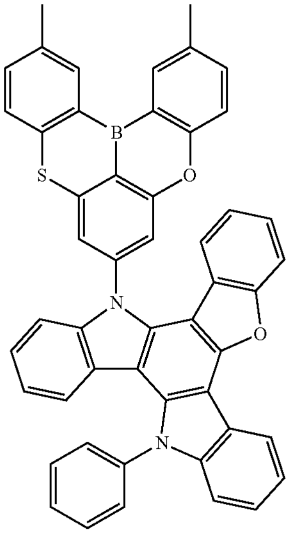
Compound T-64
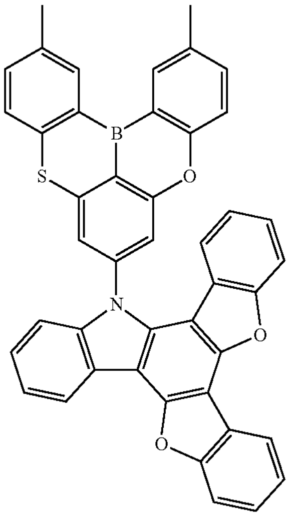
Compound T-65
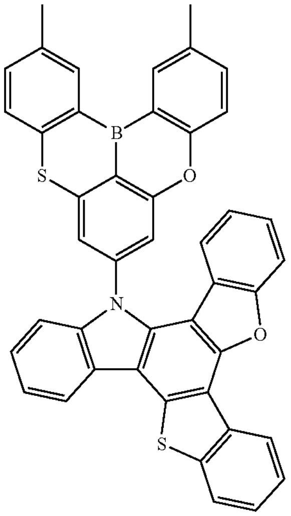

-continued
Compound T-66
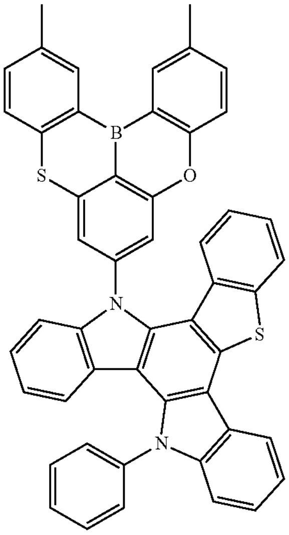
Compound T-67
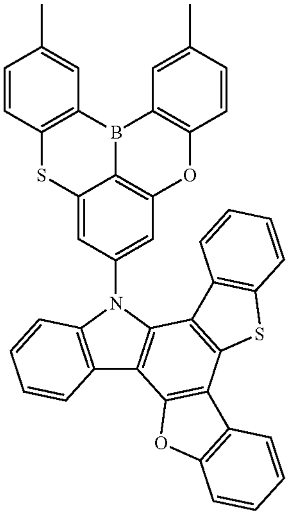
Compound T-68
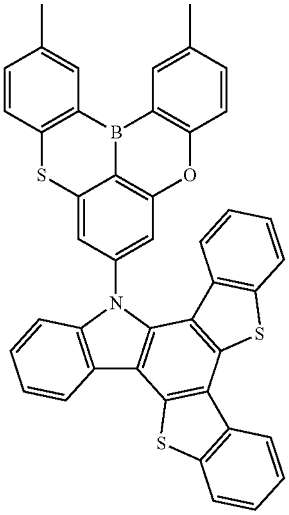
-continued
Compound T-69
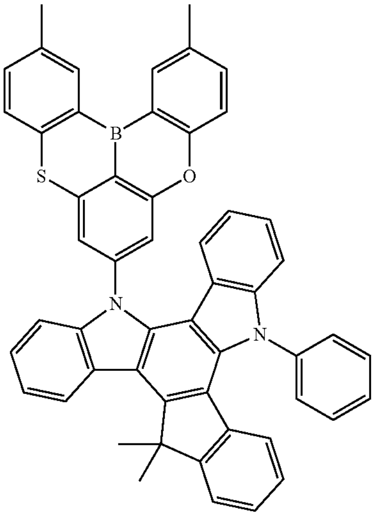
Compound T-70
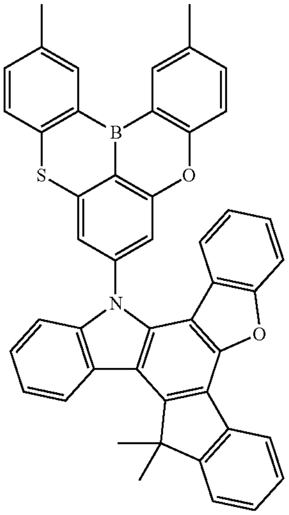
Compound T-71
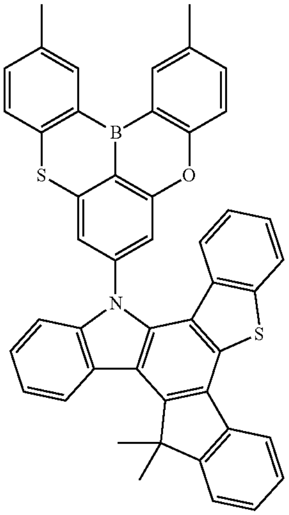

-continued
Compound T-72
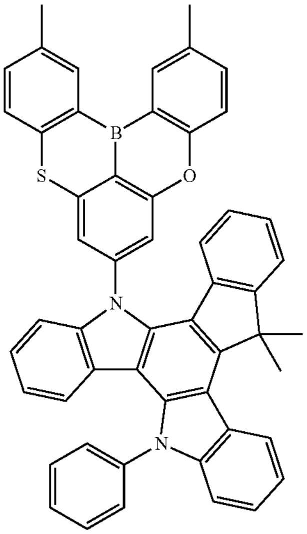
Compound T-73
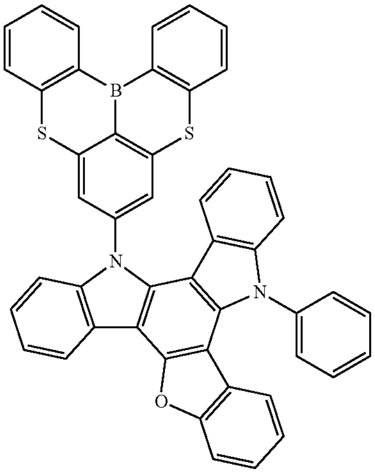
Compound T-74
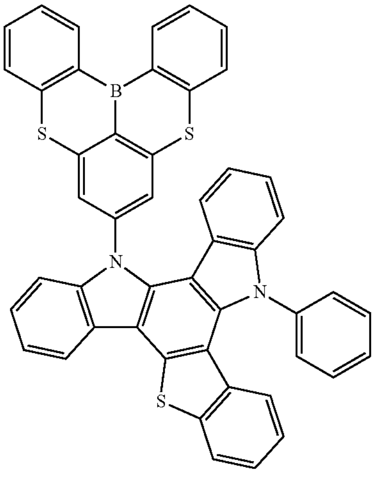
-continued
Compound T-75
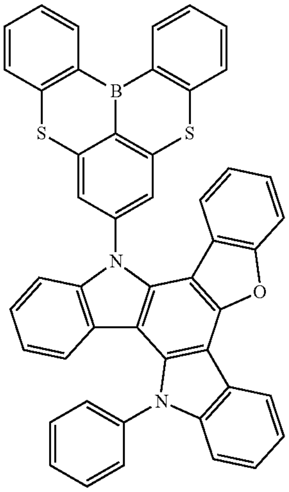
Compound T-76
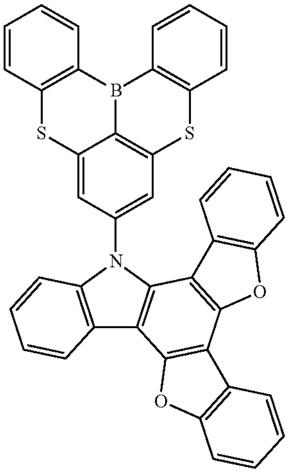
Compound T-77
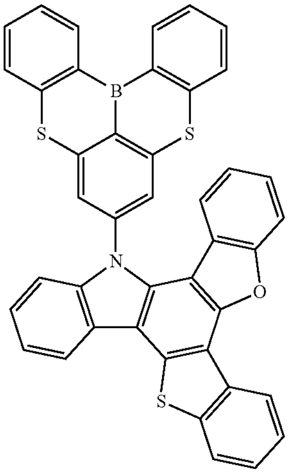

-continued
Compound T-78
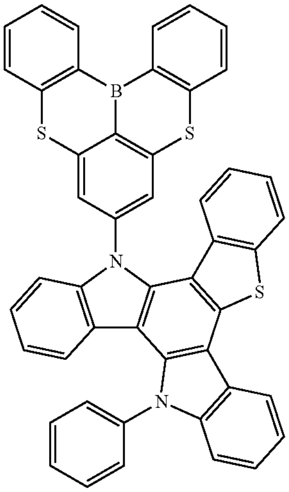
Compound T-79
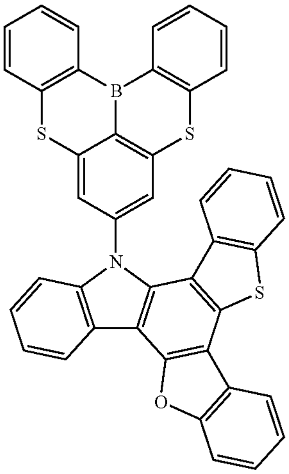
Compound T-80
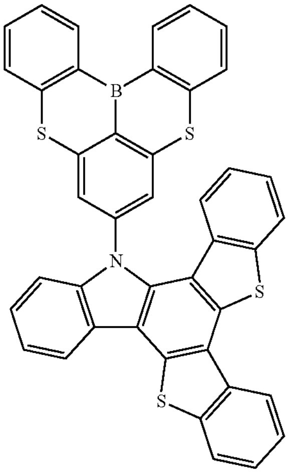
-continued
Compound T-81
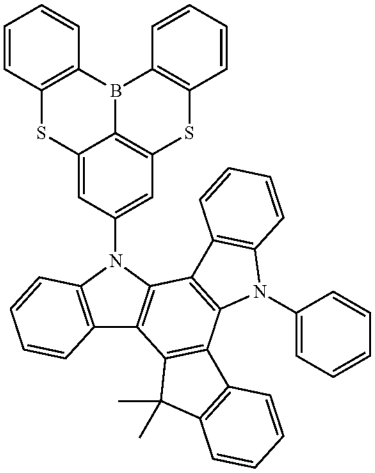
Compound T-82
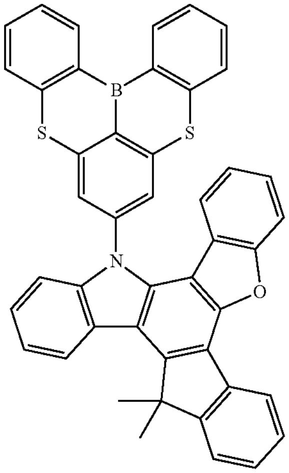
Compound T-83
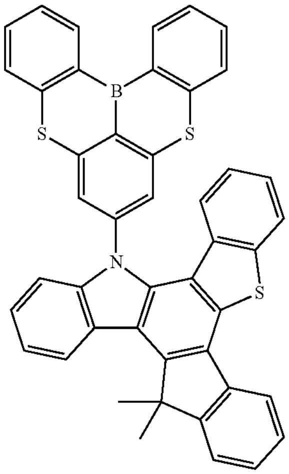

-continued
Compound T-84
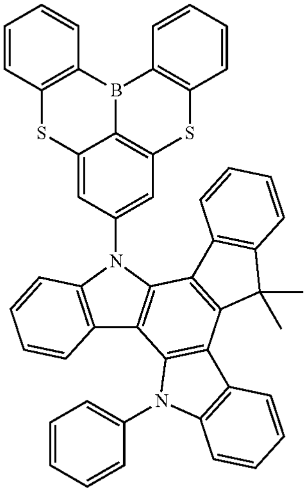
Compound T-85
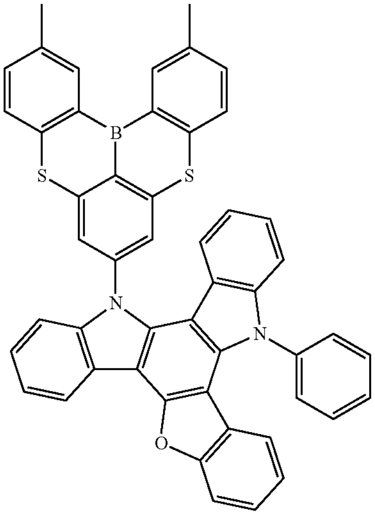
Compound T-86
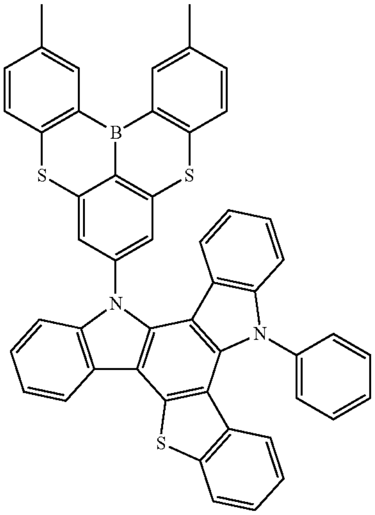
-continued
Compound T-87
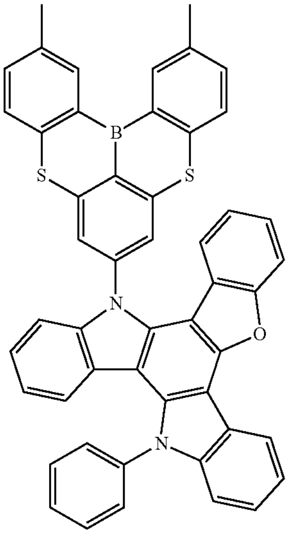
Compound T-88
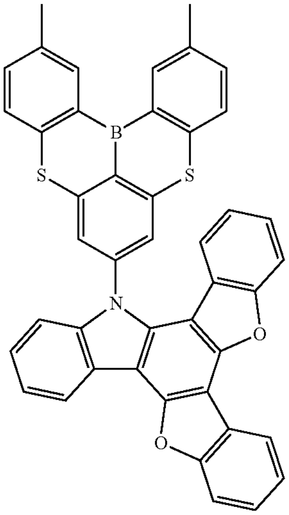
Compound T-89
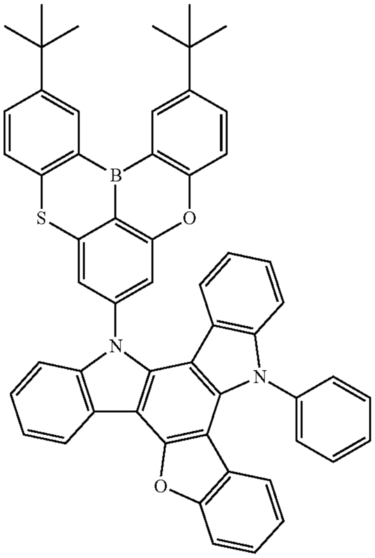

-continued
Compound T-90
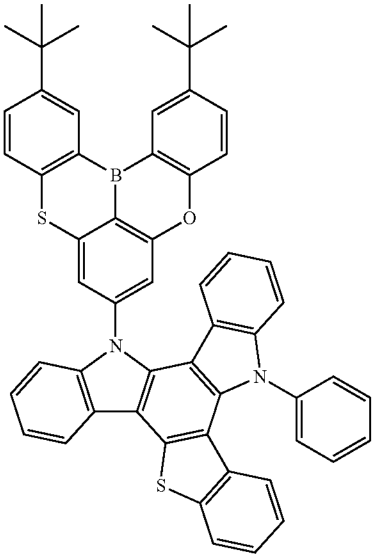
Compound T-91
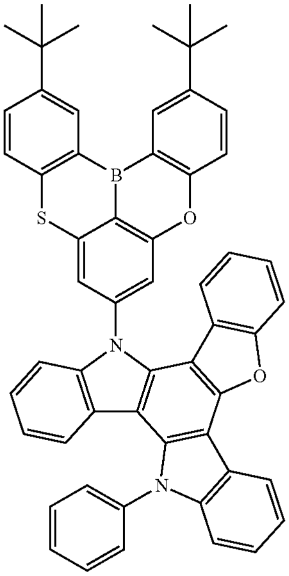
-continued
Compound T-92
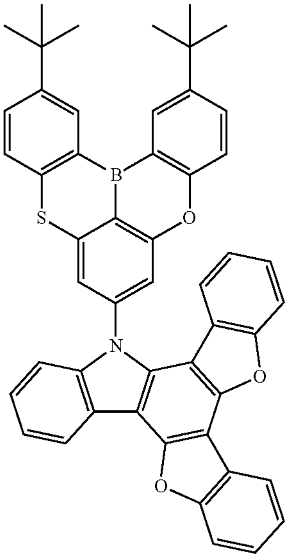
Compound T-93
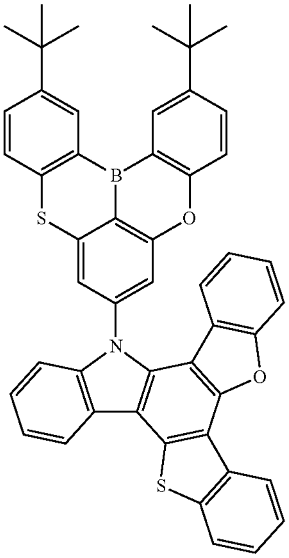

-continued
Compound T-94
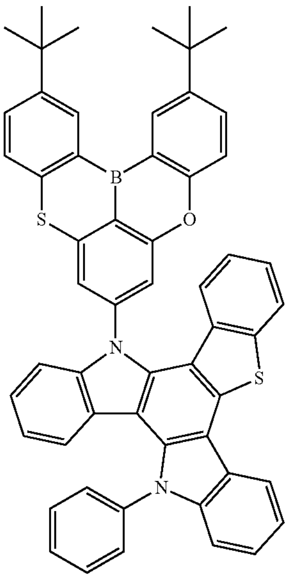
Compound T-95
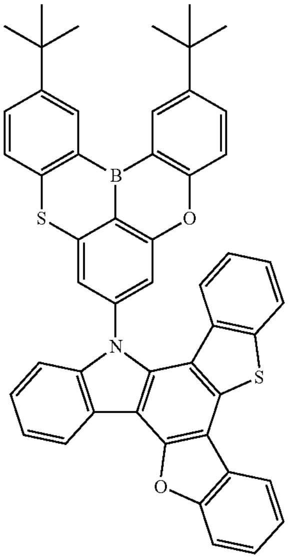
-continued
Compound T-96
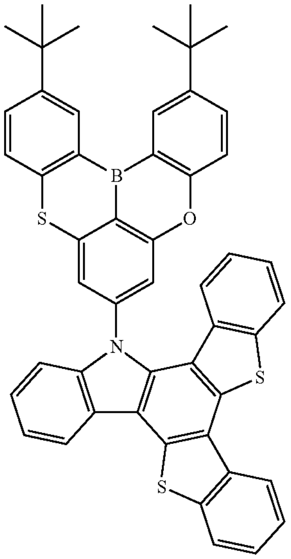
Compound T-97
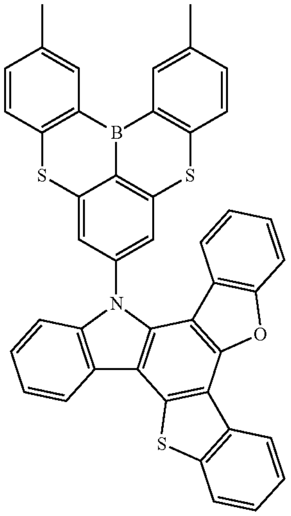
Compound T-98
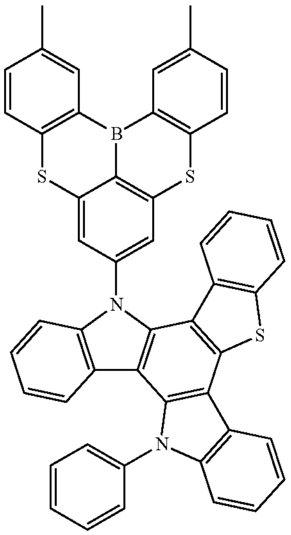

-continued
Compound T-99
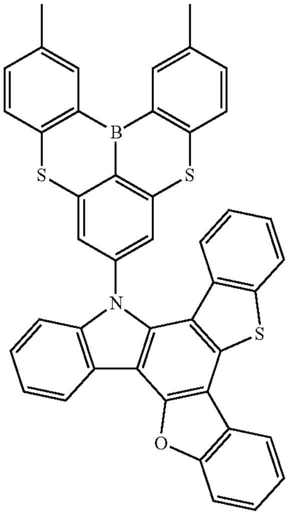
Compound T-100
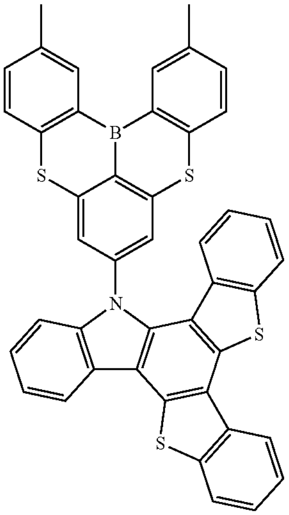
Compound T-101
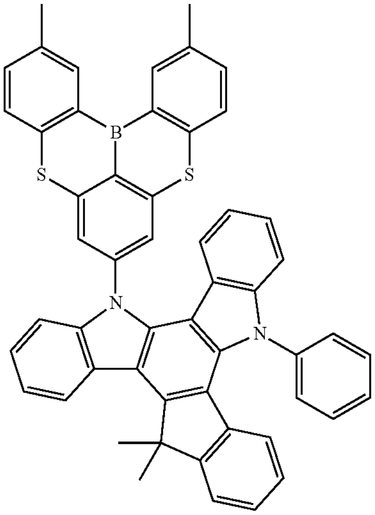
-continued
Compound T-102
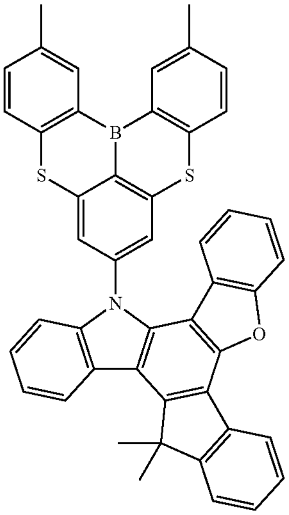
Compound T-103
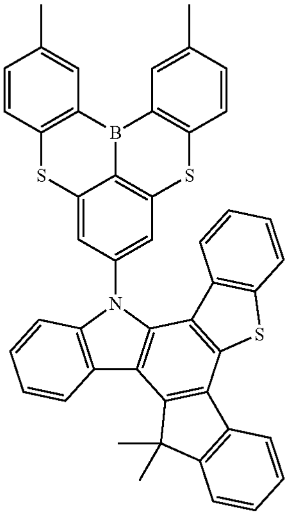
Compound T-104
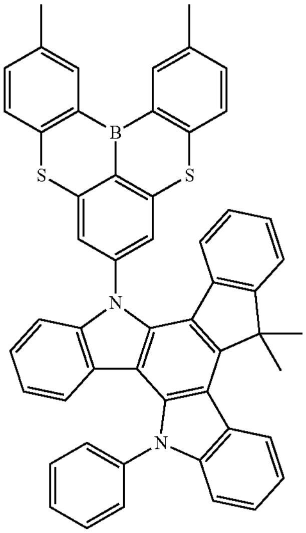

-continued
Compound T-105
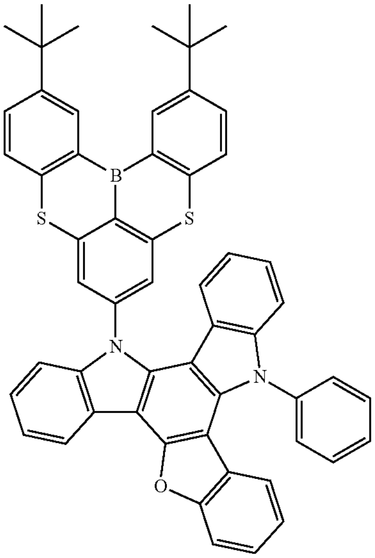
Compound T-106
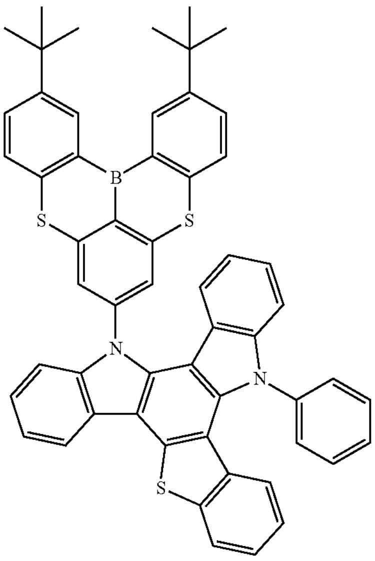
-continued
Compound T-107
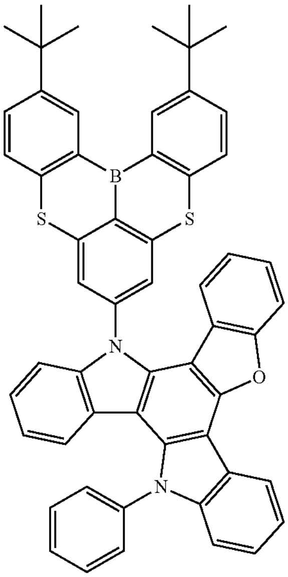
Compound T-108
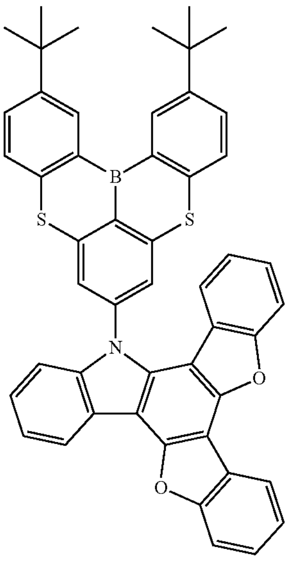

-continued
Compound T-109
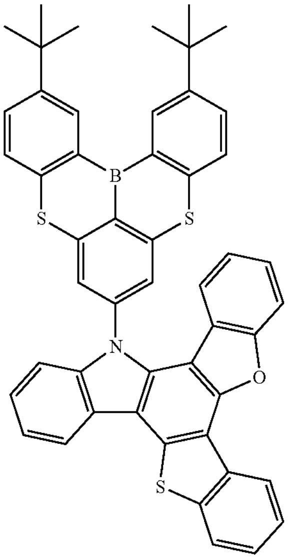
Compound T-110
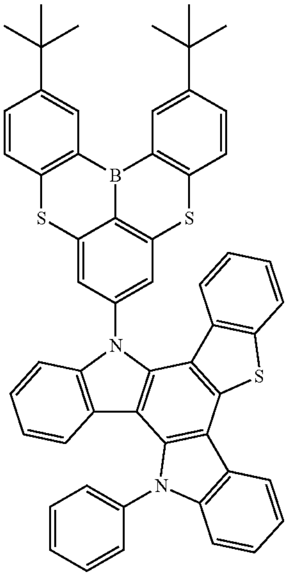
-continued
Compound T-111
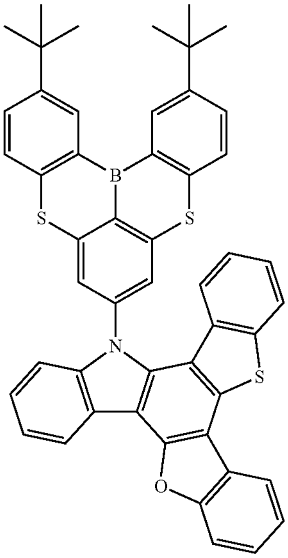
Compound T-112
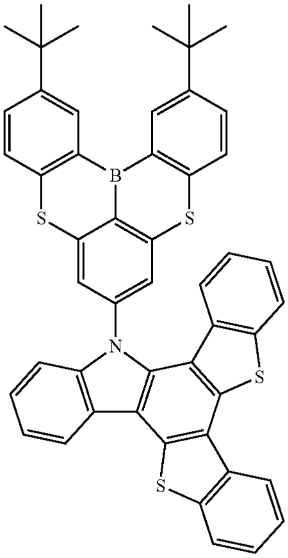
Compound T-113
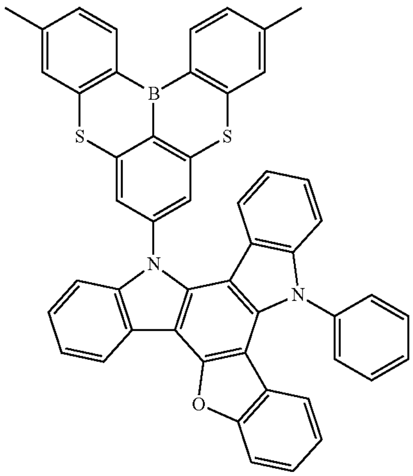

-continued
Compound T-114
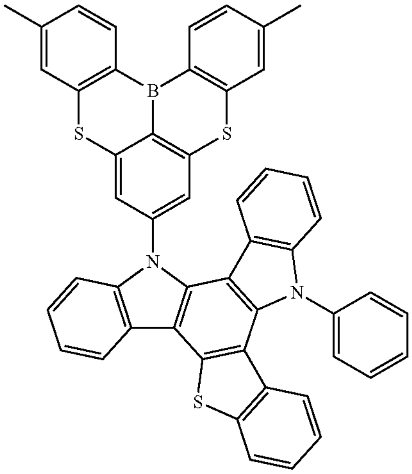
Compound T-115
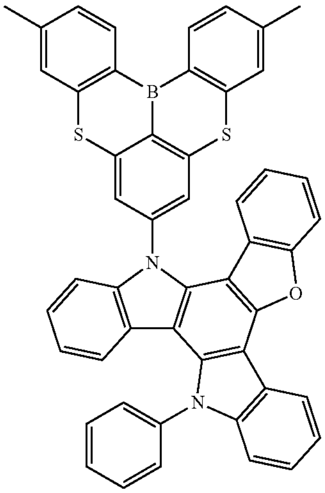
Compound T-116
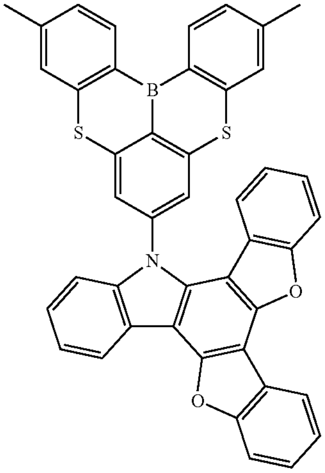
-continued
Compound T-117
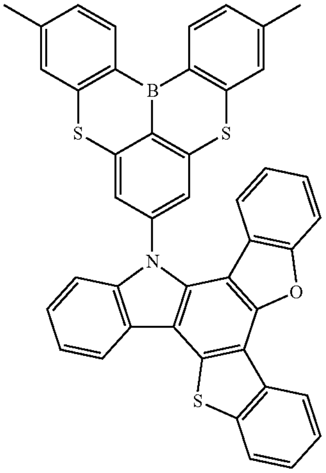
Compound T-118
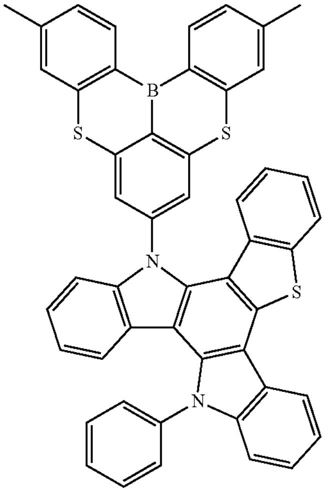
Compound T-119
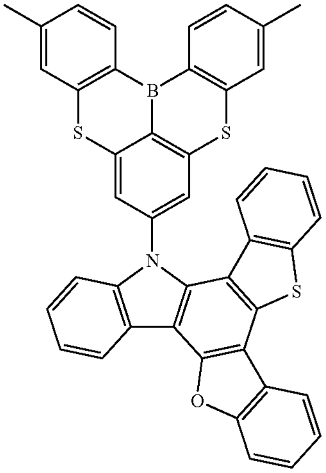

-continued
Compound T-120
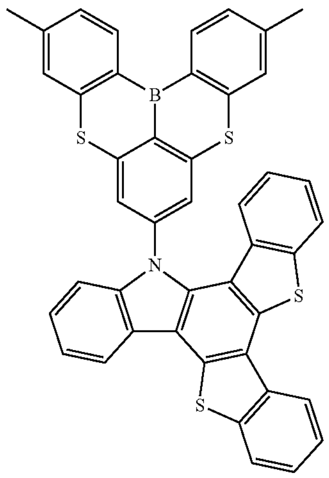
Compound T-121
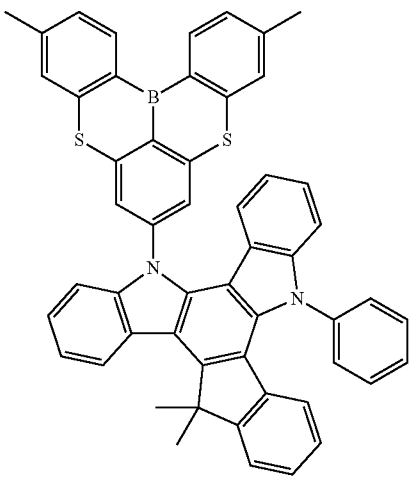
Compound T-122
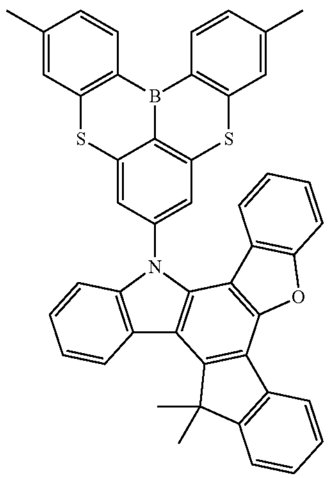
-continued
Compound T-123
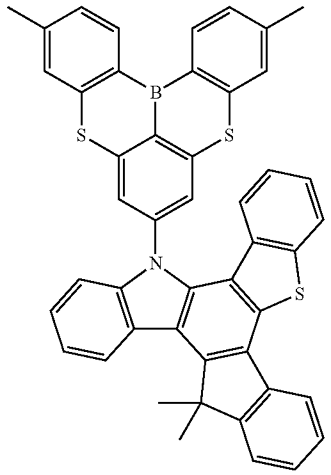
Compound T-124
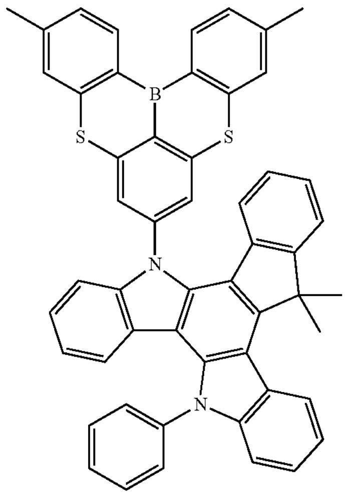
Compound T-125
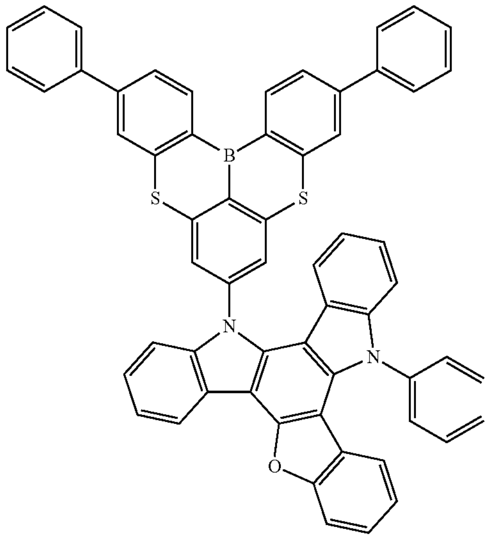

-continued
Compound T-126
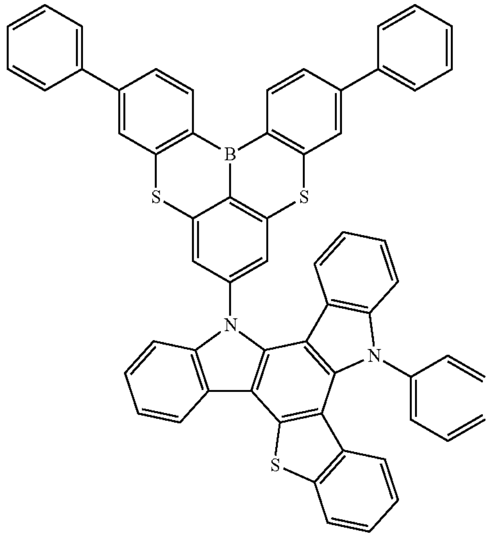
Compound T-127
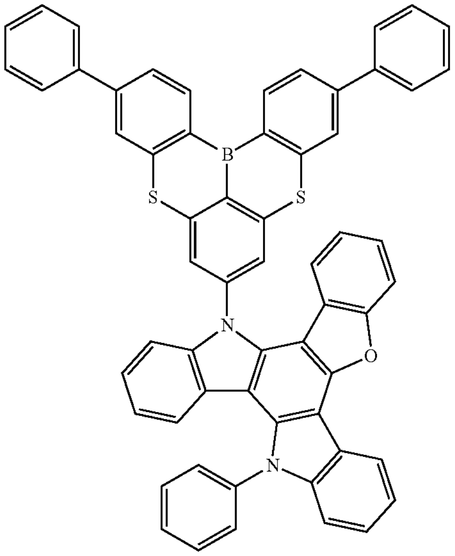
-continued
Compound T-128
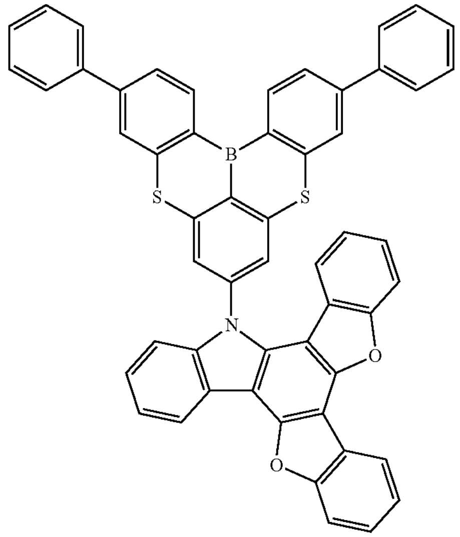
Compound T-129
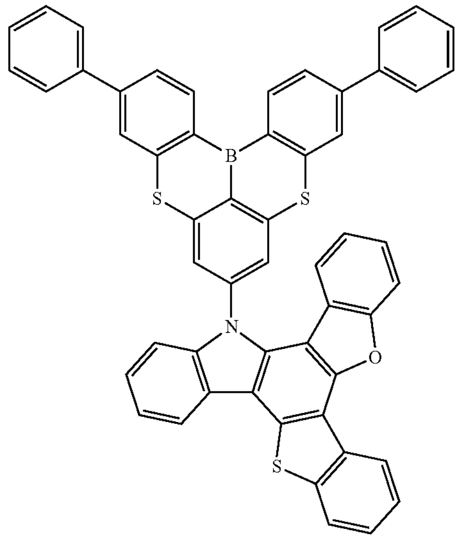

-continued
Compound T-130
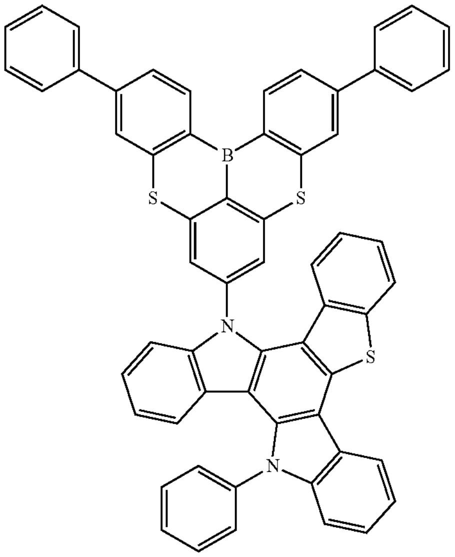
Compound T-131
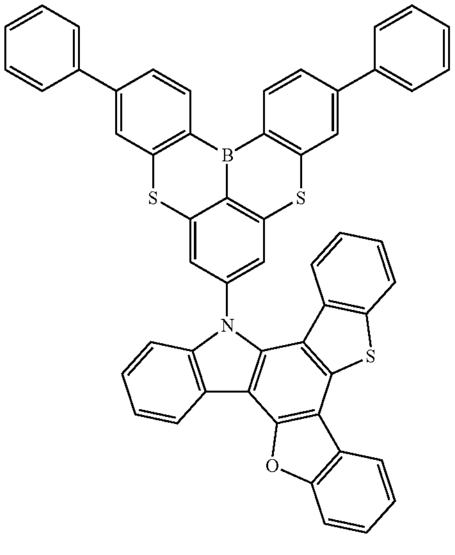
-continued
Compound T-132
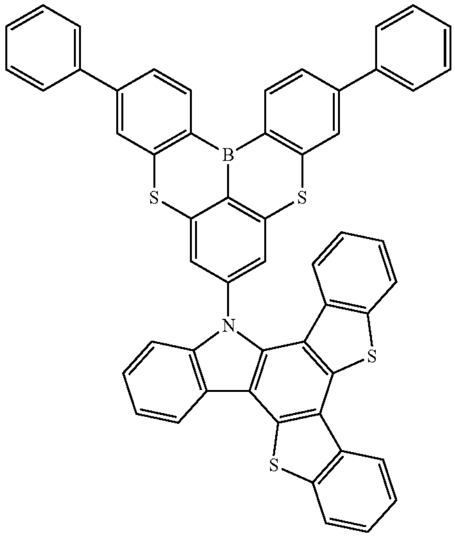
Compound T-133
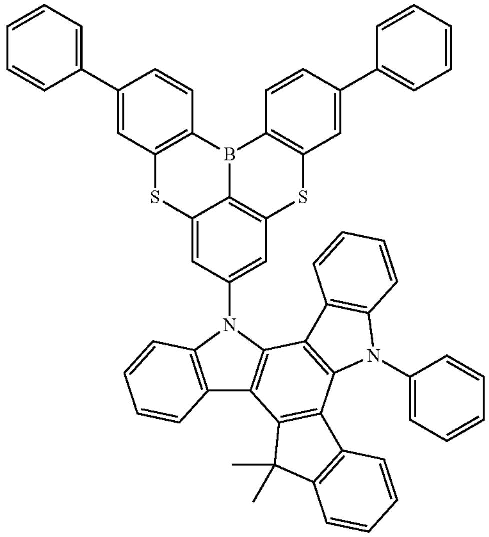

-continued
Compound T-134
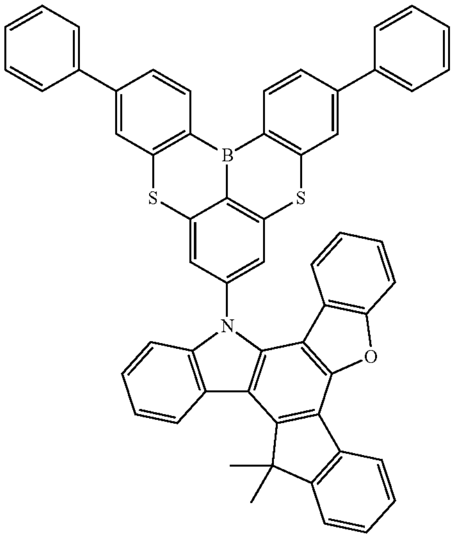
Compound T-135
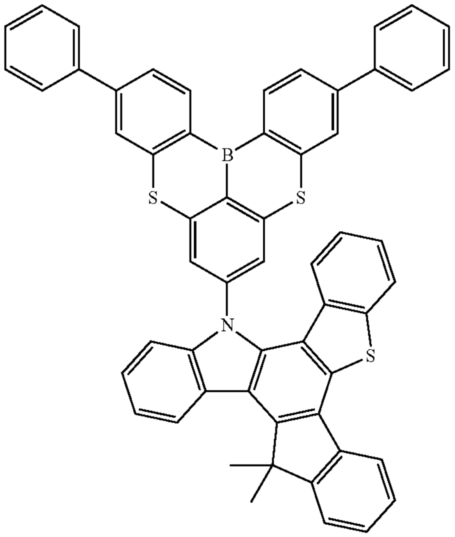
-continued
Compound T-136
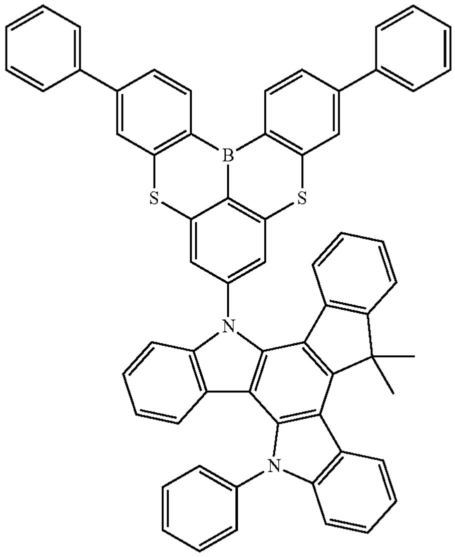
Compound T-137
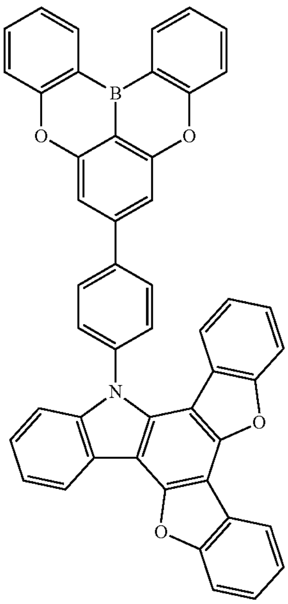

-continued
Compound T-138
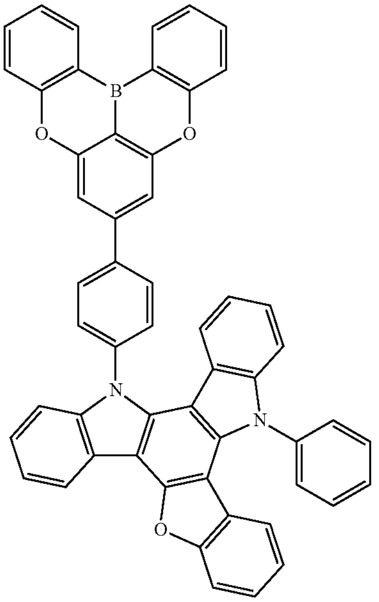
Compound T-139
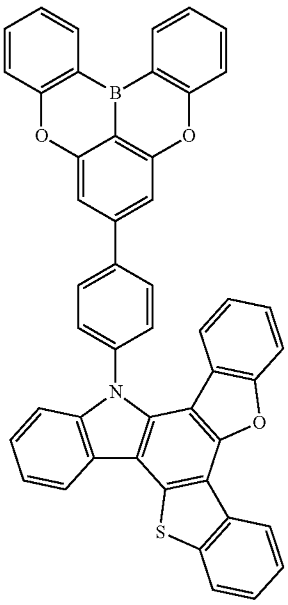
-continued
Compound T-140
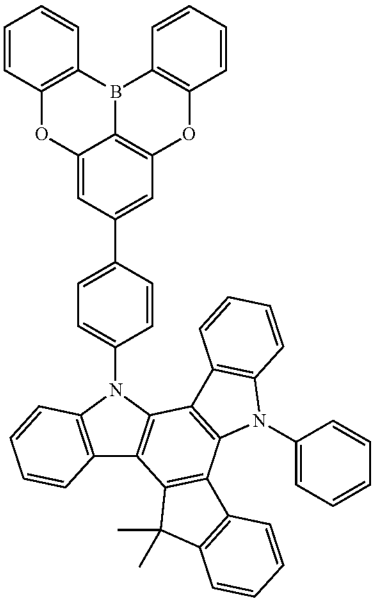
Compound T-141
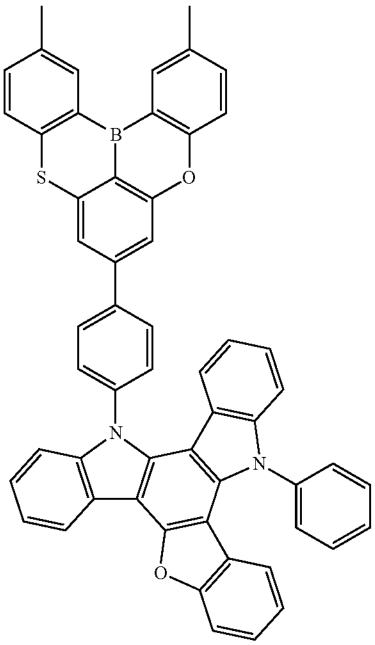

-continued

Compound T-142

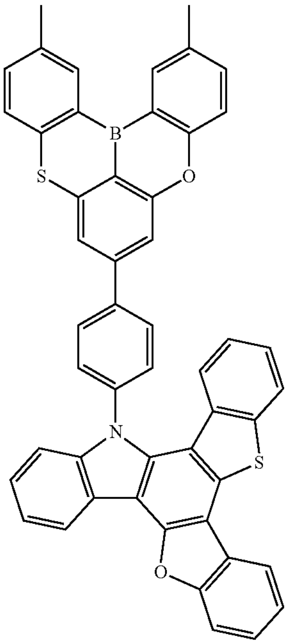

Compound T-143

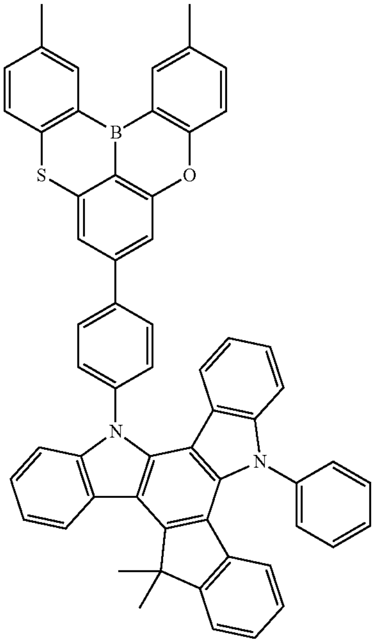

-continued

Compound T-144

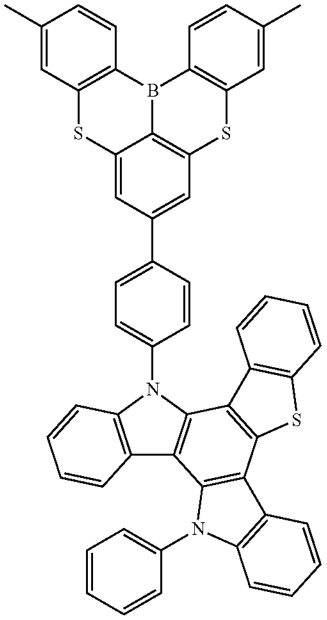

Another aspect of the present invention provides an organic light-emitting device including: a first electrode; a second electrode provided to face the first electrode; and one or more organic material layers interposed between the first electrode and the second electrode, wherein one or more of the organic layers include one or more of the above described delayed fluorescence compounds.

In one embodiment, one or more of the organic material layers may include a fluorescence compound represented by Chemical Formula 3 below:

[Chemical Formula 3]

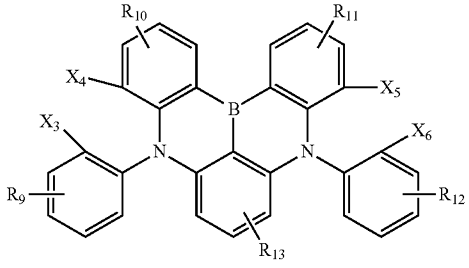

in Chemical Formula 3, $R_9$ to $R_{13}$ are each independently selected from hydrogen, deuterium, —F, —Cl, —Br, —I, a hydroxyl group, a cyano group, a nitro group, an amino group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted monovalent non-aromatic condensed polycyclic group, and a substituted or unsubstituted monovalent non-aromatic heterocondensed polycyclic group; and $X_3$ to $X_6$ are each independently hydrogen or bind together to form a ring.

In one embodiment, the fluorescence compound represented by Chemical Formula 3 may be represented by one of the following Chemical Formulas F-1 to F-35:

Compound F-1

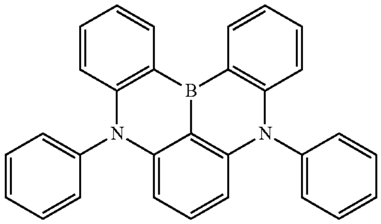

Compound F-2

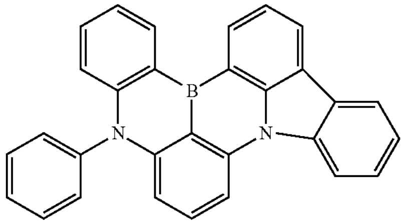

Compound F-3

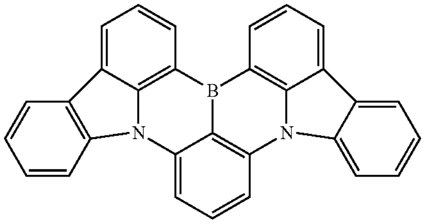

Compound F-4

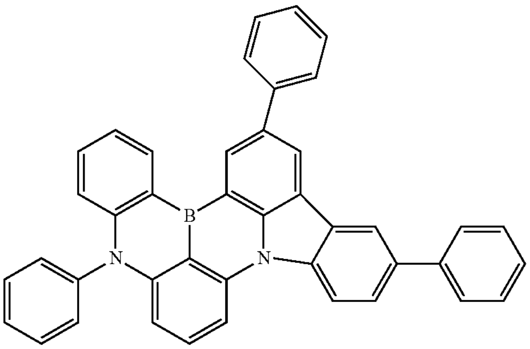

-continued

Compound F-5

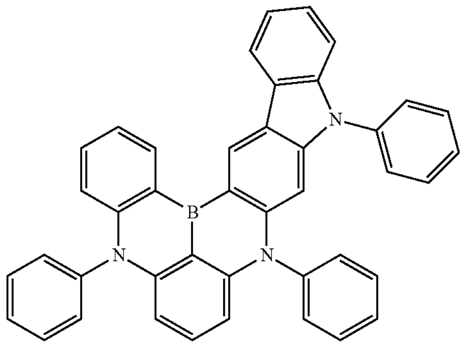

Compound F-6

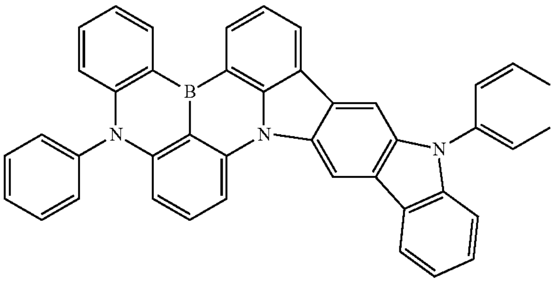

Compound F-7

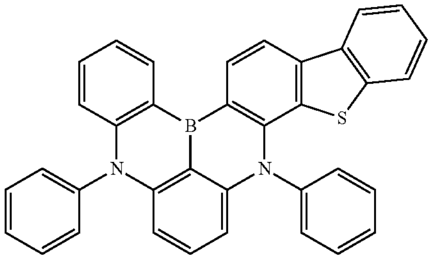

Compound F-8

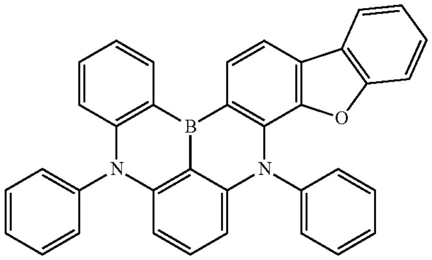

Compound F-9

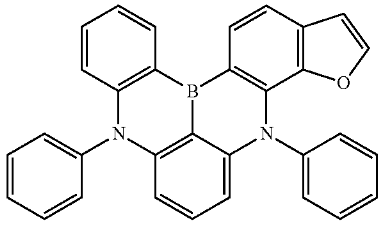

-continued
Compound F-10
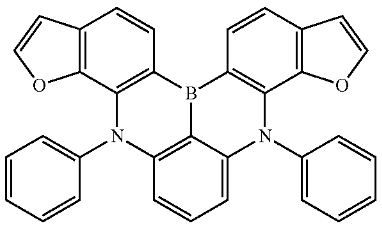
Compound F-11
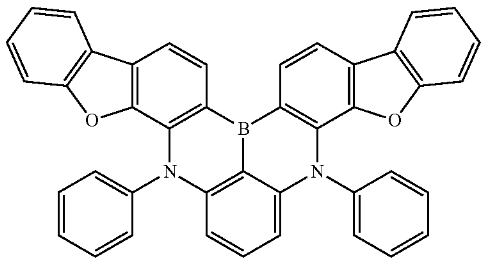
Compound F-12
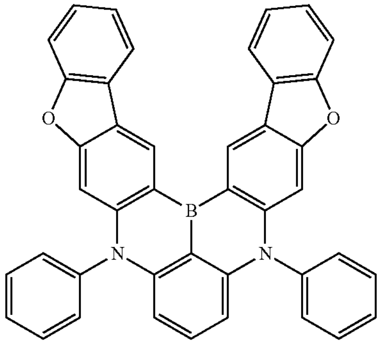
Compound F-13
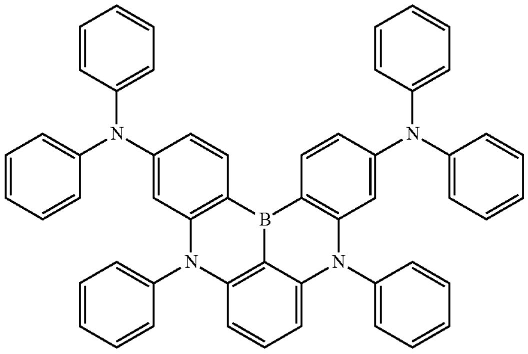
Compound F-14
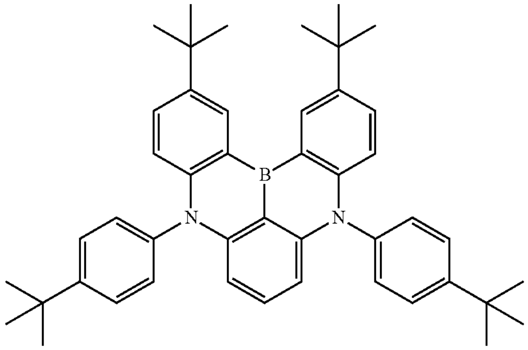
-continued
Compound F-15
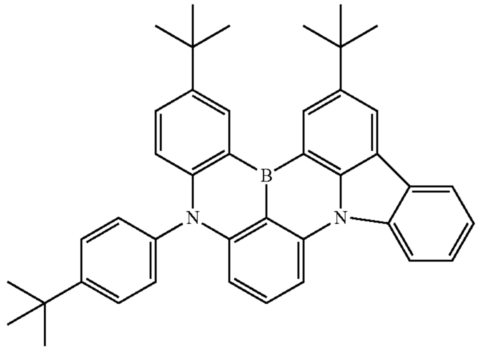
Compound F-16
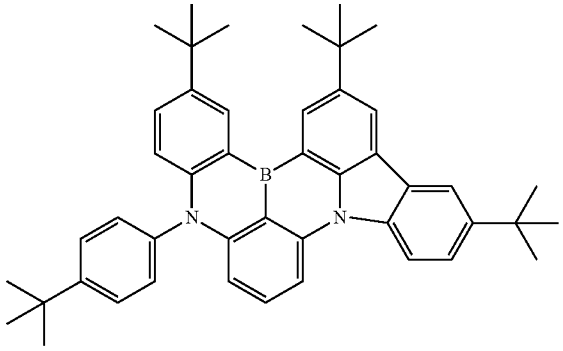
Compound F-17
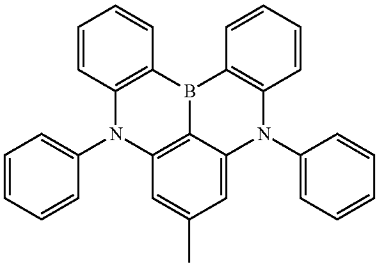
Compound F-18
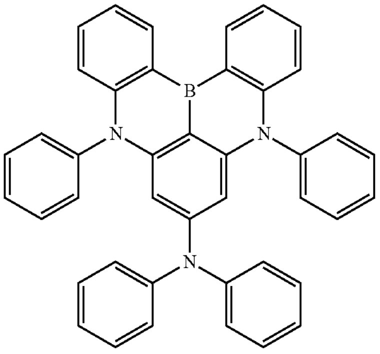

-continued
Compound F-19
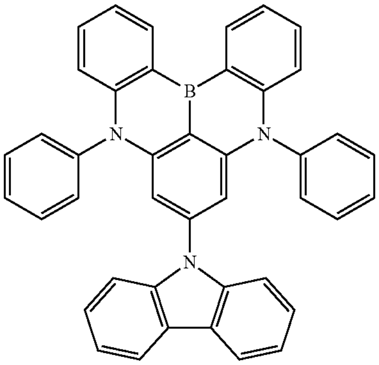
Compound F-20
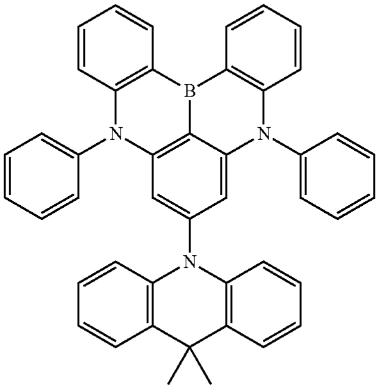
Compound F-21
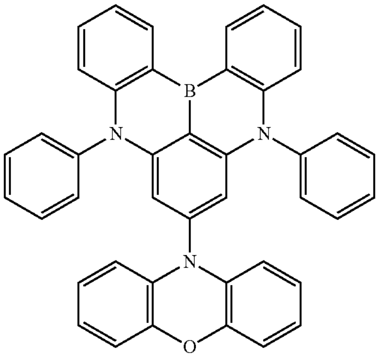
Compound F-22
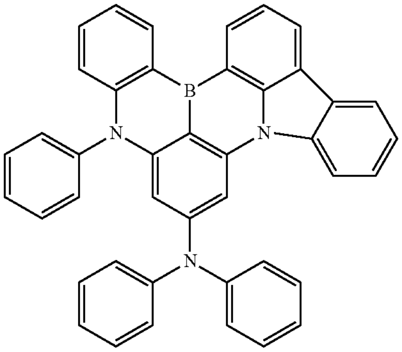
-continued
Compound F-23
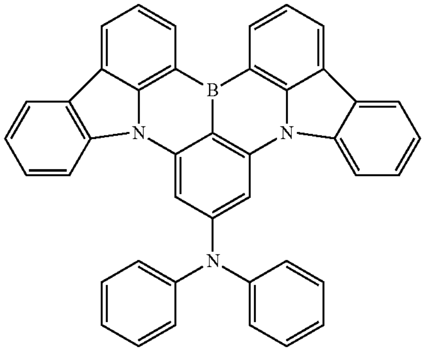
Compound F-24
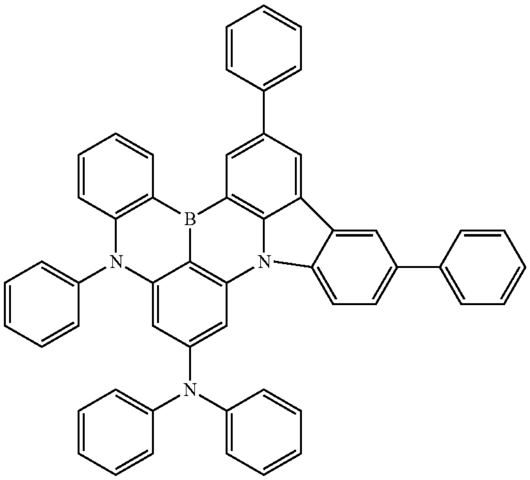
Compound F-25
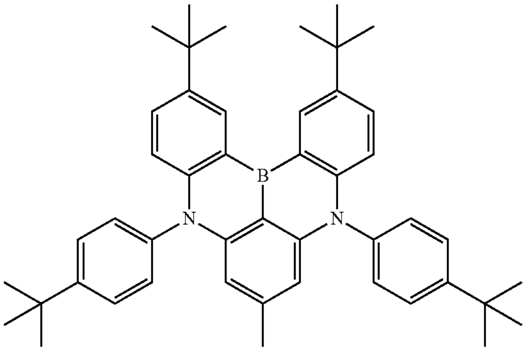

-continued
Compound F-26
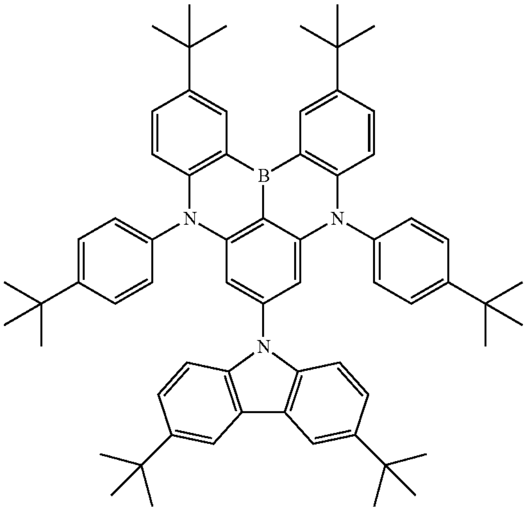
Compound F-27
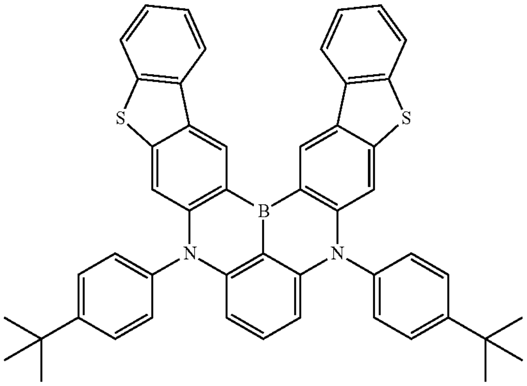
Compound F-28
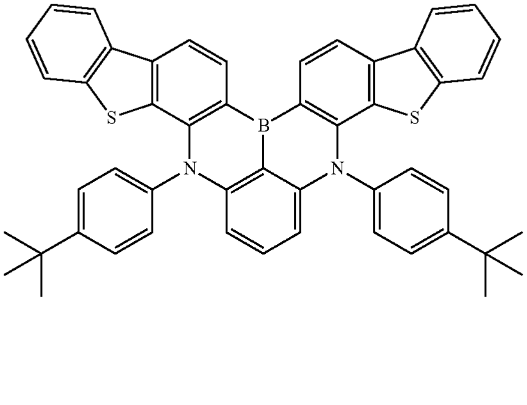
-continued
Compound F-29
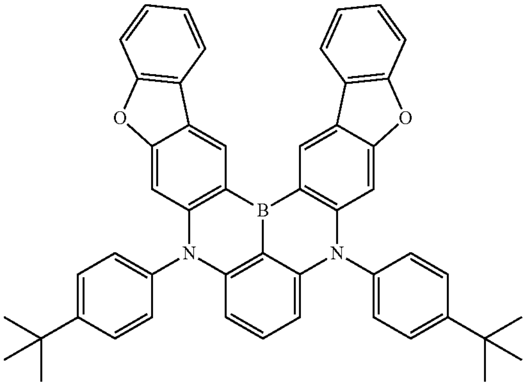
Compound F-30
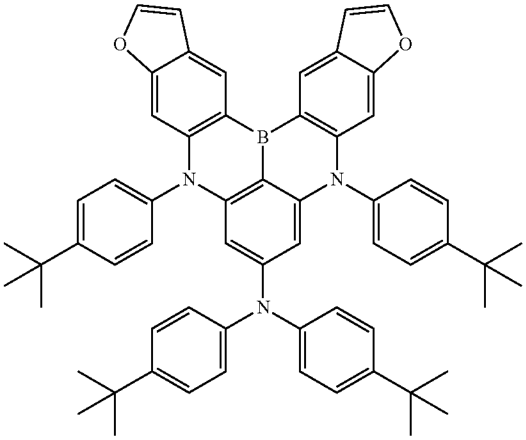
Compound F-31
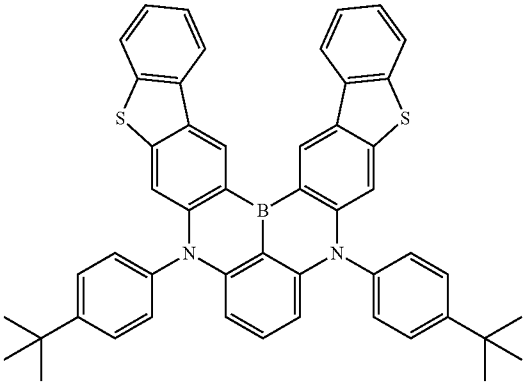
Compound F-32
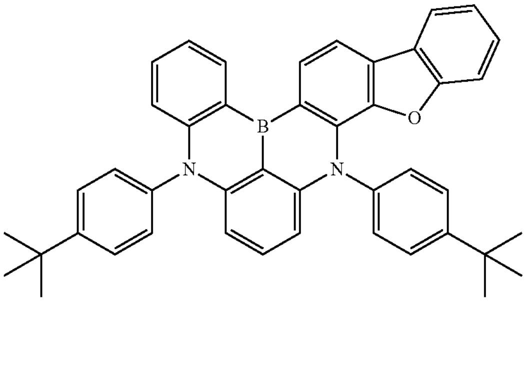

-continued

Compound F-33

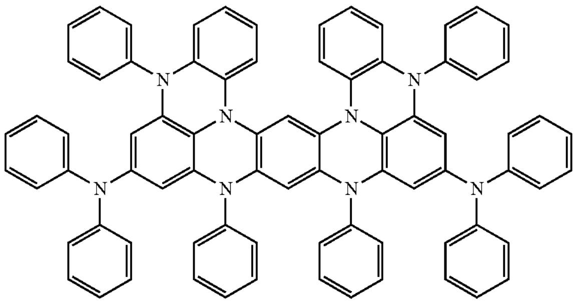

Compound F-34

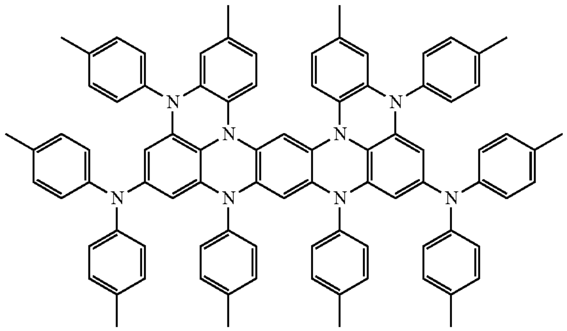

Compound T-35

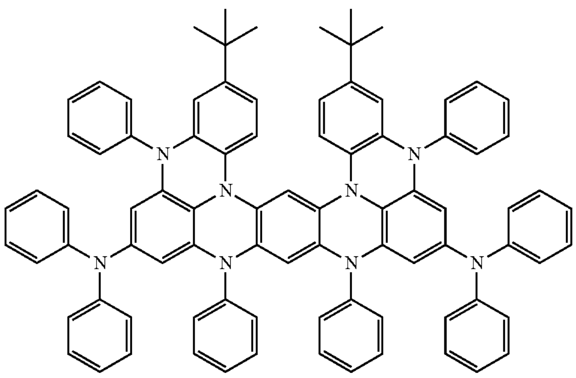

In one embodiment, the first electrode is an anode, the second electrode is a cathode, and the organic material layer may include: a light-emitting layer including one or more of the delayed fluorescence compounds described above; a hole transport region interposed between the first electrode and the light-emitting layer and including at least one of a hole injection layer, a hole transport layer, and an electron blocking layer; and an electron transport region interposed between the light-emitting layer and the second electrode and including at least one of a hole blocking layer, an electron transport layer, and an electron injection layer.

In one embodiment, the first electrode is an anode, the second electrode is a cathode, and the organic material layer may include: a light-emitting layer including one or more of the delayed fluorescence compounds described above and the fluorescence compound represented by Chemical Formula 3; a hole transport region interposed between the first electrode and the light-emitting layer and including at least one of a hole injection layer, a hole transport layer, and an electron blocking layer; and an electron transport region interposed between the light-emitting layer and the second electrode and including at least one of a hole blocking layer, an electron transport layer, and an electron injection layer.

Advantageous Effects

According to one aspect of the present invention, a compound having excellent deep blue luminescence properties can be provided.

According to another aspect of the present invention, an organic light-emitting diode including the above compound can be provided.

In addition, according to another aspect of the present invention, a delayed fluorescence light sensitive hyperfluorescence device capable of effectively transferring energy by widely overlapping a spectrum of a compound that exhibits deep blue properties and has a low singlet-triplet energy difference with a spectrum of a fluorescent compound having excellent color purity can be provided.

The effects of one aspect of the present specification are not limited to the above-described effects and should be understood to include all effects that can be inferred from the configuration described in the detailed description or claims of the present invention.

DESCRIPTION OF DRAWINGS

FIG. 1 is a graph showing the properties of a boron compound according to an embodiment of the present invention.

FIG. 2 is a graph showing the properties of a boron compound according to an embodiment of the present invention.

FIG. 3 is a graph showing the properties of a boron compound according to an embodiment of the present invention.

FIG. 4 is a physical property evaluation result of a compound according to an embodiment of the present invention.

FIG. 5 is a device measurement result of an organic light-emitting device according to an embodiment of the present invention.

MODES OF THE INVENTION

Hereinafter, one aspect of the present invention will be described with reference to the accompanying drawings. However, the present invention may be implemented in several different forms, and thus is not limited to the embodiments described herein. In order to clearly illustrate the present invention in the drawings, parts irrelevant to the description are omitted, and the same reference numerals are added to the same or similar parts throughout the specification.

Throughout the specification, when a part is "connected" to another part, this includes not only the case where it is "directly connected" but also the case where it is "indirectly connected" with another member interposed therebetween. In addition, when a part is said to "include" a component, this means that other components may be further included, not excluded, unless specifically stated otherwise.

When a range of numerical values is recited herein, the values have the precision of the significant figures provided in accordance with the standard rules in chemistry for significant figures, unless the specific range is otherwise stated. For example, 10 includes the range of 5.0 to 14.9, and the number 10.0 includes the range of 9.50 to 10.49.

Hereinafter, embodiments of the present invention will be described in detail with reference to the accompanying drawings.

Delayed Fluorescence Compound

A delayed fluorescence compound according to an aspect of the present invention may be represented by Chemical Formula 1 below:

[Chemical Formula 1]

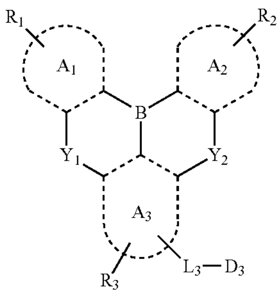

in Chemical Formula 1, $D_3$ is represented by Chemical Formula 2 below,

[Chemical Formula 2]

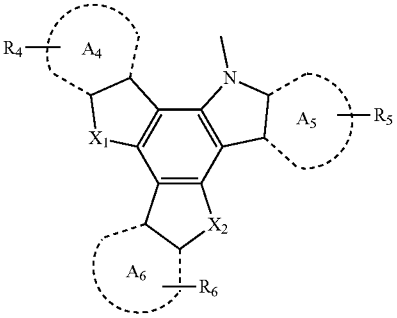

In the above Chemical Formulae, A1 to A6 are each independently a ring structure selected from a substituted or unsubstituted $C_5$-$C_{60}$ carbocyclic group, a substituted or unsubstituted $C_2$-$C_{60}$ heterocyclic group, a $C_6$-$C_{60}$ aryl group, and a $C_5$-$C_{60}$ heteroaryl group, $X_1$ and $X_2$ are each independently O, N—$R_7$, $C(R_8)_2$, or S, and at least one of $X_1$ and $X_2$ is not N—R7;

$Y_1$ and $Y_2$ are each independently selected from O or S, $L_3$ is a single bond or $C_6$-$C_{60}$ arylene, $R_1$ to $R_6$ are each independently selected from hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted monovalent non-aromatic condensed polycyclic group, and a substituted or unsubstituted monovalent non-aromatic heterocondensed polycyclic group, and $R_7$ and $R_8$ are each independently selected from hydrogen, deuterium, a substituted or unsubstituted $C_1$-$C_{60}$ alkyl group, a substituted or unsubstituted $C_3$-$C_{10}$ cycloalkyl group, a substituted or unsubstituted $C_6$-$C_{60}$ aryl group, and a substituted or unsubstituted $C_6$-$C_{60}$ heteroaryl group.

In the above description, an unsubstituted functional group may be composed of carbon and hydrogen, except for a structure in which a specific functional group is essential, and a substituted functional group may mean that at least one carbon in the unsubstituted functional group is substituted with an atom other than carbon. Examples of atoms to be substituted include, but are not limited to, nitrogen, sulfur, oxygen, silicon, and halogen elements.

The compound represented by Chemical Formula 1 may have delayed fluorescence properties because the acceptor and various donors of the structure containing boron are composed of C—N bonds.

The delayed fluorescence compound may be represented by any one of the following Chemical Formulas T-1 to T-144:

Compound T-1

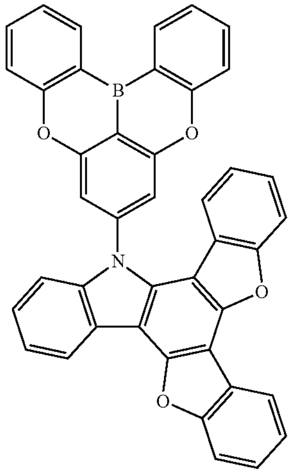

Compound T-2

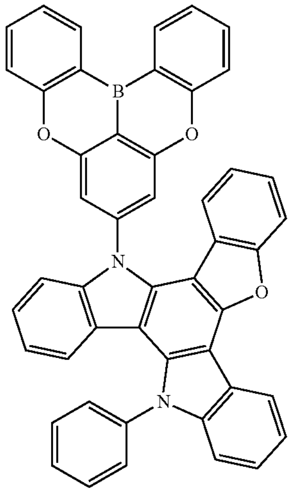

-continued
Compound T-3
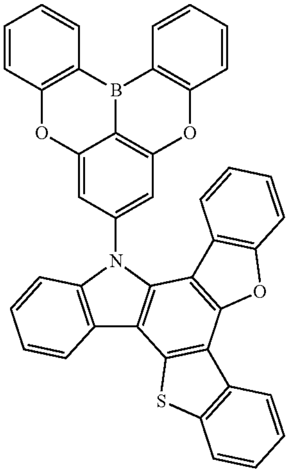
Compound T-4
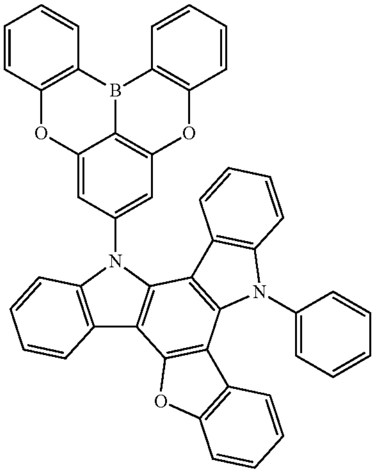
Compound T-5
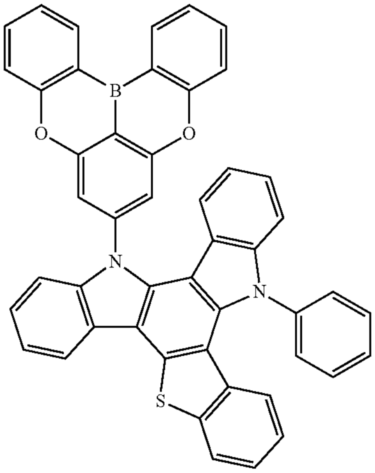
-continued
Compound T-6
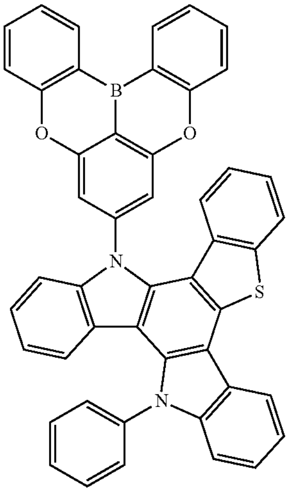
Compound T-7
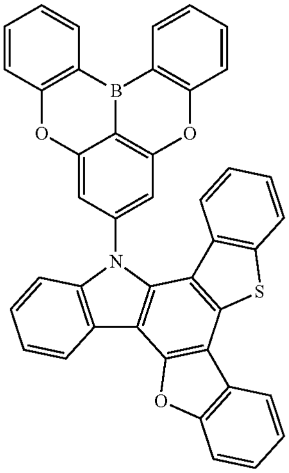
Compound T-8
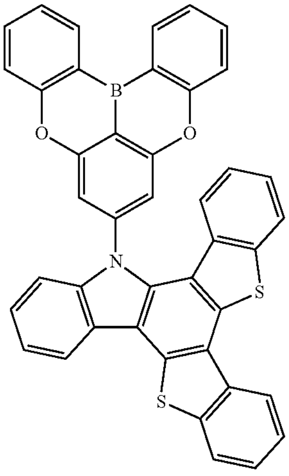

-continued
Compound T-9
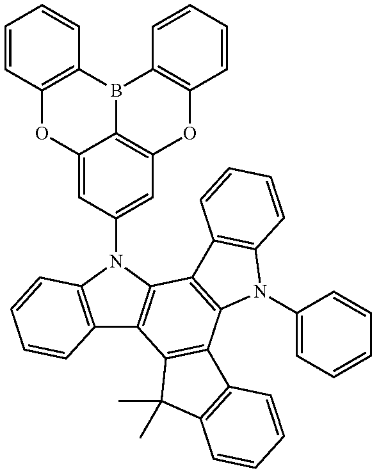
Compound T-10
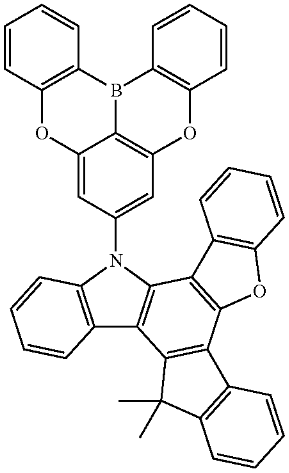
Compound T-11
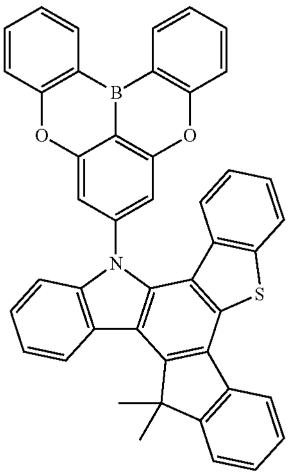
-continued
Compound T-12
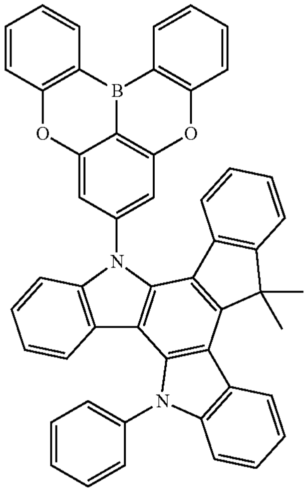
Compound T-13
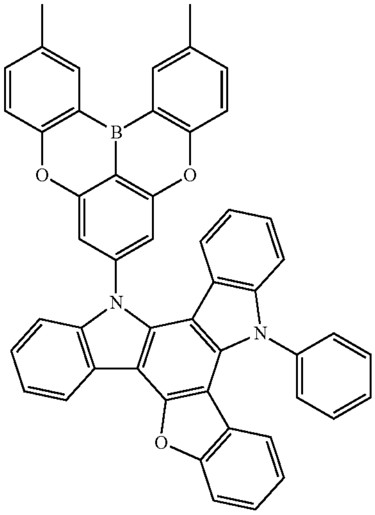
Compound T-14
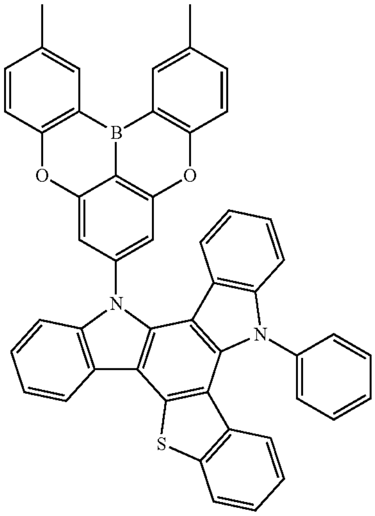

-continued
Compound T-15
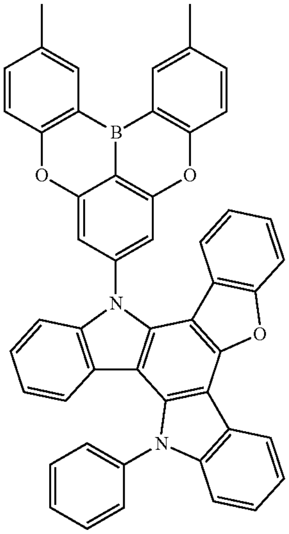
Compound T-16
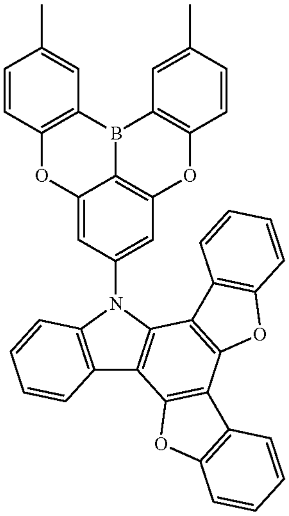
Compound T-17
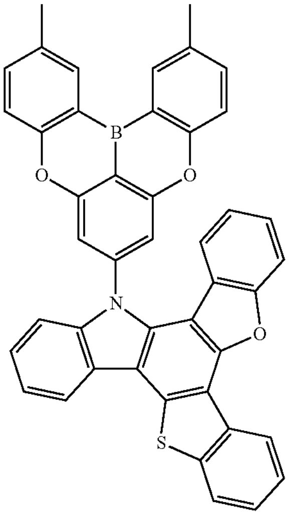
-continued
Compound T-18
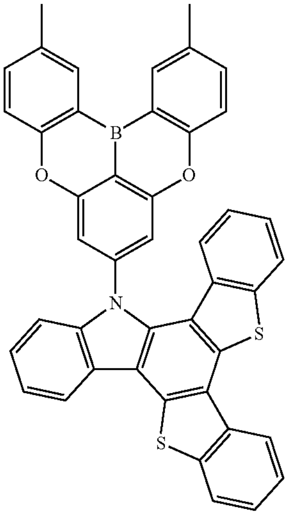
Compound T-19
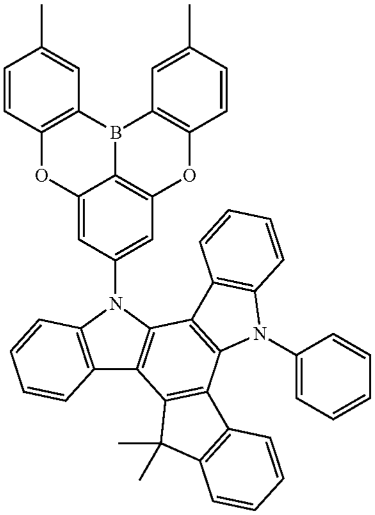
Compound T-20
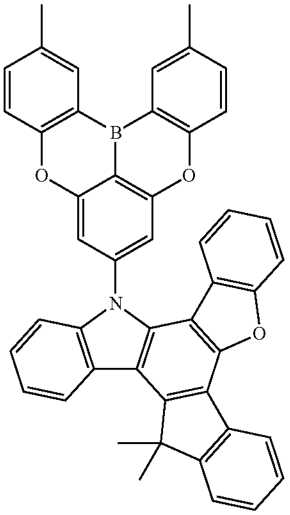

-continued
Compound T-21
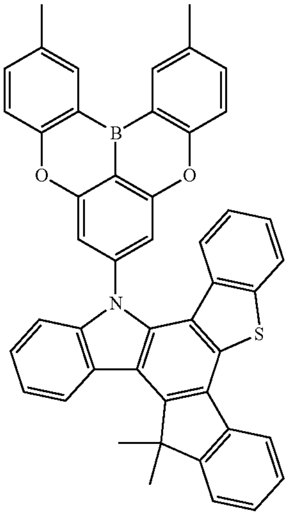
Compound T-22
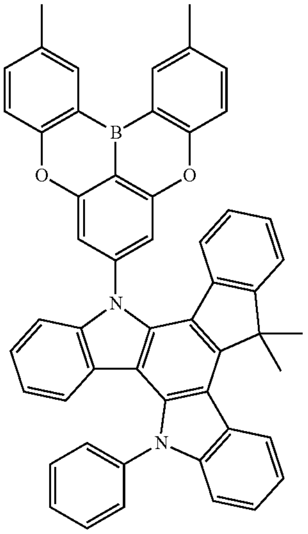
Compound T-23
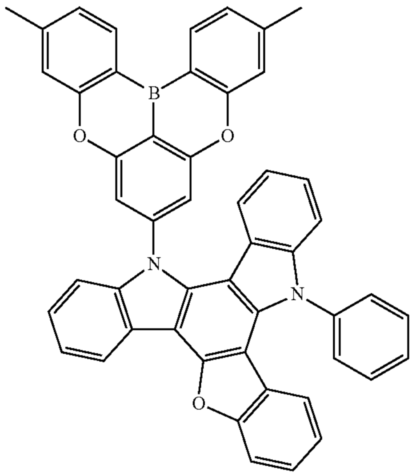
-continued
Compound T-24
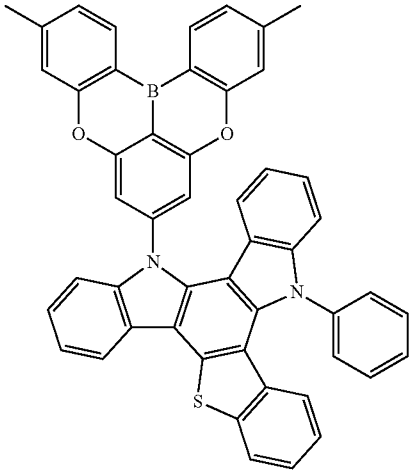
Compound T-25
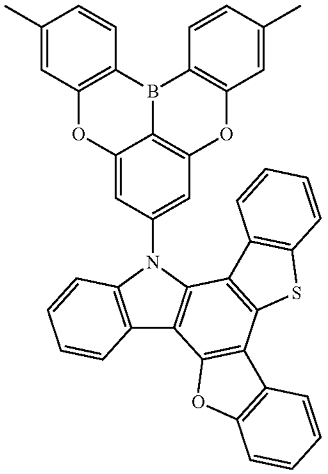
Compound T-26
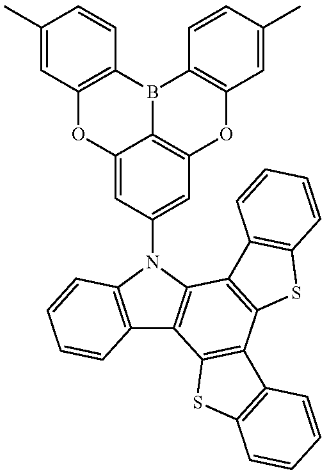

-continued
Compound T-27
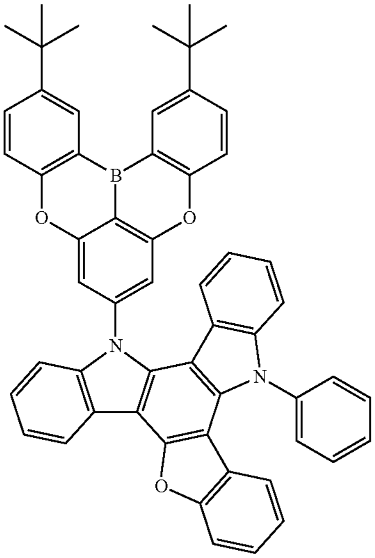
Compound T-28
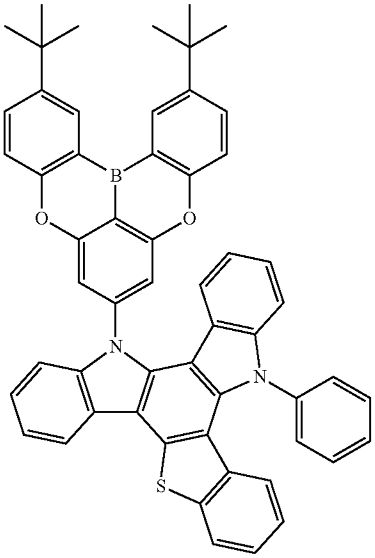
-continued
Compound T-29
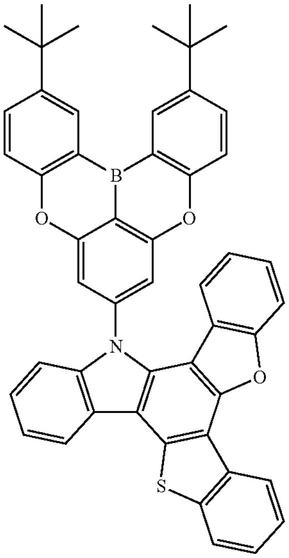
Compound T-30
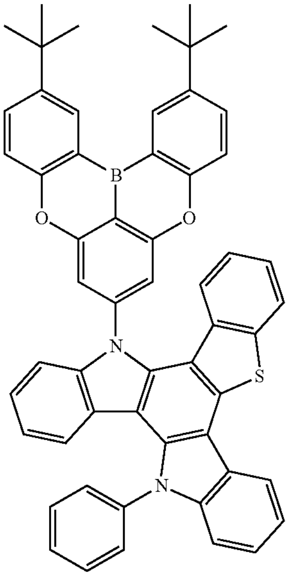

-continued
Compound T-31
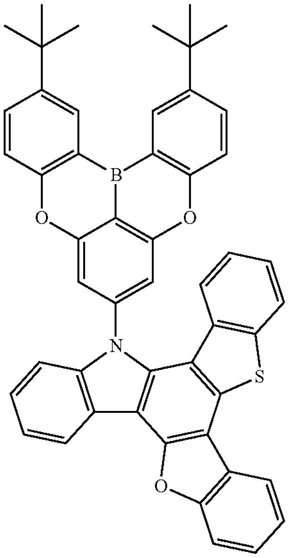
Compound T-32
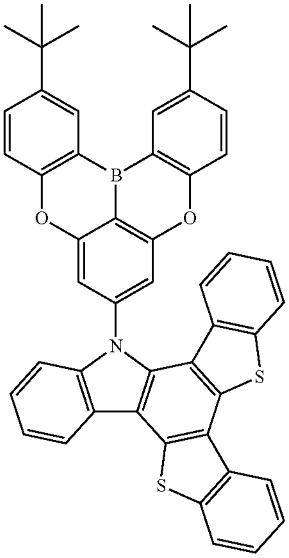
-continued
Compound T-33
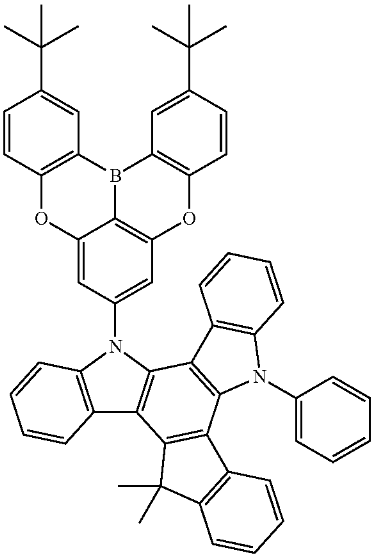
Compound T-34
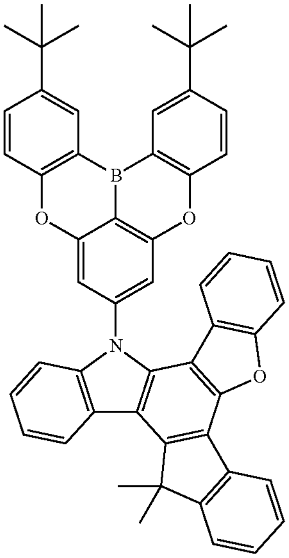

-continued
Compound T-35
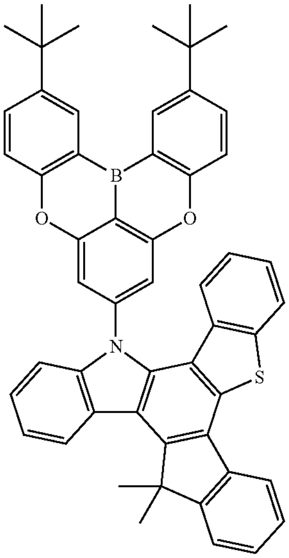
Compound T-36
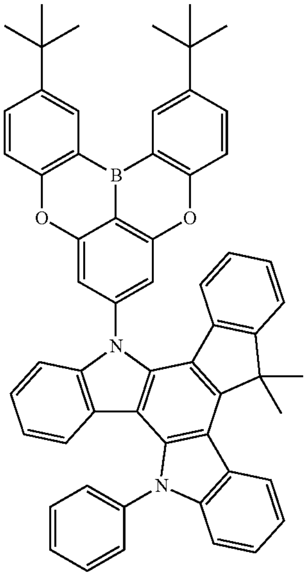
-continued
Compound T-37
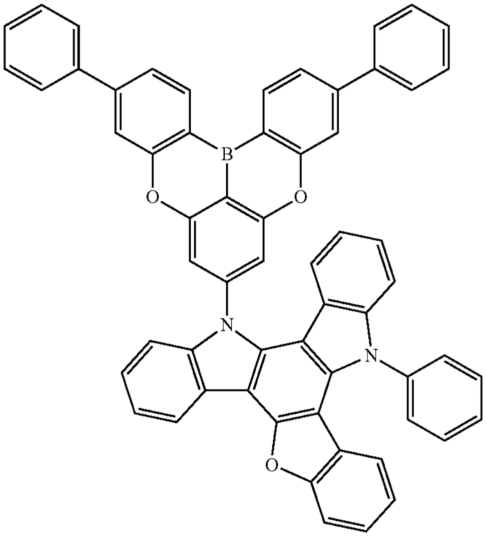
Compound T-38
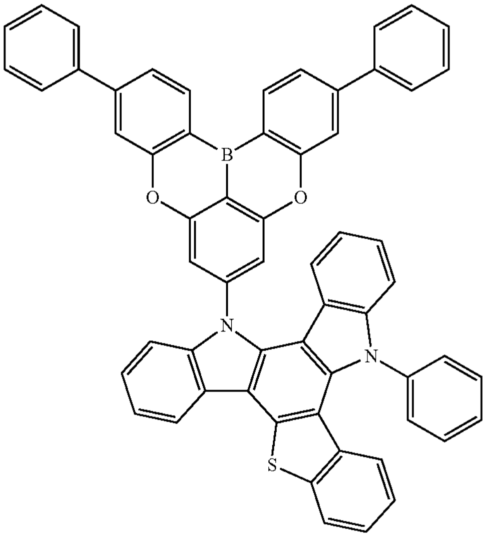

-continued
Compound T-39
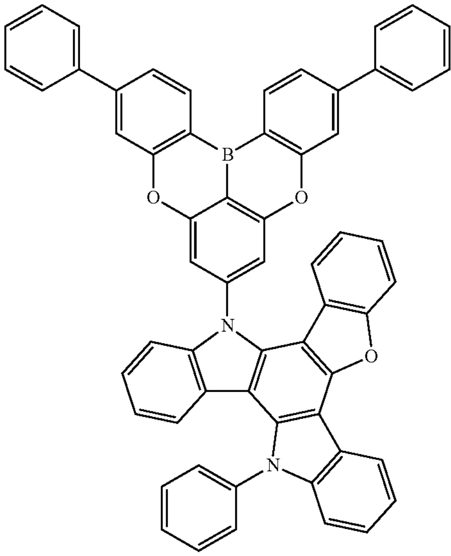
Compound T-40
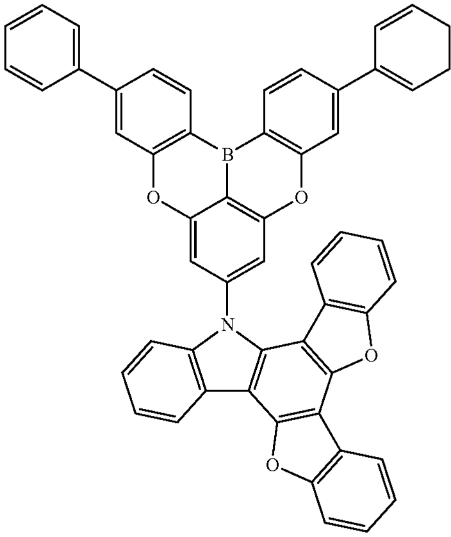
-continued
Compound T-41
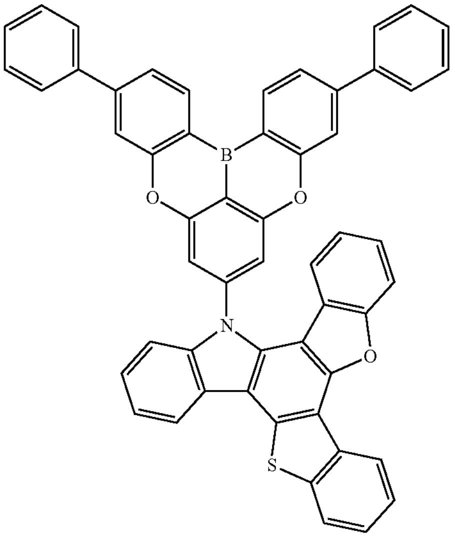
Compound T-42
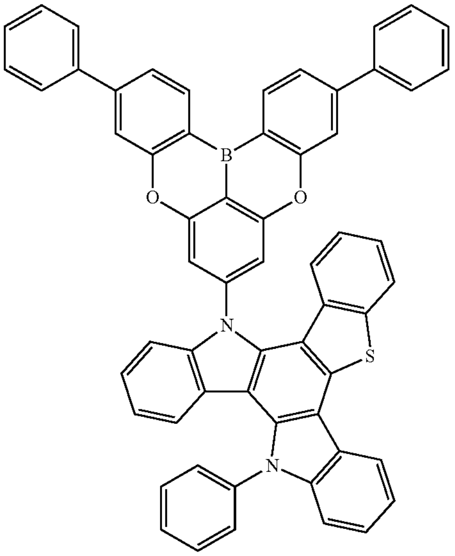

-continued
Compound T-43
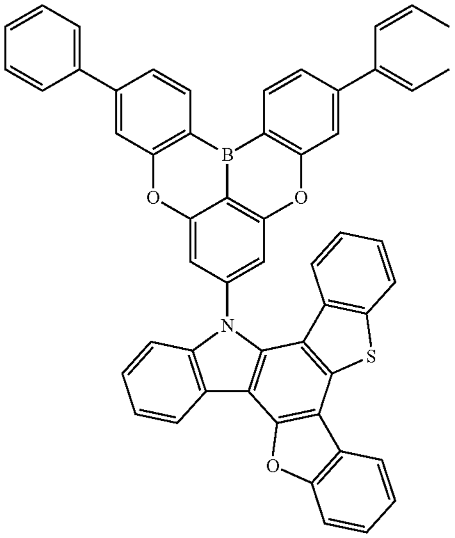
Compound T-44
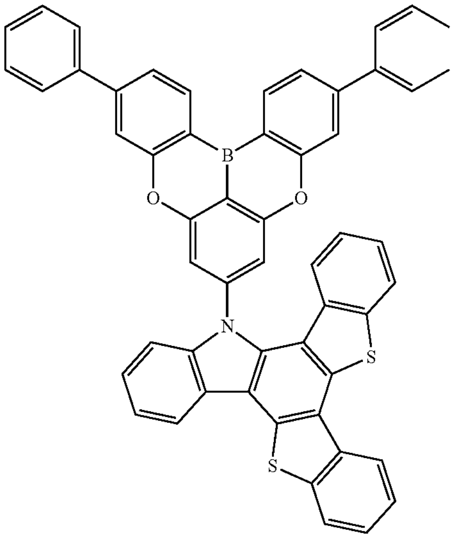
-continued
Compound T-45
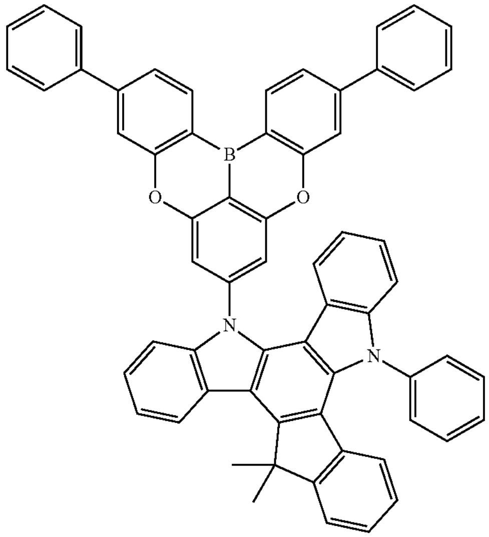
Compound T-46
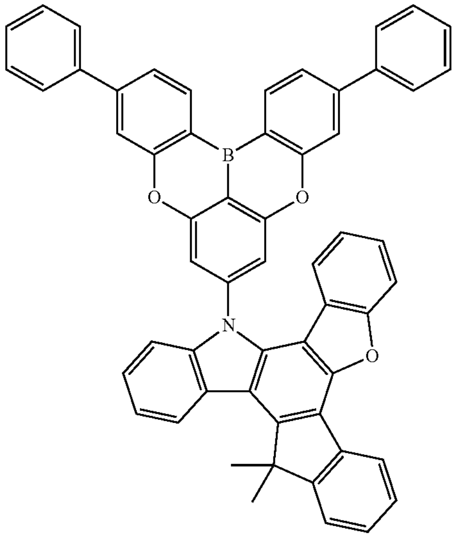

-continued
Compound T-47
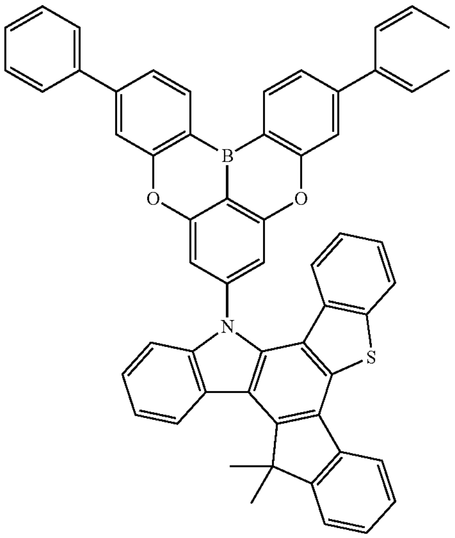
Compound T-48
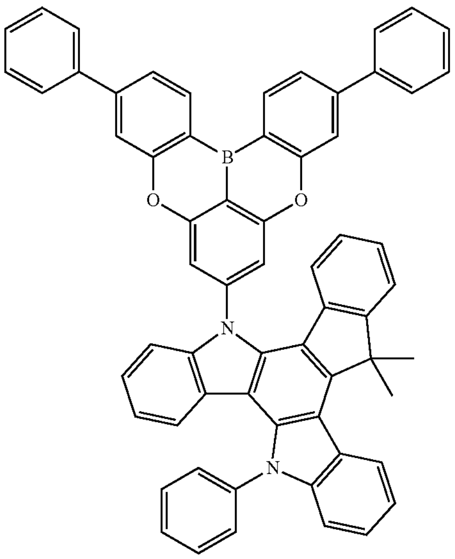
Compound T-49
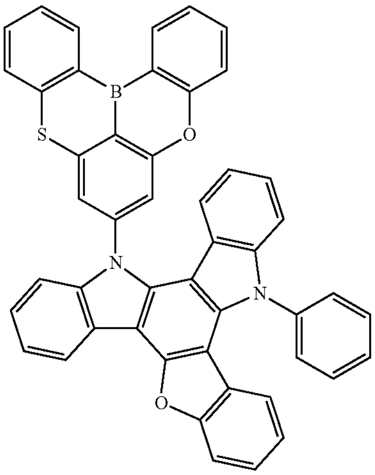
-continued
Compound T-50
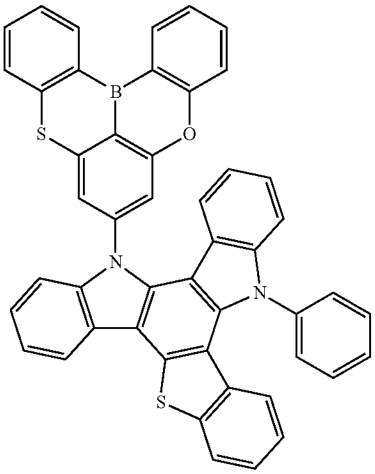
Compound T-51
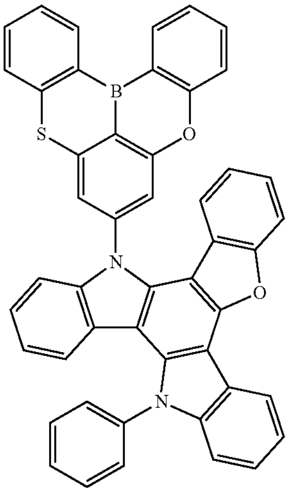
Compound T-52
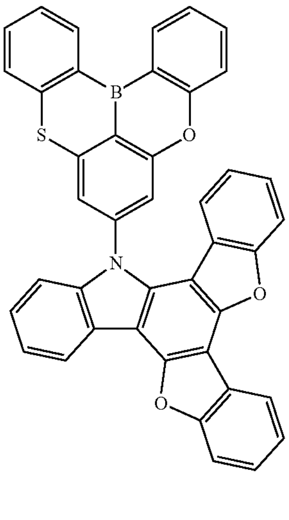

-continued
Compound T-53
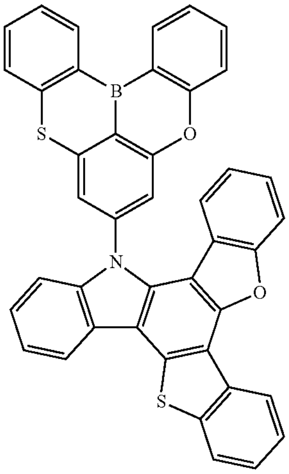
Compound T-54
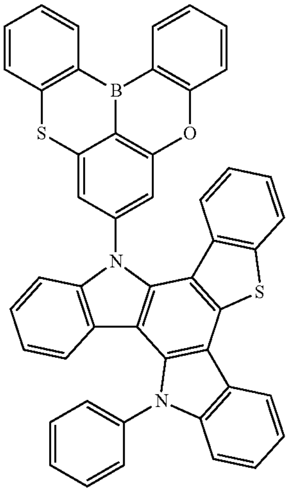
Compound T-55
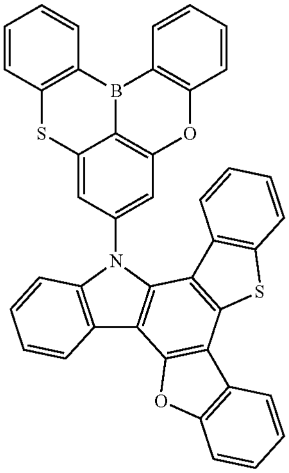
-continued
Compound T-56
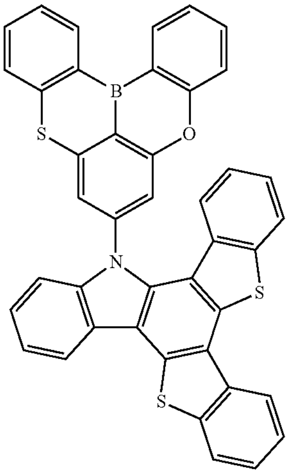
Compound T-57
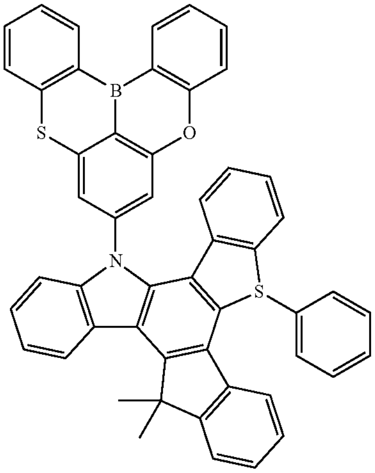
Compound T-58
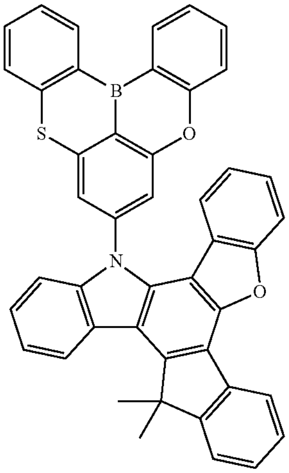

Compound T-59
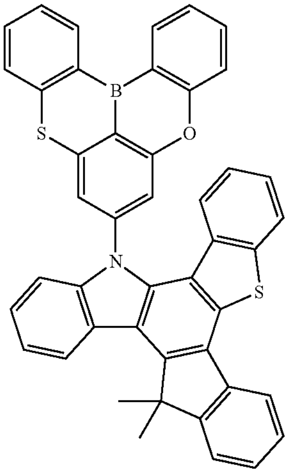
Compound T-60
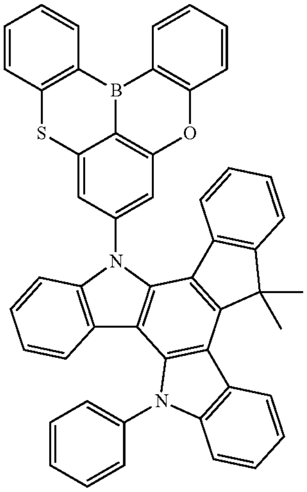
Compound T-61
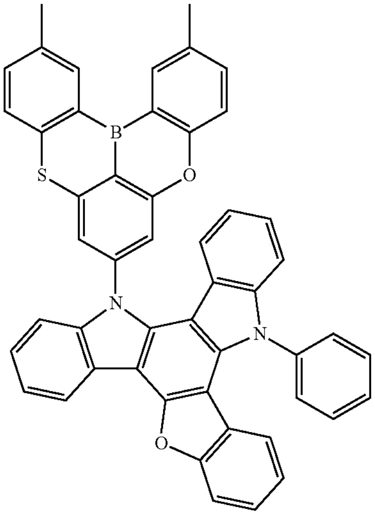
Compound T-62
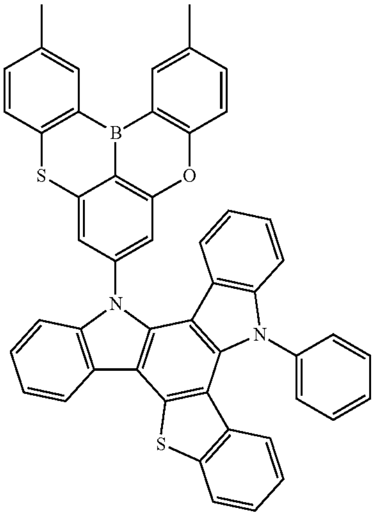
Compound T-63
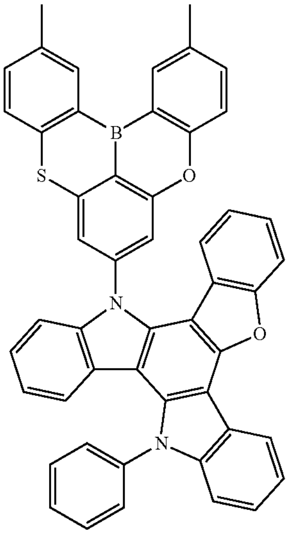
Compound T-64
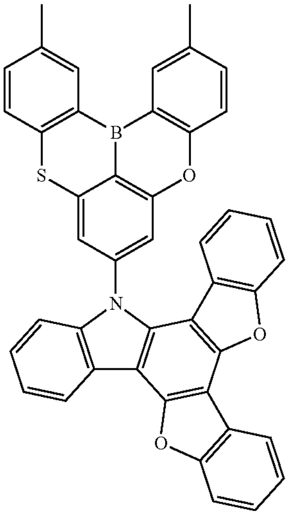

-continued
Compound T-65
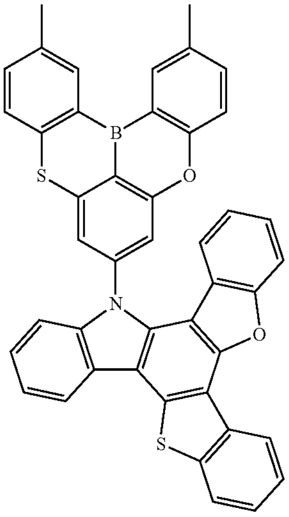
Compound T-66
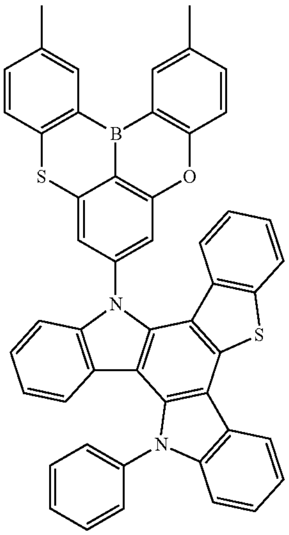
Compound T-67
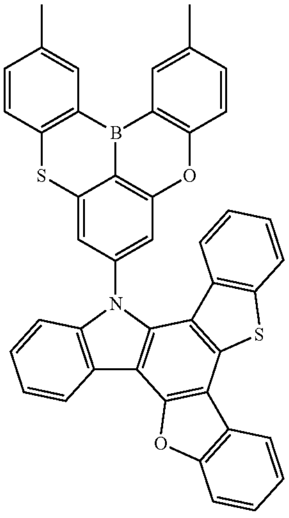
-continued
Compound T-68
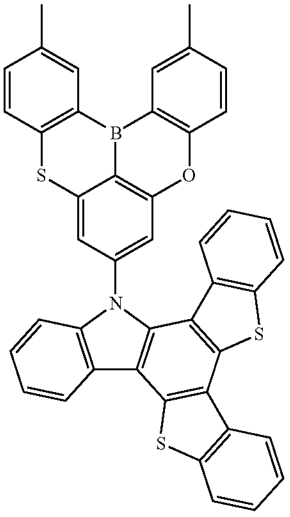
Compound T-69
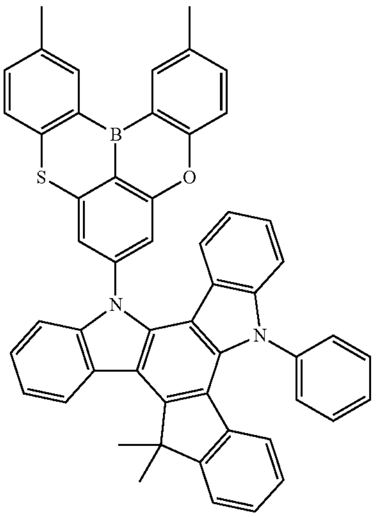
Compound T-70
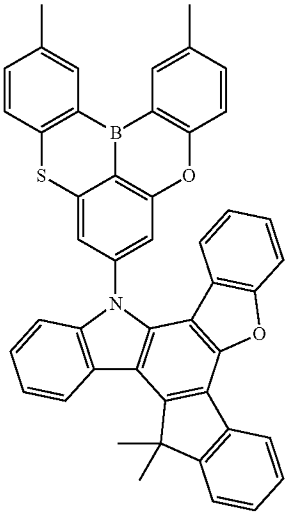

-continued
Compound T-71
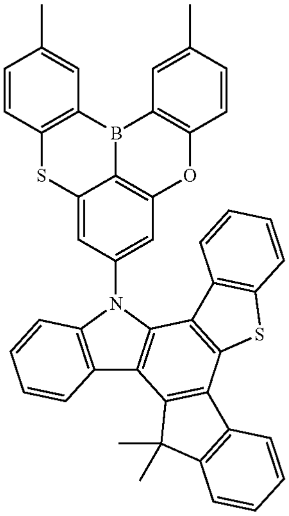
Compound T-72
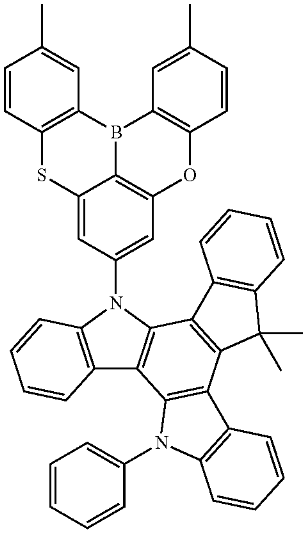
Compound T-73
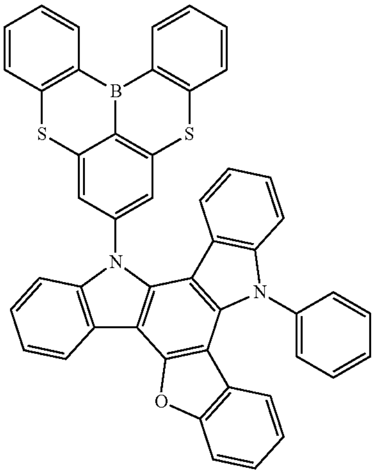
-continued
Compound T-74
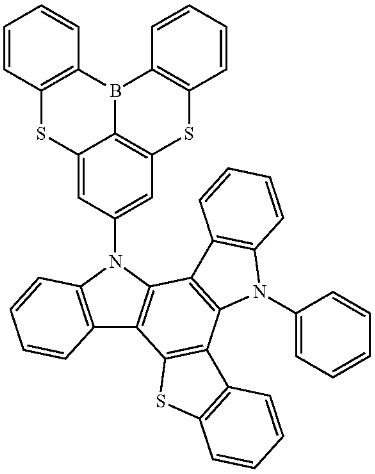
Compound T-75
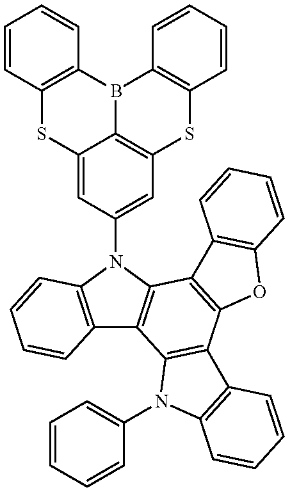
Compound T-76
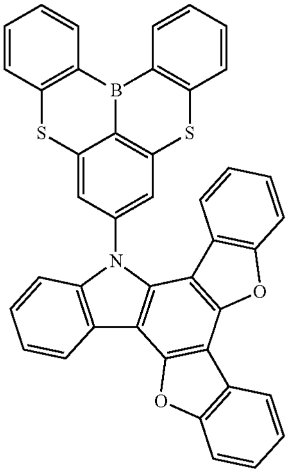

-continued
Compound T-77
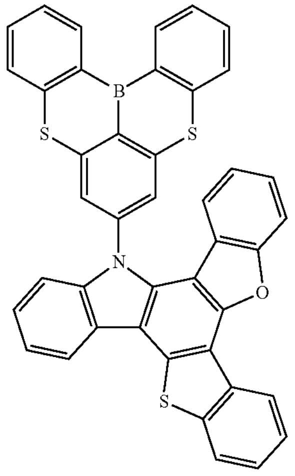
Compound T-78
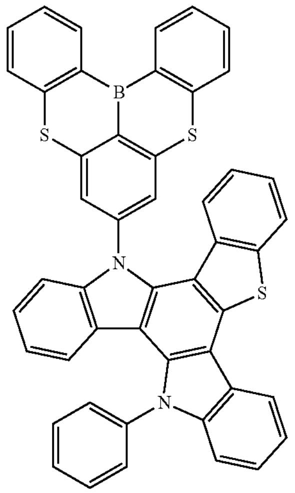
Compound T-79
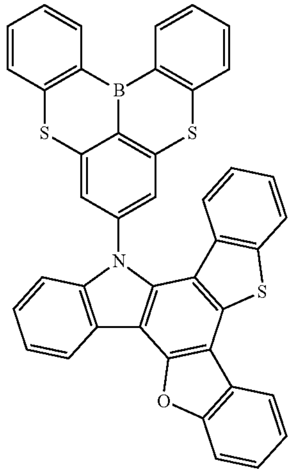
-continued
Compound T-80
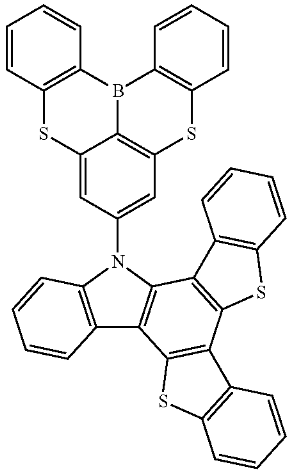
Compound T-81
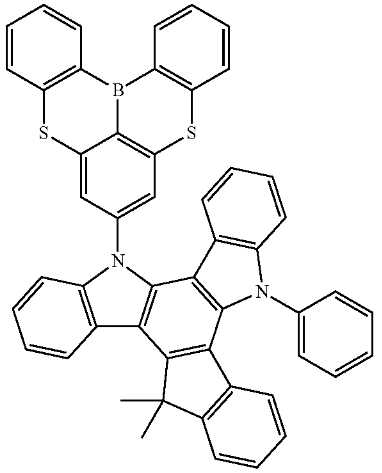
Compound T-82
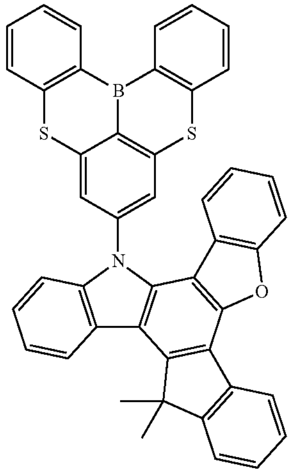

-continued
Compound T-83
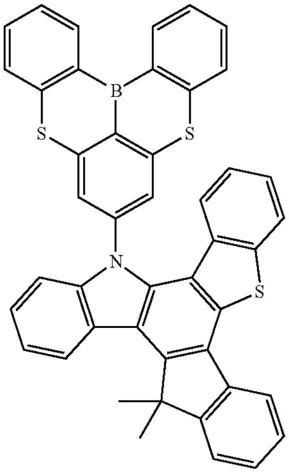
Compound T-84
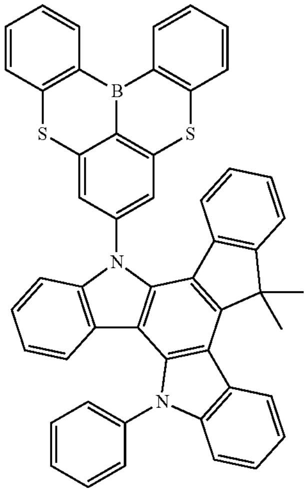
Compound T-85
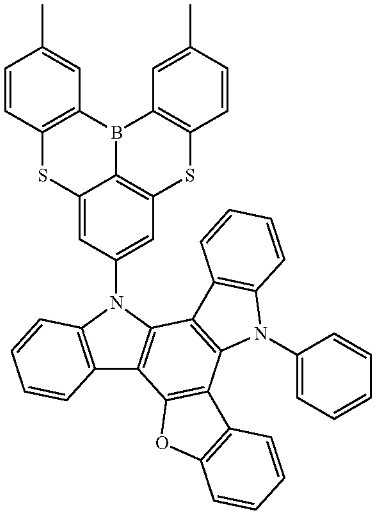
-continued
Compound T-86
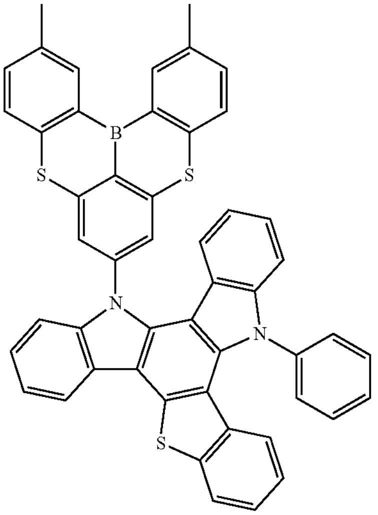
Compound T-87
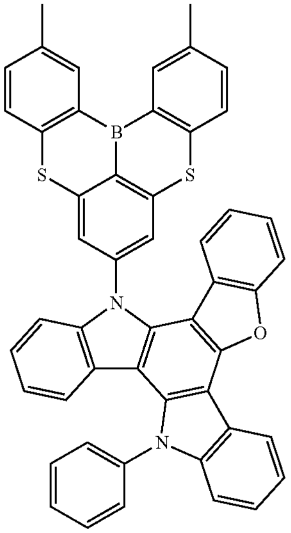
Compound T-88
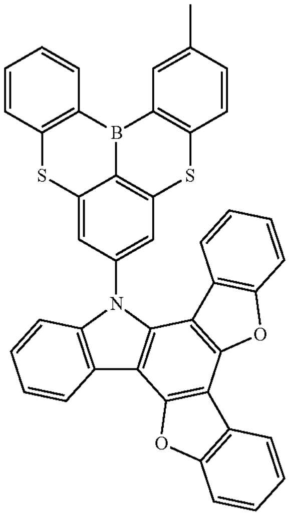

-continued
Compound T-89
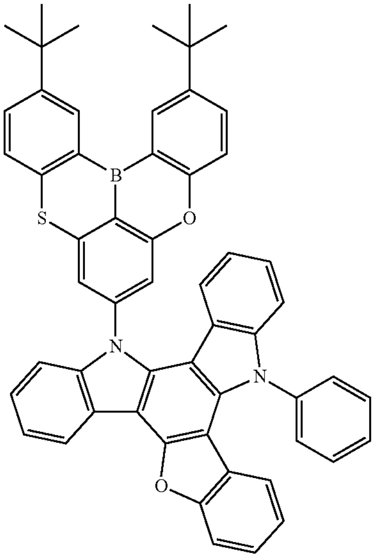
Compound T-90
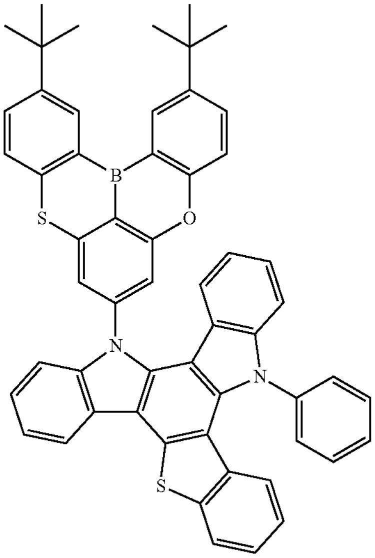
-continued
Compound T-91
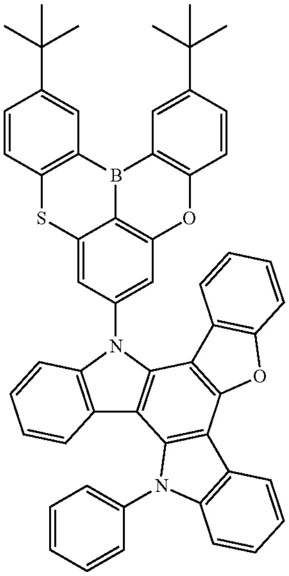
Compound T-92
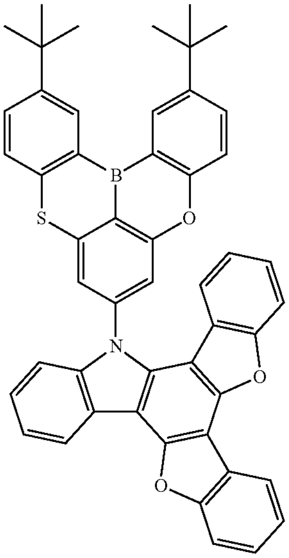

-continued
Compound T-93
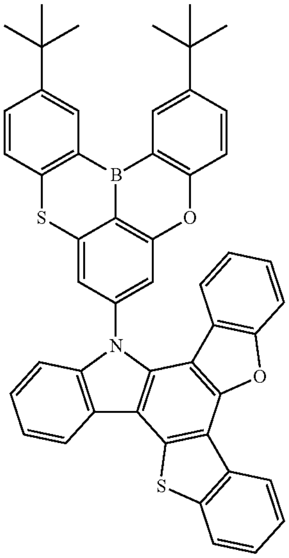
Compound T-94
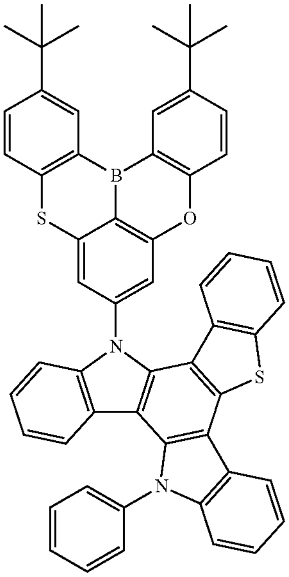
-continued
Compound T-95
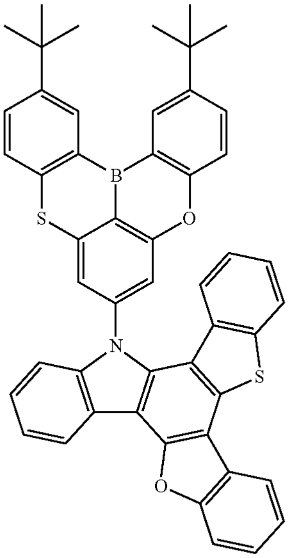
Compound T-96
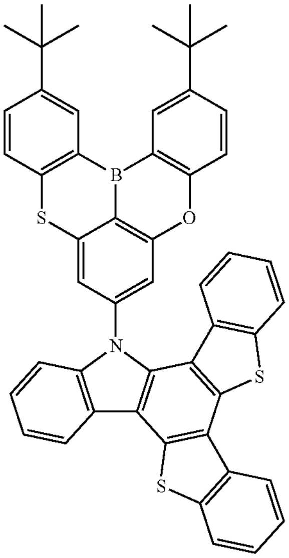
Compound T-97
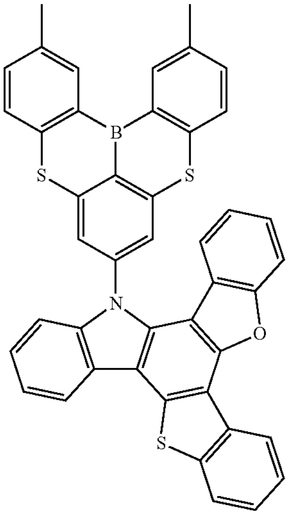

-continued
Compound T-98
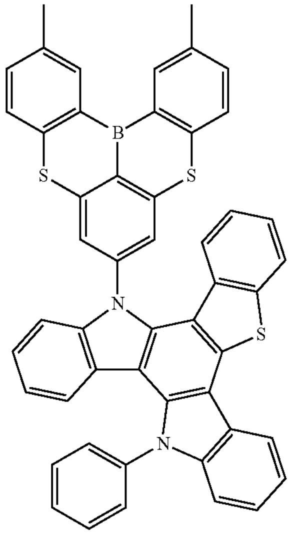
Compound T-99
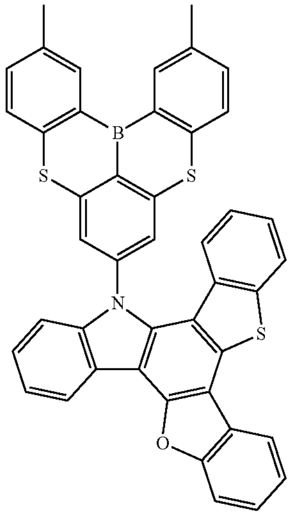
Compound T-100
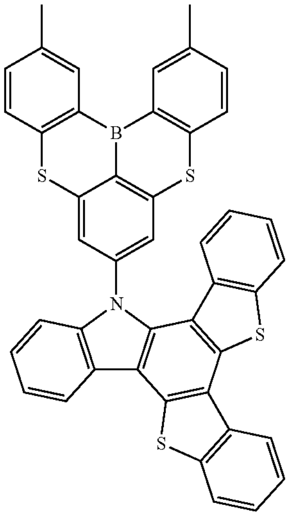
-continued
Compound T-101
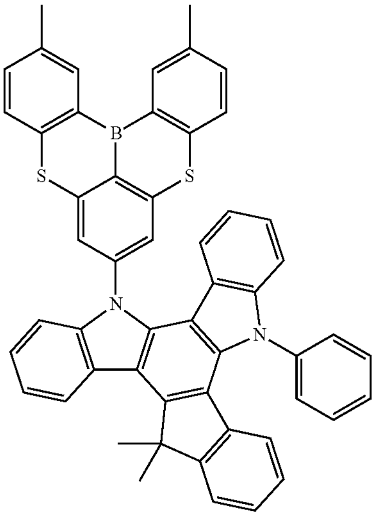
Compound T-102
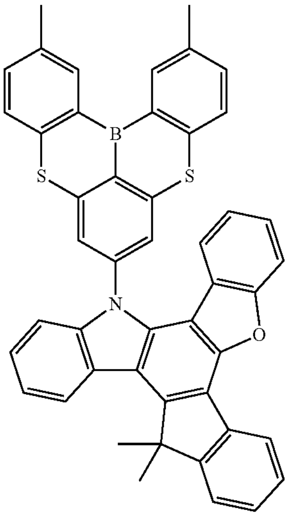
Compound T-103
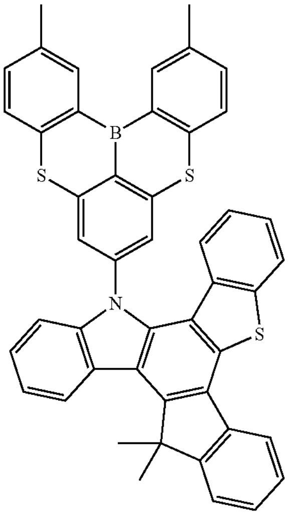

-continued
Compound T-104
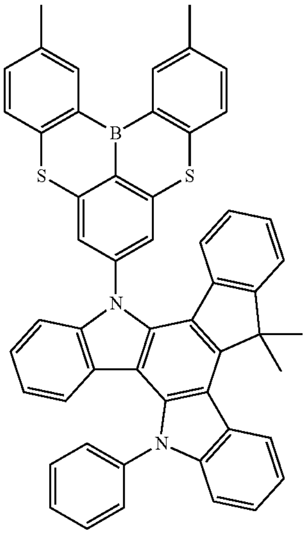
Compound T-105
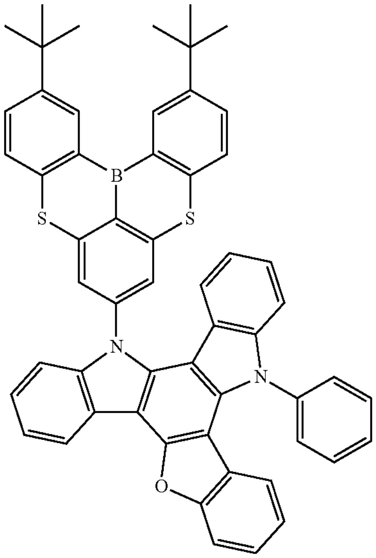
Compound T-106
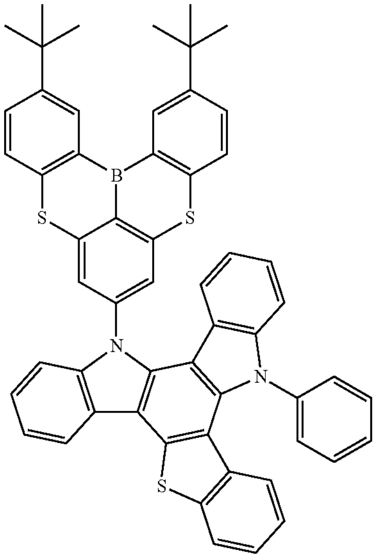
-continued
Compound T-107
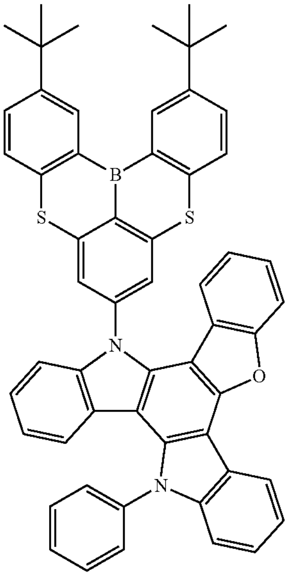
Compound T-108
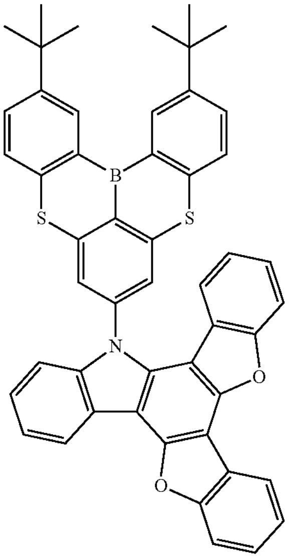

-continued
Compound T-109
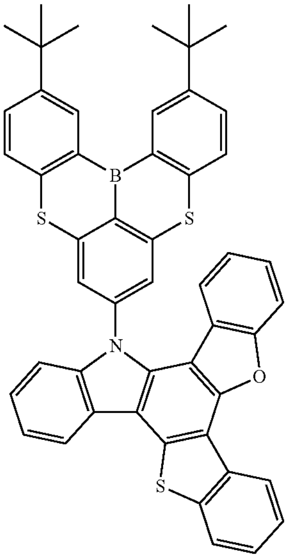
Compound T-110
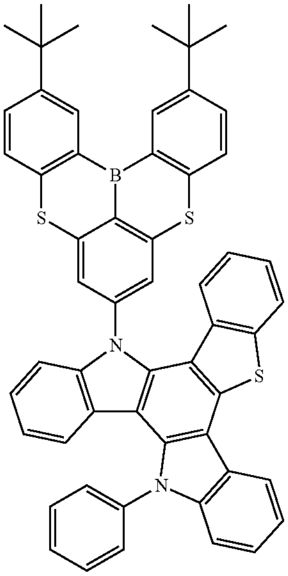
-continued
Compound T-111
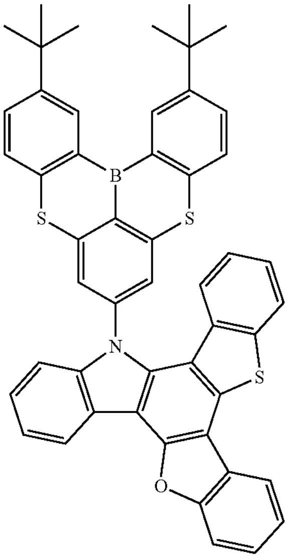
Compound T-112
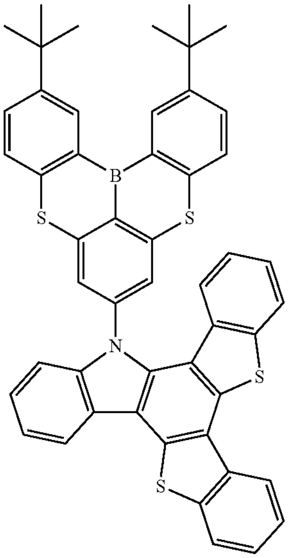
Compound T-113
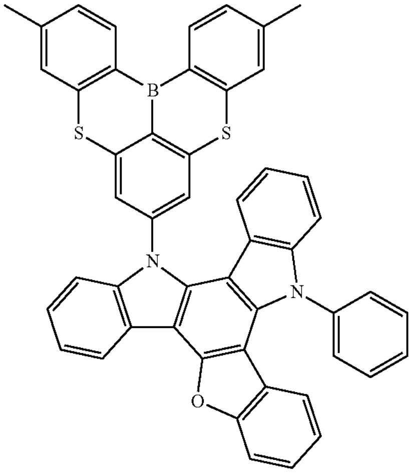

-continued
Compound T-114
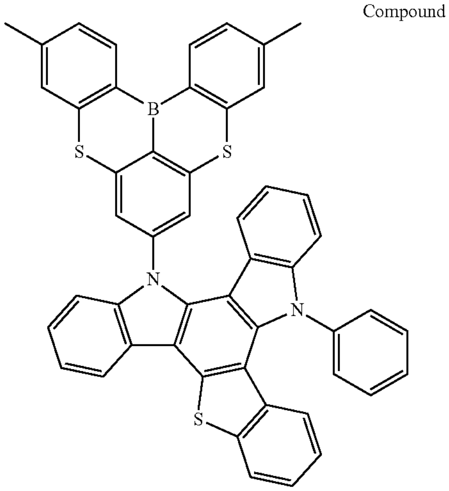
Compound T-115
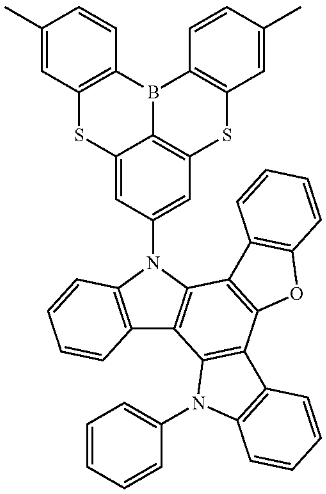
Compound T-116
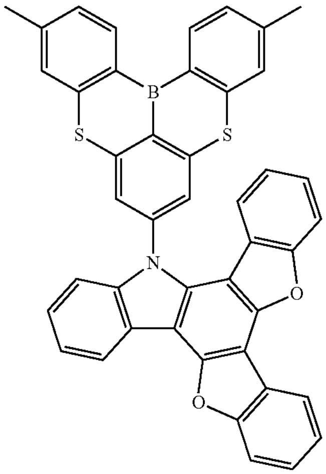
-continued
Compound T-117
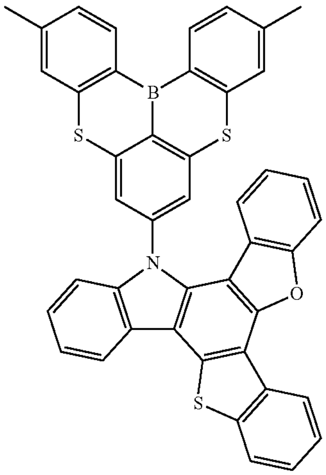
Compound T-118
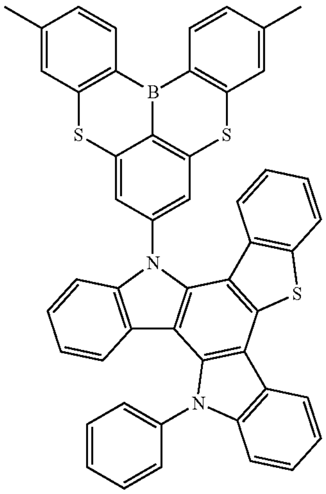
Compound T-119
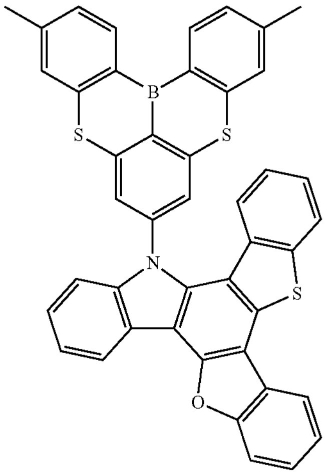

-continued
Compound T-120
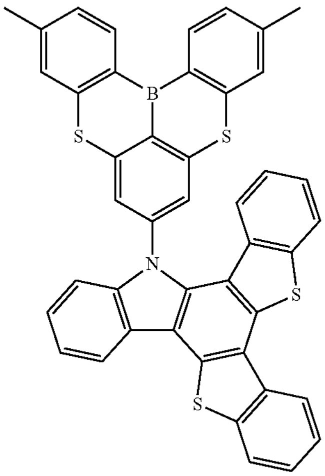
Compound T-121
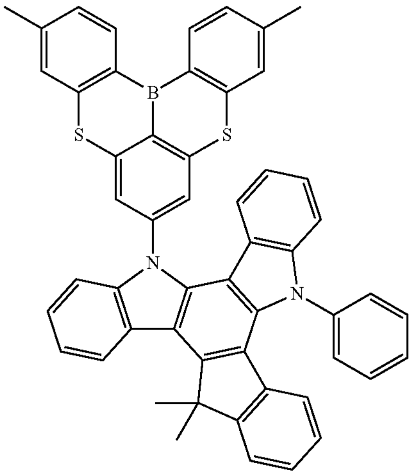
Compound T-122
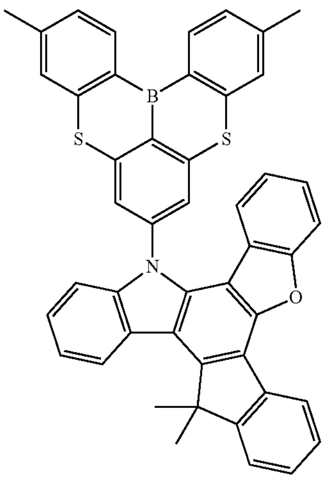
-continued
Compound T-123
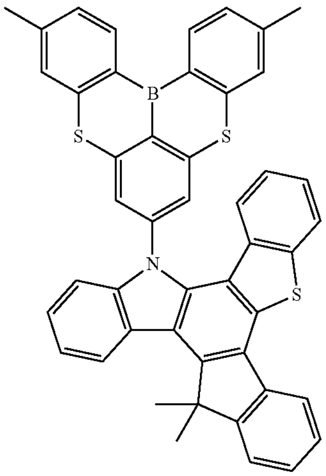
Compound T-124
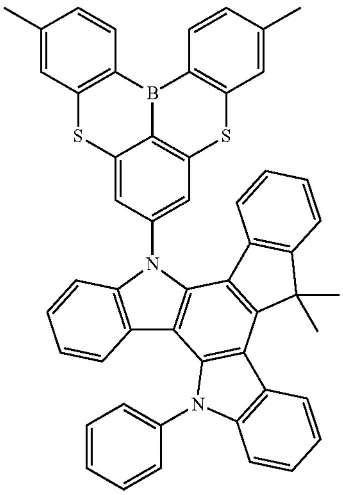
Compound T-125
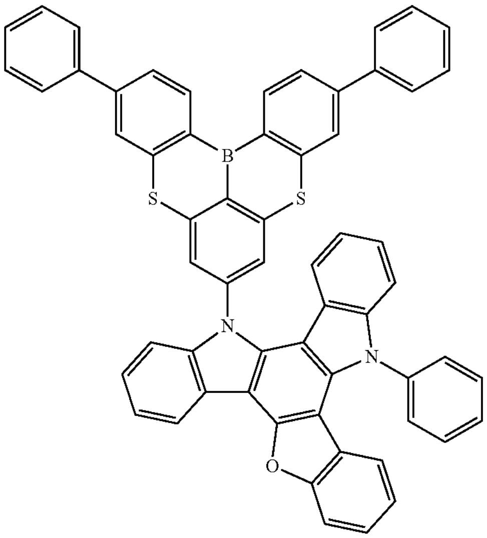

-continued
Compound T-126
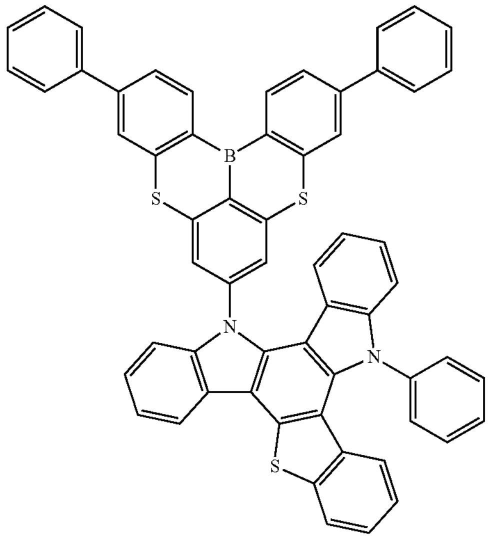
Compound T-127
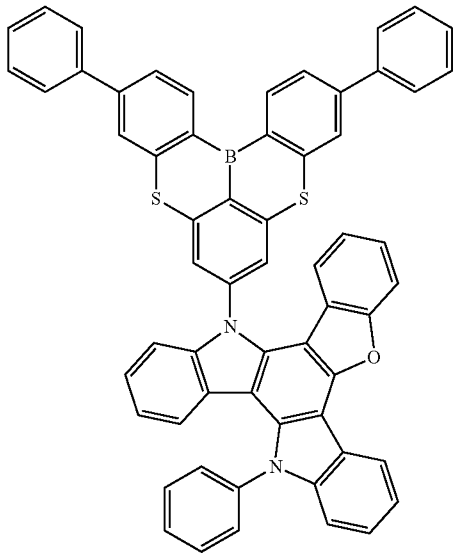
-continued
Compound T-128
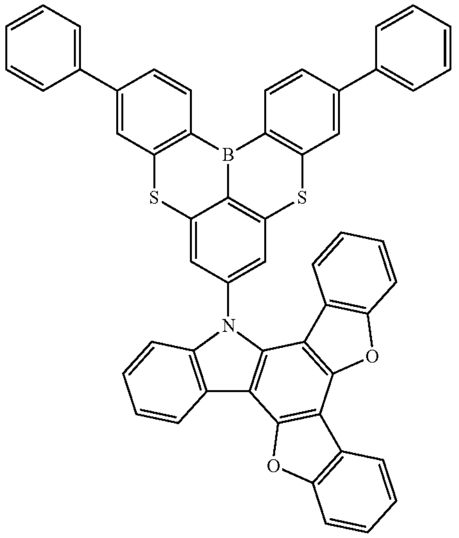
Compound T-129
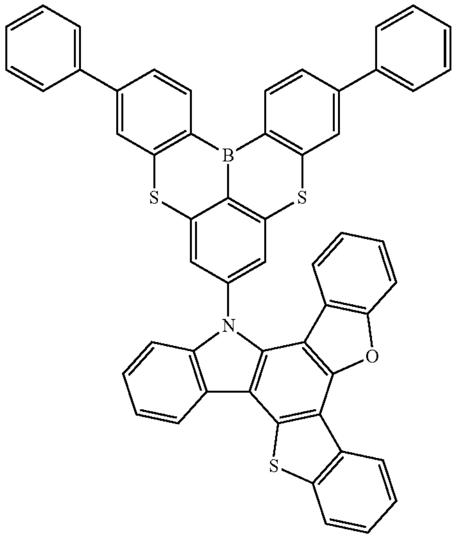

-continued
Compound T-130
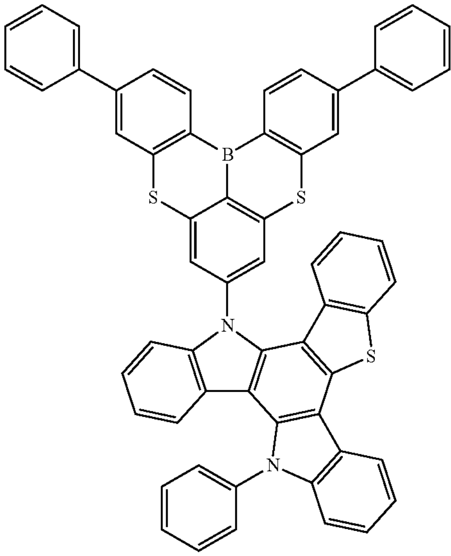
Compound T-131
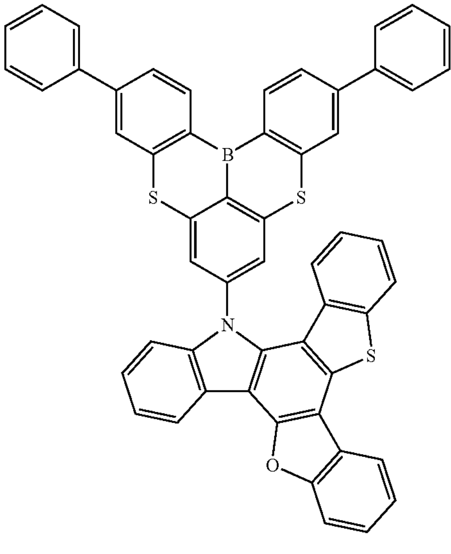
-continued
Compound T-132
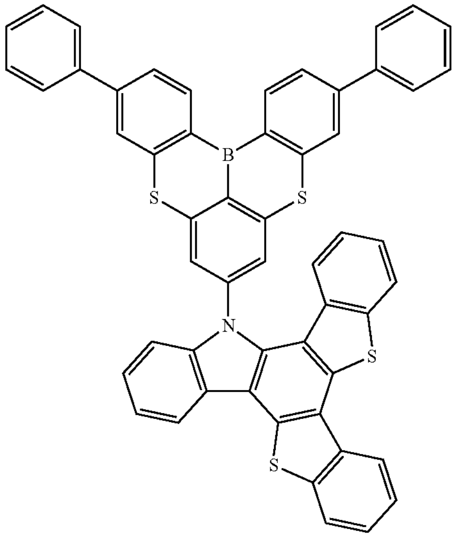
Compound T-133
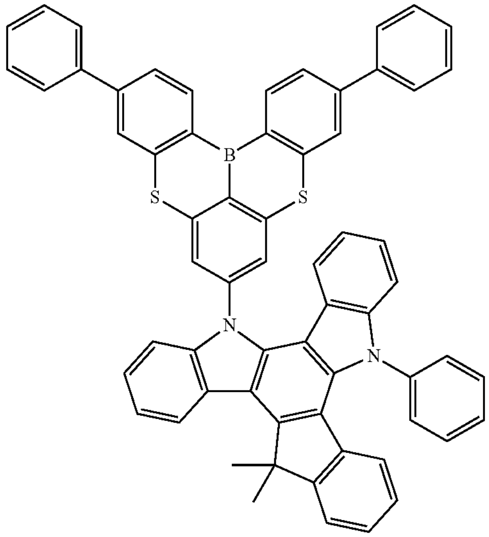

-continued
Compound T-134
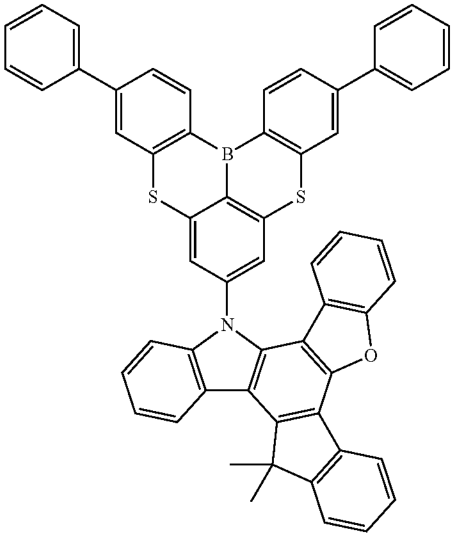
Compound T-135
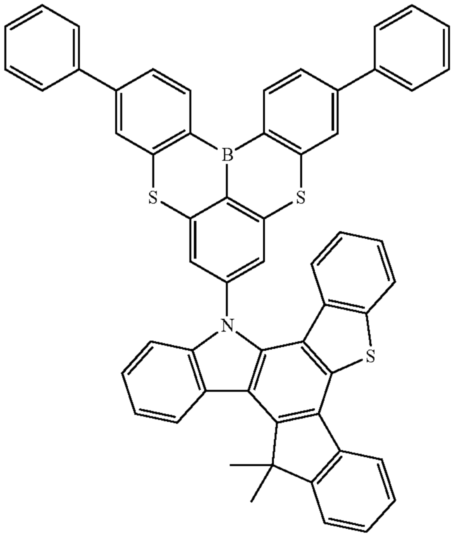
-continued
Compound T-136
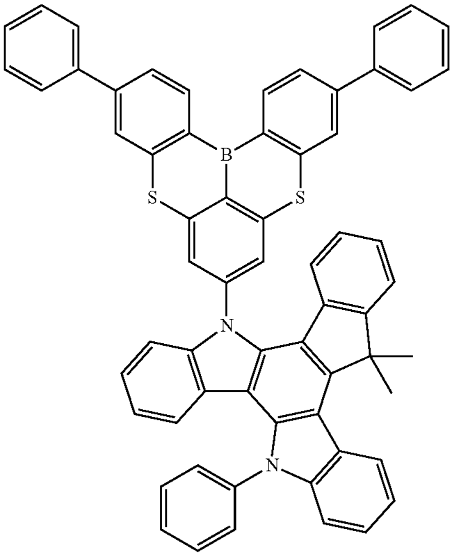
Compound T-137
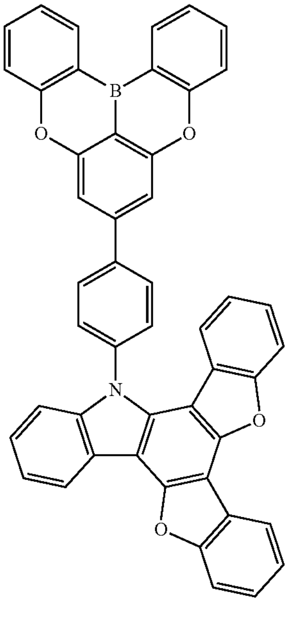

-continued
Compound T-138
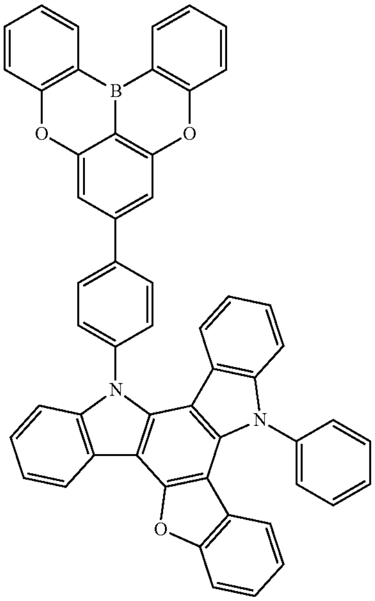
Compound T-139
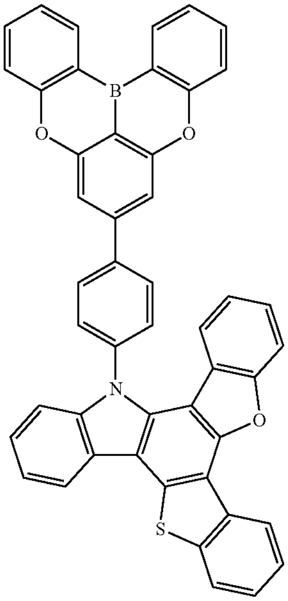
-continued
Compound T-140
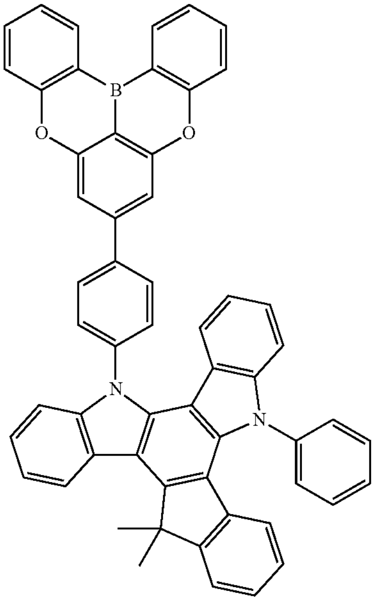
Compound T-141
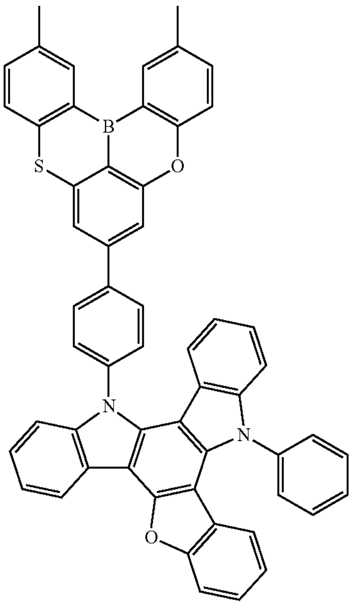

-continued

Compound T-142

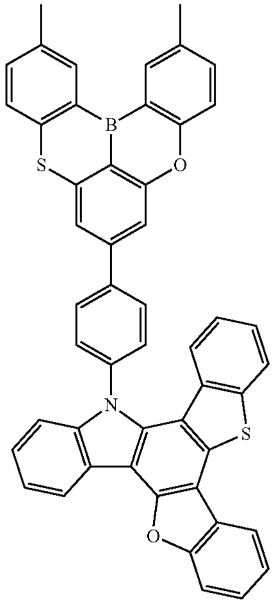

Compound T-143

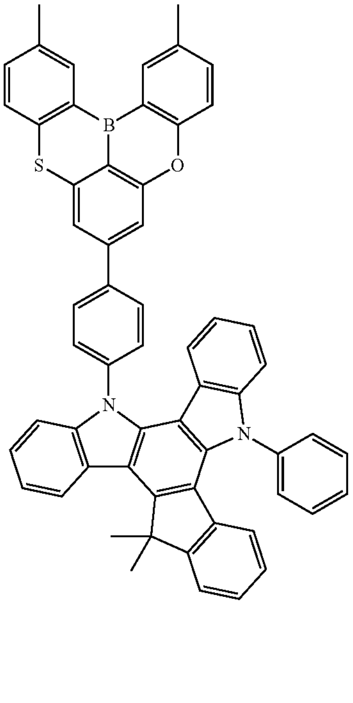

-continued

Compound T-144

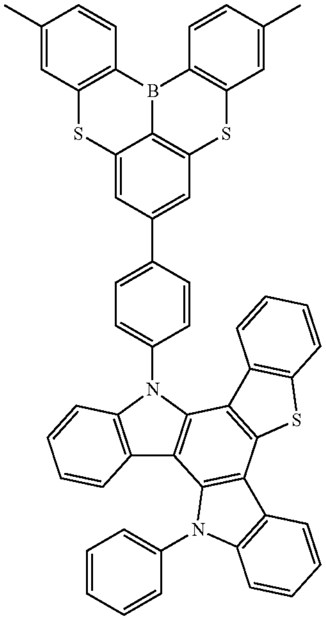

Organic Light-Emitting Device

An organic light-emitting device according to another aspect of the present invention may include a first electrode; a second electrode provided to face the first electrode; and one or more organic material layers interposed between the first electrode and the second electrode, wherein one or more of the organic layers may include one or more of the above-described delayed fluorescence compounds.

The organic light-emitting device may have superior efficiency compared to conventional fluorescence devices by including the compound represented by Chemical Formula 1 having delayed fluorescence properties in the light-emitting layer.

In another embodiment, one or more of the organic material layers may include a fluorescence compound represented by Chemical Formula 3 below:

[Chemical Formula 3]

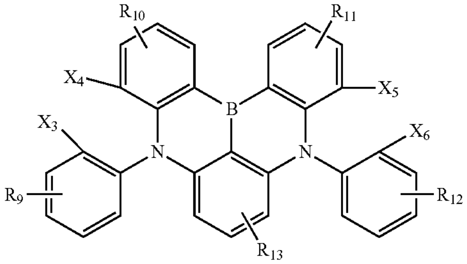

in Chemical Formula 3, $R_9$ to $R_{13}$ are each independently selected from hydrogen, deuterium, —F, —Cl, —Br, —I, a hydroxyl group, a cyano group, a nitro group, an amino group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted monovalent non-aromatic condensed polycyclic group, and a substituted or unsubstituted monovalent non-aromatic heterocondensed polycyclic group; and $X_3$ to $X_6$ are each independently hydrogen or bind together to form a ring.

A hyperfluorescence organic light-emitting device can be manufactured by mixing a small amount of a fluorescent material in a delayed fluorescent light-emitting layer, and such a device can transfer high-efficiency energy obtained through reverse inter-system crossing of a delayed fluorescence compound to a fluorescent material. Since final light emission occurs in a fluorescence dopant compound, high efficiency obtained from delayed fluorescence and high color purity can be implemented.

In order to improve the energy transfer efficiency of the hyperfluorescence device, the wider the overlap region between the absorption spectrum of the fluorescence dopant and the luminescence spectrum of the delayed fluorescence dopant, the better. Therefore, it is important to have a narrow Stoke's shift value in the case of a fluorescence dopant when manufacturing the hyperfluorescence device, and it may be advantageous to select the emission wavelength of delayed fluorescence to be located at the peak of the maximum absorption spectrum of the fluorescence dopant.

Since the delayed fluorescence compound represented by Chemical Formula 1 has a wider bandgap properties than the conventional delayed fluorescence compound, it is possible to emit deep blue light and thus have a wide spectrum overlap region with the fluorescence compound represented by Chemical Formula 3. Accordingly, by simultaneously using the delayed fluorescence compound of Chemical Formula 1 and the fluorescence compound of Chemical Formula 3, excellent hyperfluorescence properties can be implemented through an effective energy transfer process.

In one embodiment, the delayed fluorescence compound represented by Chemical Formula 1 and the fluorescence compound represented by Chemical Formula 3 may be included in the same organic material layer, and the organic material layer may further include a host compound. As such, an organic light-emitting device including a light-emitting layer including a host compound, a delayed fluorescence compound, and a fluorescence compound may be a hyperfluorescencorganic light-emitting device. The delayed fluorescence compound acts as a kind of host to form excitons, and these excitons may emit light through the fluorescence compound to realize hyperfluorescence properties.

The fluorescence compound represented by Chemical Formula 3 may be represented by one of the following Chemical Formulas F-1 to F-35:

Compound F-1

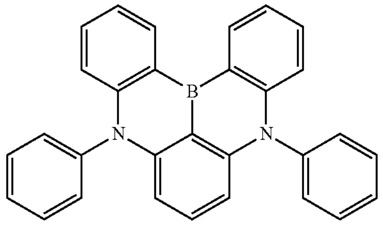

Compound F-2

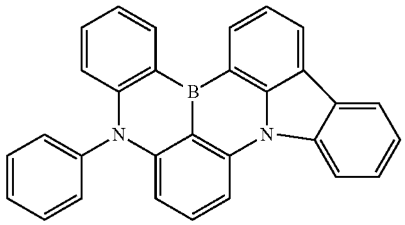

Compound F-3

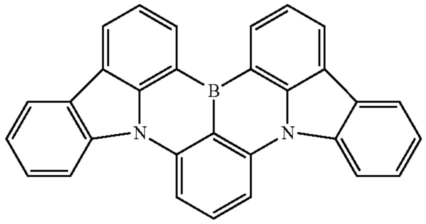

Compound F-4

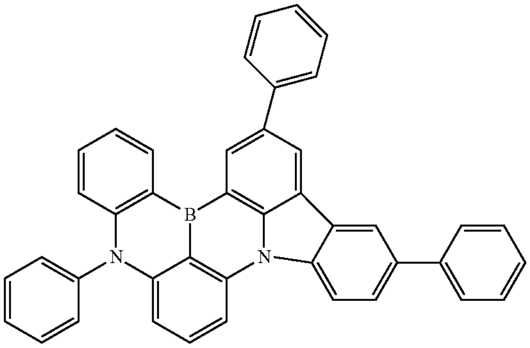

Compound F-5

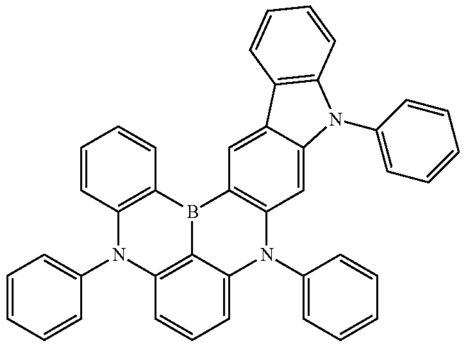

-continued
Compound F-6
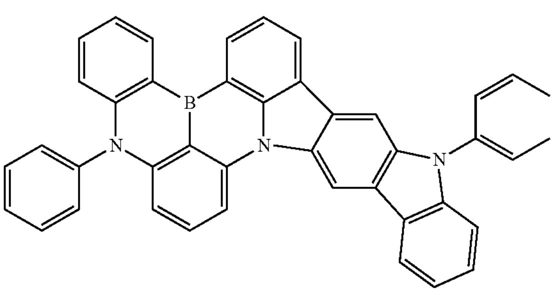
Compound F-7
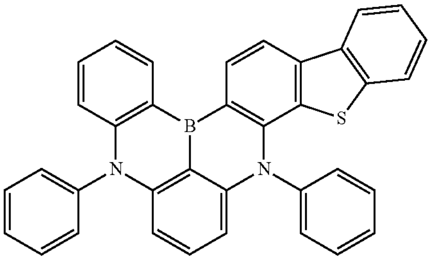
Compound F-8
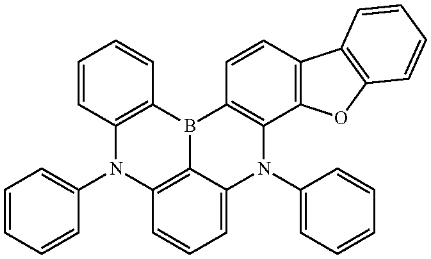
Compound F-9
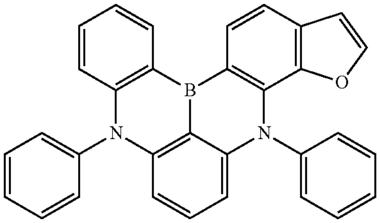
Compound F-10
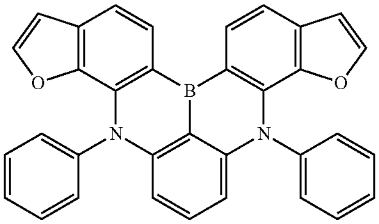
Compound F-11
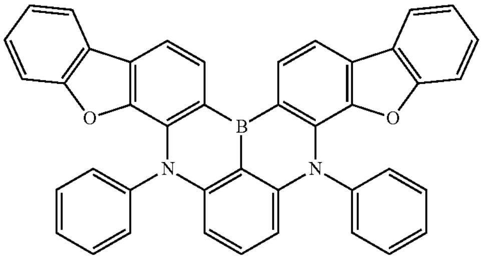
-continued
Compound F-12
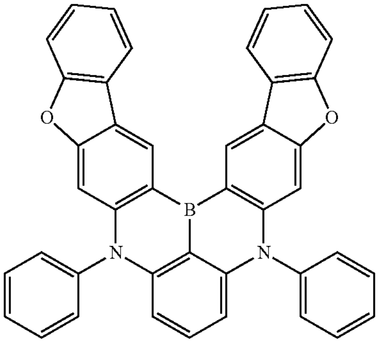
Compound F-13
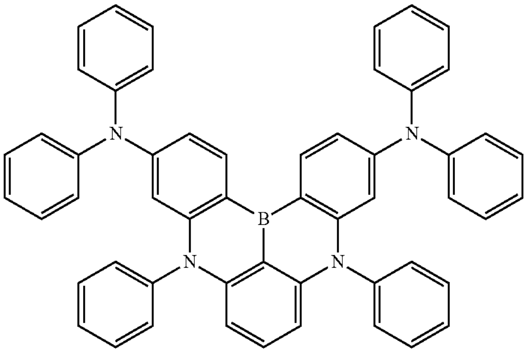
Compound F-14
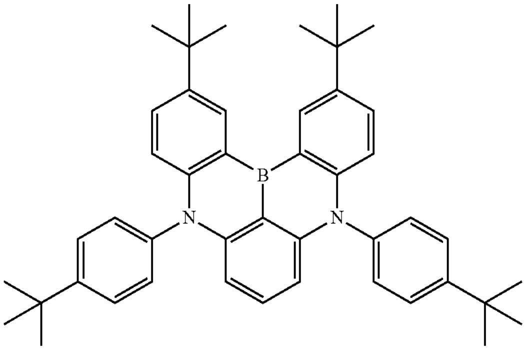
Compound F-15
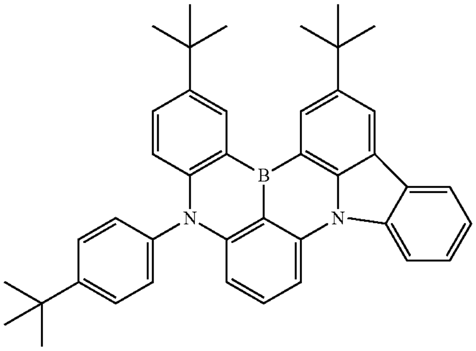

Compound F-16
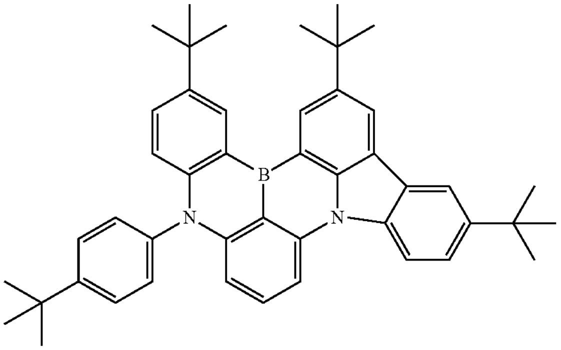
Compound F-17
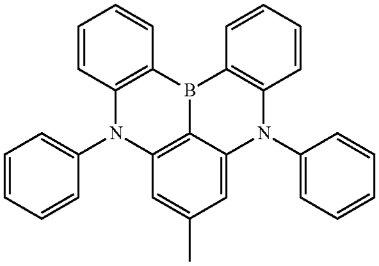
Compound F-18
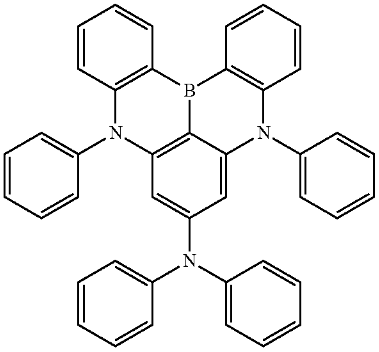
Compound F-19
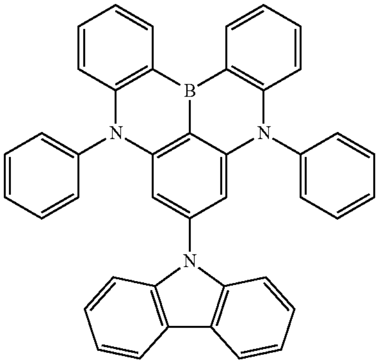
Compound F-20
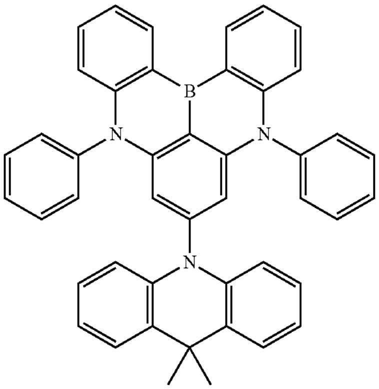
Compound F-21
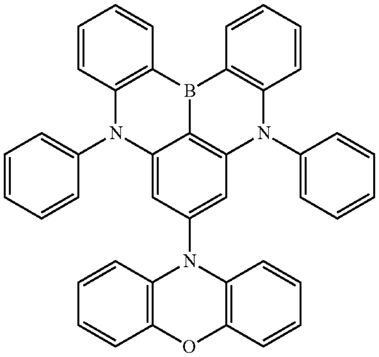
Compound F-22
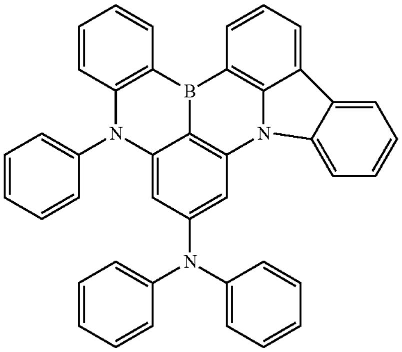
Compound F-23
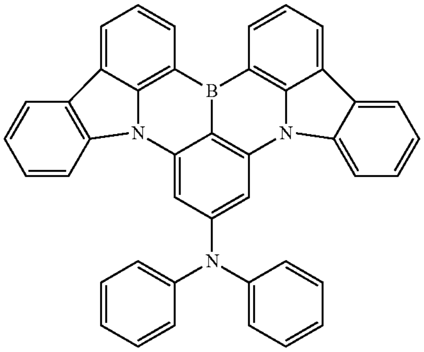

-continued
Compound F-24
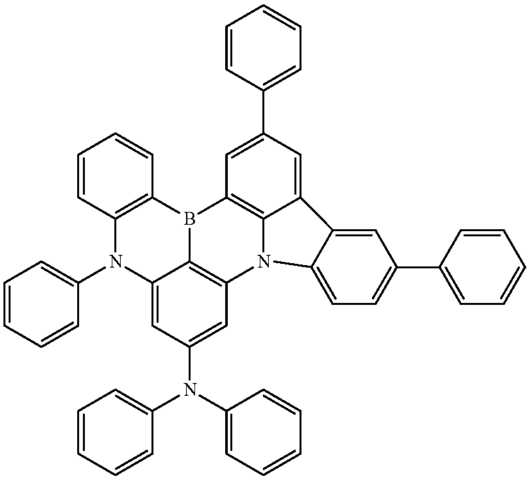
Compound F-25
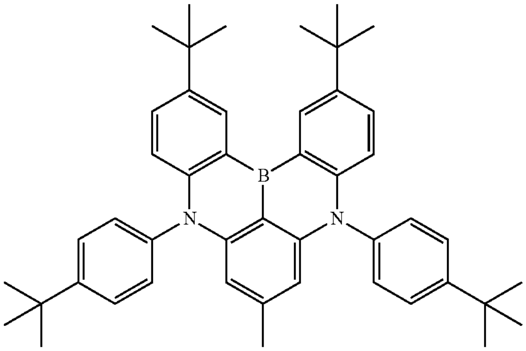
Compound F-26
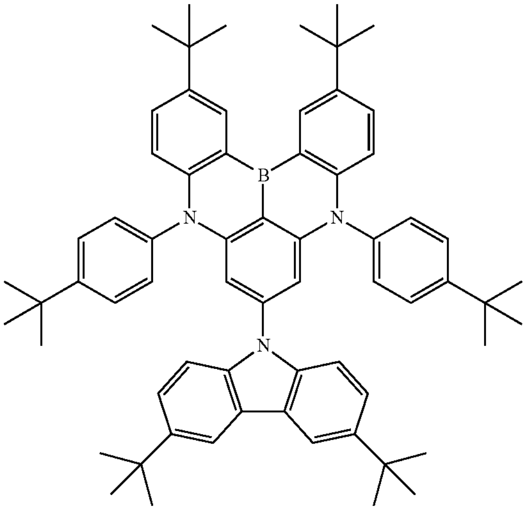
-continued
Compound F-27
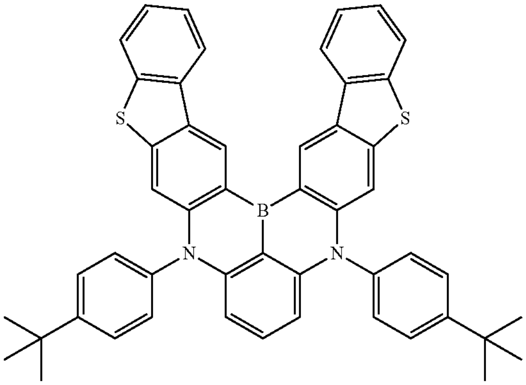
Compound F-28
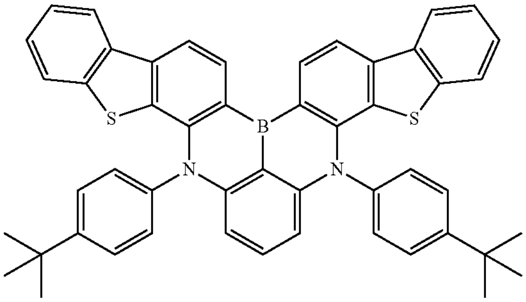
Compound F-29
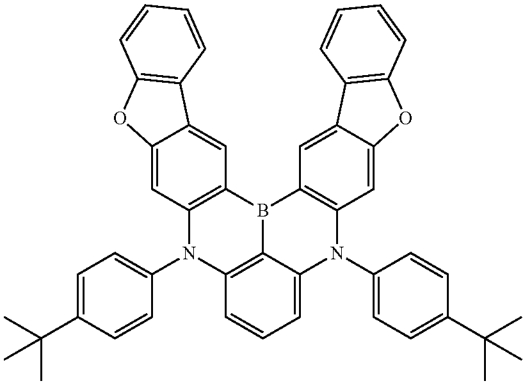
Compound F-30
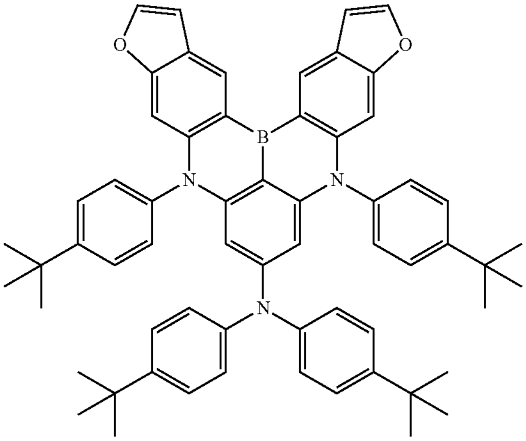

-continued

Compound F-31

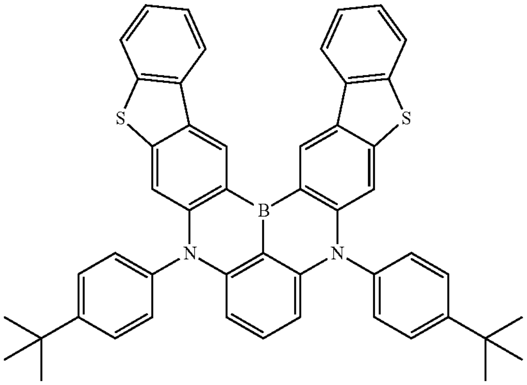

Compound F-32

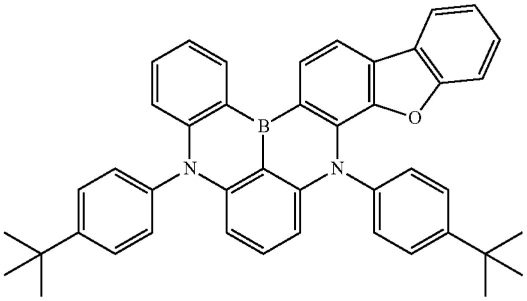

Compound F-33

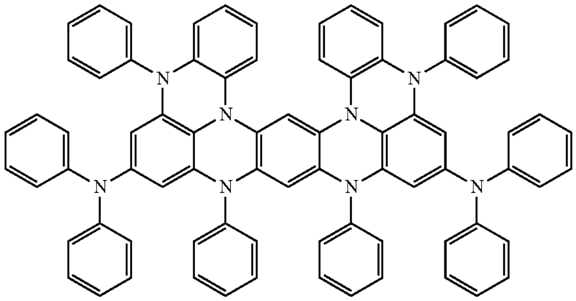

Compound F-34

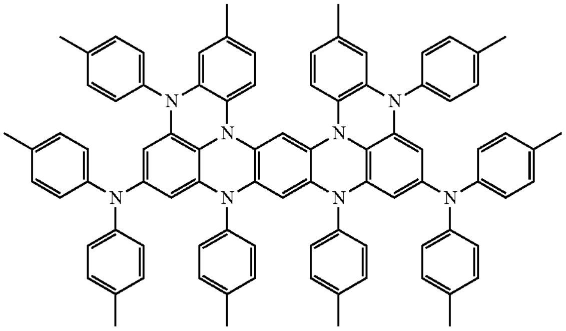

-continued

Compound T-35

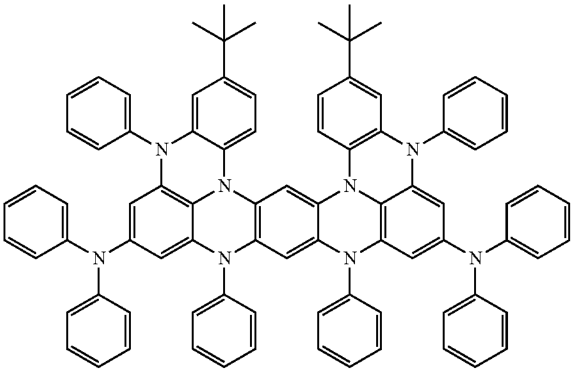

In one embodiment, the first electrode is an anode, the second electrode is a cathode, and the organic material layer may include: a light-emitting layer including one or more of the delayed fluorescence compounds described above; a hole transport region interposed between the first electrode and the light-emitting layer and including at least one of a hole injection layer, a hole transport layer, and an electron blocking layer; and an electron transport region interposed between the light-emitting layer and the second electrode and including at least one of a hole blocking layer, an electron transport layer, and an electron injection layer.

In one embodiment, the first electrode is an anode, the second electrode is a cathode, and the organic material layer may include: a light-emitting layer including one or more of the delayed fluorescence compounds described above and the fluorescence compound represented by Chemical Formula 3; a hole transport region interposed between the first electrode and the light-emitting layer and including at least one of a hole injection layer, a hole transport layer, and an electron blocking layer; and an electron transport region interposed between the light-emitting layer and the second electrode and including at least one of a hole blocking layer, an electron transport layer, and an electron injection layer.

A substrate may be additionally disposed below the first electrode or above the second electrode. As the substrate, a substrate used in a general organic light-emitting device may be used, and a glass substrate or a transparent plastic substrate having excellent mechanical strength, thermal stability, transparency, surface smoothness, ease of handling, and water resistance may be used.

The first electrode may be a reflective electrode, a semi-transmissive electrode, or a transmissive electrode. The first electrode may be formed, for example, on the substrate by depositing or sputtering a material for the first electrode. Materials for the first electrode may be selected from materials having a high work function to facilitate hole injection, and examples of the materials for the first electrode may include indium tin oxide (ITO), indium zinc oxide (IZO), tin oxide ($SnO_2$), zinc oxide (ZnO), magnesium (Mg), aluminum (Al), aluminum-lithium (Al—Li), calcium (Ca), magnesium-indium (Mg—In), magnesium-silver (Mg—Ag), and the like.

The hole injection layer may be formed on the first electrode using various methods such as a vacuum deposition method, a spin coating method, a cast method, and an LB method. When the hole injection layer is formed by the vacuum deposition method, the deposition conditions vary depending on a compound used as the hole injection layer material, the structure and thermal properties of the hole injection layer, and may include, but are not limited to, for example, a deposition temperature of about 100 to about 500° C., a degree of vacuum of about $10^{-8}$ to about $10^{-3}$ torr, and a deposition rate of about 0.01 to about 100 Å/sec.

In the case of forming the hole injection layer by the spin coating method, coating conditions vary depending on a compound used as the hole injection layer material, the structure and thermal properties of the hole injection layer, and may include, but are not limited to, for example, a coating speed of about 2,000 rpm to about 5,000 rpm, and a heat treatment temperature of about 80° C. to 200° C. for solvent removal after coating.

For conditions for forming the hole transport layer and the electron blocking layer, reference may be made to conditions for forming the hole injection layer.

Each layer may have a thickness of about 100 Å to about 10,000 Å, for example, about 100 Å to about 1,000 Å.

When the light-emitting layer includes a host and a delayed fluorescence dopant, an amount of the dopant may be a range of about 0.01 to about 45 parts by weight based on about 100 parts by weight of the host, but is not limited thereto.

In addition, when the light-emitting layer has hyperfluorescence luminescence properties, the delayed fluorescent host and the fluorescent dopant may be included in 0.01 to 45 parts by weight based on 100 parts by weight of a delayed fluorescent host, but are not limited thereto.

Hereinafter, examples of the present specification will be described in more detail. However, the following experimental results describe only representative experimental results among the examples, and the scope and content of the present invention may not be construed as reduced or limited by the examples. Each effect of the various embodiments of the present invention not explicitly presented below will be specifically described in the corresponding section.

Example 1: Synthesis of Compound 1

A mixture of 2,5-dibromo-1,3-difluorobenzene (20.0 g, 36.8 mmol), phenol (33.2 g, 110.4 mmol), and $K_2CO_3$ (30.6 g, 110.4 mmol) in N-methylpyrrolidone (90 ml) was stirred at 170° C. for 20 h. The reaction mixture was diluted with toluene, extracted with water, and an organic layer was dried over anhydrous magnesium sulfate, filtered, and concentrated to obtain an intermediate A-1 (31.4 g).

To a solution of the intermediate A-1 (4.0 g, 15.0 mmol) in m-xylene, n-BuLi (1.6 M, 5.2 ml, 16.5 mmol) was slowly added at 0° C. After the mixture was stirred at room temperature for 1 h, $BBr_3$ (0.9 ml, 18.0 mmol) was slowly added at 0° C. After 20 minutes, the mixture was stirred at room temperature for 30 min and stirred at 40° C. for 30 min. i-$Pr_2$Net (2.6 ml, 30.0 mmol) was slowly added at 0° C., and stirred for 30 min at room temperature after 30 min. After stirring at 120° C. for 17 h, the mixture was cooled to room temperature, filtered through Florisil, and concentrated. A residue was purified by column chromatography to obtain DBA-Br (0.5 g).

A synthetic process of the DBA-Br is briefly summarized in Scheme 1 below.

[Scheme 1]

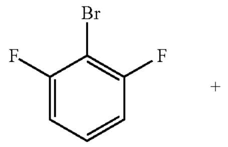

-continued

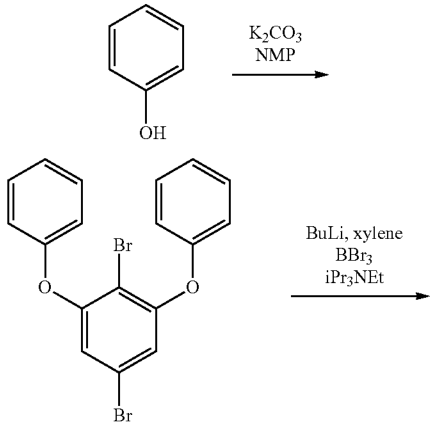

A-1

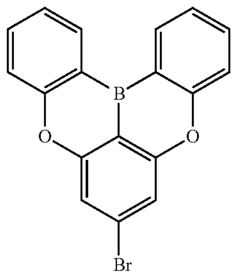

DBA-Br

After dissolving 2-bromo-1,3-dimethoxybenzene (6 g, 1 eq) in acetonitrile (ACN; 50 ml) at room temperature, N-bromosuccinimide (NBS; 6.2 g) dissolved in acetonitrile (10 ml) was added and stirred at room temperature for 12 h. A reaction mixture was extracted with dichloromethane and water, and an organic layer was dried over anhydrous magnesium sulfate, filtered, and concentrated to obtain an intermediate 1-1 (9.9 g) as a yellow oil.

A mixture of the intermediate 1-1 (9.9 g, 1 eq) and 2-fluorophenylboric acid (13.99 g, 3 eq), $Na_2CO_3$ (10.57 g, 3 eq), toluene (40 ml), 1,4-dioxane (40 ml) and water (20 ml) was purged with argon gas and $Pd(PPh_3)_4$ (1.94 g, 0.05 eq) was added. The reaction mixture was refluxed at 95° C. for 15 h. The reaction mixture was extracted with toluene and water, dried over anhydrous magnesium sulfate, filtered, and concentrated to obtain an intermediate 1-2 (5 g), which was used in the next reaction without further purification.

A synthetic process of the intermediate 1-2 is briefly summarized in Scheme 2 below.

[Scheme 2]

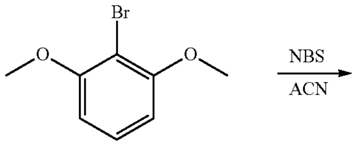

-continued

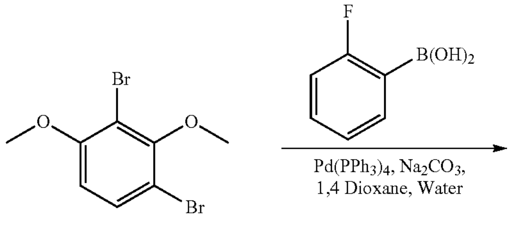

1-1

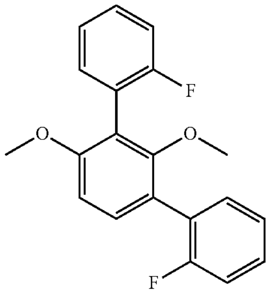

1-2

-continued

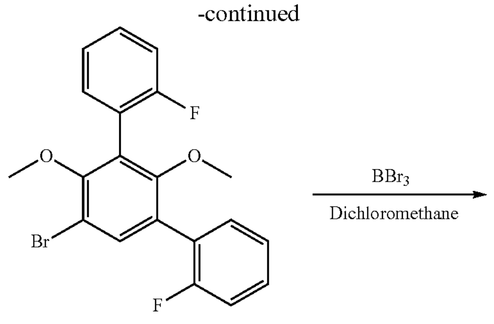

1-3

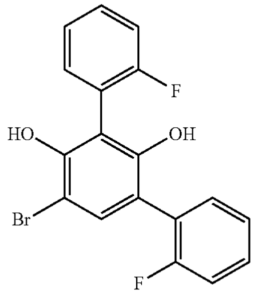

1-4

To a solution of an intermediate 1-2 (8 g, 1 eq) in DMF (40 ml), NBS (4.16 g, 0.95 eq) was added and stirred at 50° C. for additional 8 h. The reaction mixture was extracted with toluene and water, dried over anhydrous magnesium sulfate, filtered, and concentrated to obtain an intermediate 1-3 (10 g), which was used in the next reaction without further purification.

After dissolving the intermediate 1-3 (12 g, 1 eq) in dichloromethane (180 ml), BBr3 (7.5 ml, 2.5 eq) was added dropwise over 10 min at −78° C., the temperature was raised to room temperature, and then stirred for 5 h. After cooling to 0° C., distilled water (120 ml) was slowly added. After 30 min, the mixture was extracted with dichloromethane and water, dried over anhydrous magnesium sulfate, filtered, and concentrated to obtain an intermediate 1-4 (10 g), which was used in the next reaction without further purification.

A synthetic process of the intermediate 1-4 is briefly summarized in Scheme 3 below.

[Scheme 3]

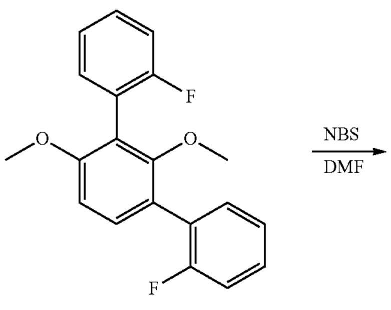

1-2

A mixture of the intermediate 1-4 (10 g, 1 eq) and $K_2CO_3$ (10.96 g, 3 eq) in N-methylpyrrolidone (NMP; 120 ml) was refluxed at 150° C. for 17 h. After cooling the reaction mixture to room temperature, it was added to an ammonium chloride solution, filtered, and then washed with water. The obtained solid was extracted with dichloromethane and water, dried over anhydrous magnesium sulfate, filtered, and concentrated. A residue was purified by column chromatography to obtain an intermediate 1-5 (1.2 g).

A mixture of the intermediate 1-5 (1 g, 1 eq), 1,5-dimethyl-3-(2-nitrophenyl)-2,4-dioxa-3-borabicyclo[3.1.0]hexane (1 g, 1.3 eq), and $K_2CO_3$ (0.82 g, 2 eq) in toluene (50 ml), 1,4-dioxane (50 ml) and water (20 ml) was purged with argon gas, and $Pd(PPh_3)_4$ (0.16 g, 0.05 eq) was added. The reaction mixture was refluxed at 95° C. for 15 h. The mixture was extracted with dichloromethane and water, dried over anhydrous magnesium sulfate, filtered, and concentrated to obtain an intermediate 1-6 (0.4 g).

A synthetic process of the intermediate 1-6 is briefly summarized in Scheme 4 below.

[Scheme 4]

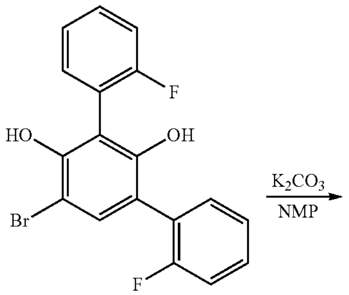

1-4

-continued

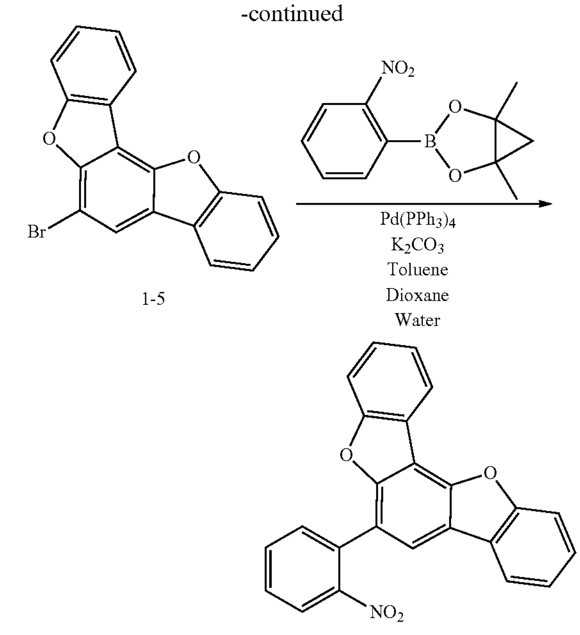

1-5

1-6

A mixture of the intermediate 1-6 (0.4 g, 1.0 eq) and triphenylphosphine (0.56 g, 2.0 eq) in o-dichlorobenzene (20 ml) was stirred at 190° C. for 36 h. The mixture was extracted with dichloromethane and water, dried over anhydrous magnesium sulfate, filtered, and concentrated. A residue was purified by column chromatography to obtain an intermediate 1-7 (0.21 g).

A synthetic process of the intermediate 1-7 is briefly summarized in Scheme 5 below.

[Scheme 5]

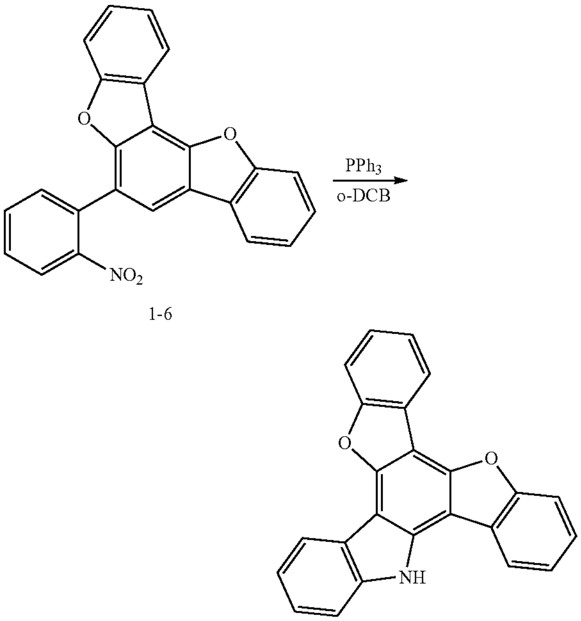

1-6

1-7

A mixture of 7-bromo-5,9-dioxa-13b-boranaphtho[3,2,1-de]anthracene (DBA-Br; 0.11 g, 1.1 eq), the intermediate 1-7, tri-tert-butyl mixture of phosphonium tetrafluoroborate (t-Bu3P·HBF4; 7 mg, 0.08 eq), and sodium tert-butoxide (NaOtBu, 0.06 g, 2 eq) in toluene was purged with argon gas, $Pd_2$ $(dba)_3$ (5 mg, 0.02 eq) was added, and then the mixture was refluxed at 120° C. for 5 h. The mixture was extracted with dichloromethane and water, dried over anhydrous magnesium sulfate, filtered, and concentrated. A residue was recrystallized with dichloromethane and normal hexane to obtain Compound 1 (0.1 g).

A synthetic process of the Compound 1 is briefly summarized in Scheme 6 below.

[Scheme 6]

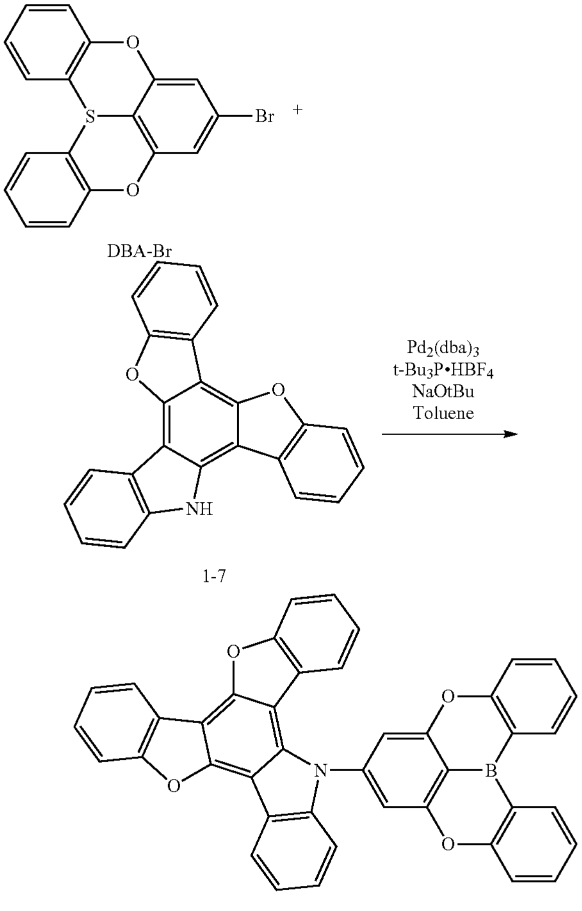

DBA-Br 1-7

Compound 1

Example 2: Synthesis of Compound 4

A mixture of 2-bromodibenzo[b,d]furan (5 g, 1 eq), 4,4,4',4',5,5',5'-octamethyl-2,2'-bi (1, 3,2-dioxaborane) (8 g, 1.5 eq), Pd(dppf)$Cl_2$ (0.45 g, 0.03 eq), and 1,4 KOAc (6 g, 3 eq) in anhydrous 1,4-dioxane (100 ml) was purged with argon, and then refluxed at 100° C. for 16 h. After cooling to room temperature, it was filtered through silica gel. A filtered material was extracted with distilled water and dichloromethane. The obtained organic layer was dried over anhydrous magnesium sulfate, filtered, and concentrated to obtain an intermediate 2-1 (6 g).

A mixture of the intermediate 2-1 (5 g, 1 eq), 1-bromo-2-nitrobenzene (4.4 g, 1.29 eq), and $K_2CO_3$ (13.82 g, 2 M) in toluene (100 ml), ethanol (30 ml), and water (50 ml) was purged with argon gas, $Pd(PPh_3)_4$ (0.98 g, 0.05 eq) was added, and then the mixture was refluxed at 100° C. for 4 h. The mixture was extracted with dichloromethane and water, dried over anhydrous magnesium sulfate, filtered, and concentrated. A residue was purified by silica gel column chromatography to obtain an intermediate 2-2 (4.7 g).

A synthetic process of the intermediate 2-2 is briefly summarized in Scheme 7 below.

[Scheme 7]

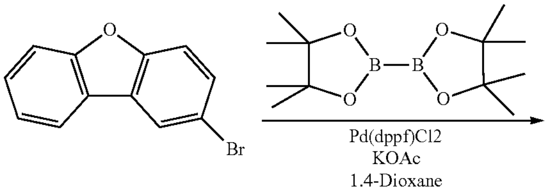

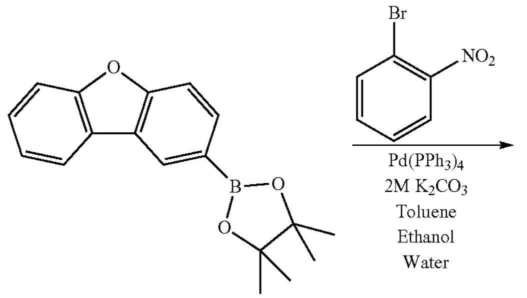

2-1

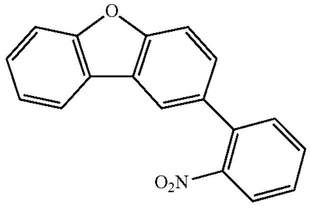

2-2

A mixture of the intermediate 2-2 (4.7 g, 1 eq) and triphenylphosphine (11 g, 2.5 eq) in o-dichlorobenzene (80 ml) was purged with argon gas and refluxed at 188° C. for 48 h. The mixture was extracted with dichloromethane and water, dried over anhydrous magnesium sulfate, filtered, and concentrated. A residue was recrystallized with dichloromethane and hexene to obtain an intermediate 2-3 (5.8 g).

A mixture of the intermediate 2-3 (1.5 g, 1 eq), iodobenzene (1.5 g, 0.26 ml, 1.2 eq), NaOtBu (1.11 g, 2 eq), and 50% P (t-Bu) 3 (0.24 ml, 0.08 eq) in toluene (40 ml) was purged with argon gas, $Pd_2(dba)_3$ (0.105 g, 0.02 eq) was added, and then the mixture was refluxed at 115° C. for 12 h. The mixture was extracted with dichloromethane and water, dried over anhydrous magnesium sulfate, filtered, and concentrated. A residue was purified by silica gel column chromatography to obtain an intermediate 2-4 (0.9 g).

A synthetic process of the intermediate 2-4 is briefly summarized in Scheme 8 below.

[Scheme 8]

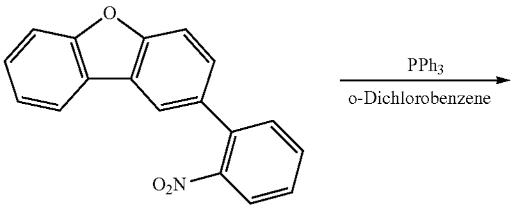

2-2

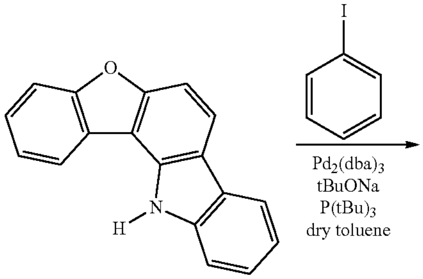

2-3

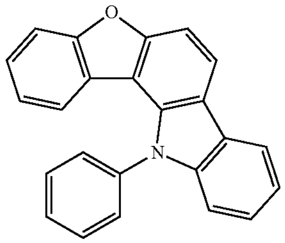

2-4

A solution of the intermediate 2-4 (0.95 g, 1 eq) in anhydrous DMF (30 ml) was purged with argon gas, and NBS (0.5 g, 1 eq) dissolved in anhydrous DMF (10 ml) was slowly added dropwise at 0° C. The temperature was slowly raised to room temperature, stirred for 12 h, and a formed precipitate was filtered. A obtained solid was recrystallized with THF and ethanol to obtain an intermediate 2-5 (0.6 g).

A mixture of the intermediate 2-5 (0.6 g, 1 eq), (2-nitrophenyl) boronic acid (0.31 g, 1.3 eq), and $K_2CO_3$ (0.4 g, 2 eq) in toluene (15 ml), ethanol (5 ml), and water (10 ml) was purged with argon gas, and $Pd(PPh_3)_4$ (0.14 g, 0.05 eq) was added and then the mixture was refluxed at 100° C. for 24 h. The mixture was extracted with dichloromethane and water, dried over anhydrous magnesium sulfate, filtered, and concentrated. A residue was purified by silica gel column chromatography to obtain an intermediate 2-6 (0.32 g).

A synthetic process of the intermediate 2-6 is briefly summarized in Scheme 9 below.

[Scheme 9]

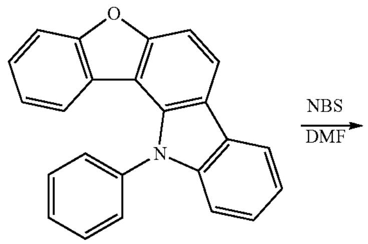

2-4

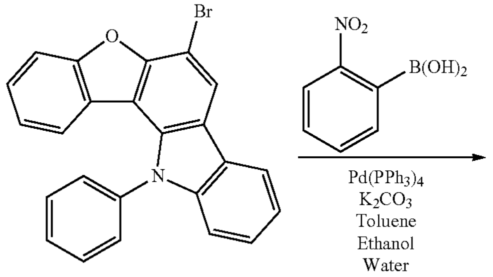

2-5

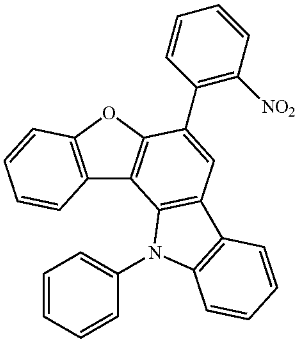

2-6

A mixture of the intermediate 2-6 (0.25 g, 1 eq) and triphenylphosphine (0.36 g, 2.5 eq) in o-dichlorobenzene (10 ml) was purged with argon gas and refluxed at 193° C. for 4 d. The mixture was extracted with dichloromethane and water, dried over anhydrous magnesium sulfate, filtered, and concentrated. A residue was purified by silica gel column chromatography and then recrystallized with hexane and dichloromethane to obtain an intermediate 2-7 (0.14 g).

A synthetic process of the intermediate 2-7 is briefly summarized in Scheme 10 below.

[Scheme 10]

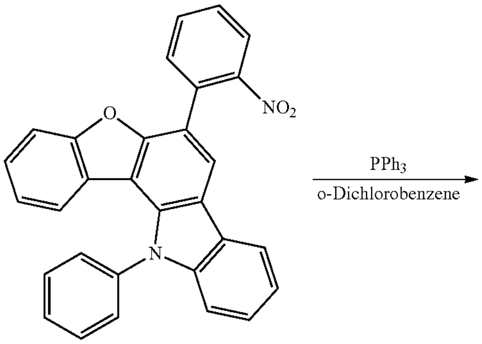

2-6

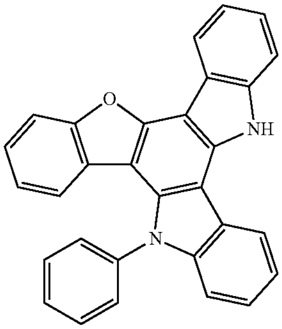

2-7

A mixture of 7-bromo-5,9-dioxa-13b-boranaphtho[3,2,1-de]anthracene (DBA-Br, 0.1 g, 1.1 eq), the intermediate 2-7 (0.12 g, 1 eq), t-$Bu_3P{\cdot}HBF_4$ (6 mg, 0.08 eq), and NaOtBU (0.05 g, 2 eq) in toluene was purged with argon gas, $Pd_2(dba)_3$ (6 mg, 0.02 eq) was added, and then the mixture was refluxed at 115° C. for 10 h. The mixture was extracted with dichloromethane and water, dried over anhydrous magnesium sulfate, filtered, and concentrated. A residue was recrystallized with hexane and dichloromethane to obtain a Compound 4 (0.1 g).

A synthetic process of the Compound 4 is briefly summarized in Scheme 11 below.

[Scheme 11]

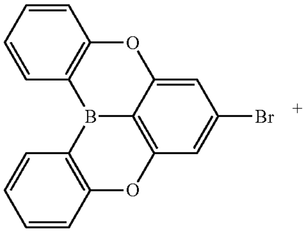

DBA-Br

-continued

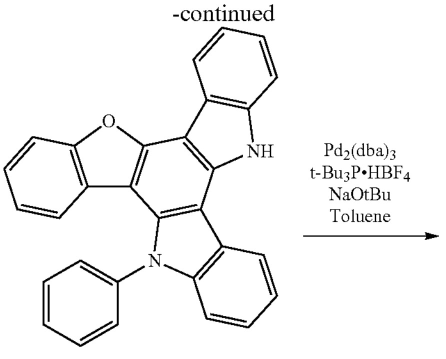

2-7

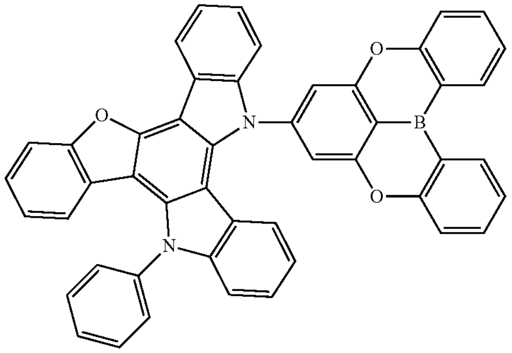

Compoumd 4

Example 3: Synthesis of Compound 5

A mixture of 2-bromodibenzo[b,d]thiopine (5 g, 1 eq), 4,4,4',4',5,5',5'-octamethyl-2,2'-bi (1,3,2-dioxaborane) (7.2 g, 1.5 eq), Pd(dppf)$Cl_2$ (0.42 g, 0.03 eq), and KOAc (5.6 g, 3 eq) in anhydrous 1,4-dioxane (90 ml) was purged with argon gas and then refluxed at 100° C. for 12 h. After cooling to room temperature, the mixture was filtered through silica gel, and a filtered material was extracted with distilled water and dichloromethane. The obtained organic layer was dried over anhydrous magnesium sulfate, filtered, and concentrated to obtain an intermediate 3-1 (8.4 g).

A mixture of the intermediate 3-1 (8.4 g, 1 eq), 1-bromo-2-nitrobenzene (7.1 g, 1.29 eq), and $K_2CO_3$ (13.82 g, 2 M) in toluene (100 ml), ethanol (30 ml), and water (50 ml) was purged with argon gas, $Pd(PPh_3)_4$ (1.56 g, 0.05 eq) was added, and then the mixture was refluxed at 100° C. for 12 h. The mixture was extracted with dichloromethane and water, dried over anhydrous magnesium sulfate, filtered, and concentrated. A residue was purified by silica gel column chromatography to obtain an intermediate 3-2 (5.6 g).

A synthetic process of the intermediate 3-2 is briefly summarized in Scheme 12 below.

[Scheme 12]

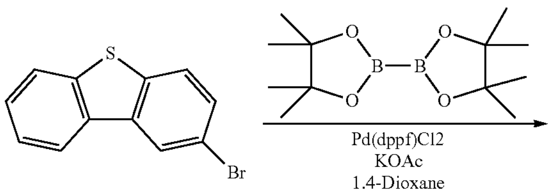

1

-continued

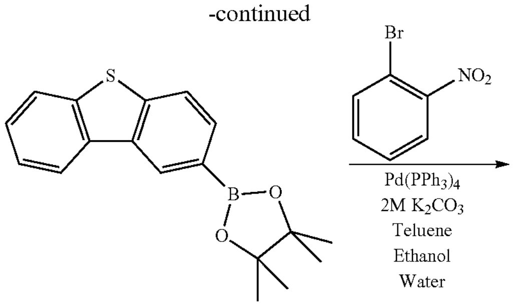

3-1

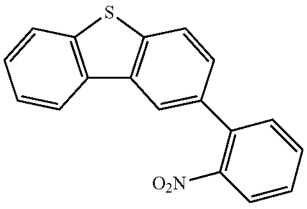

3-2

A mixture of the intermediate 3-2 (4 g, 1 eq) and triphenylphosphine (8.6 g, 2.5 eq) in o-dichlorobenzene (80 ml) was purged with argon gas and refluxed at 188° C. for 48 h. The mixture was extracted with dichloromethane and water, dried over anhydrous magnesium sulfate, filtered, and concentrated. A residue was purified by silica gel column chromatography to obtain an intermediate 3-3 (3.2 g).

A mixture of the intermediate 3-3 (3 g, 1 eq), iodobenzene (2.69 g, 01.47 ml, 1.2 eq), NaOtBu (2.1 g, 2 eq), and 50% P (t-Bu) 3 (0.44 ml, 0.08 eq) in toluene (100 ml) was purged with argon gas, $Pd_2(dba)_3$ (0.2 g, 0.02 eq) was added, and then the mixture was refluxed at 115° C. for 6 h. The mixture was extracted with dichloromethane and water, dried over anhydrous magnesium sulfate, filtered, and concentrated. A residue was purified by silica gel column chromatography to obtain an intermediate 3-4 (2.83 g).

A synthetic process of the intermediate 3-4 is briefly summarized in Scheme 13 below.

[Scheme 13]

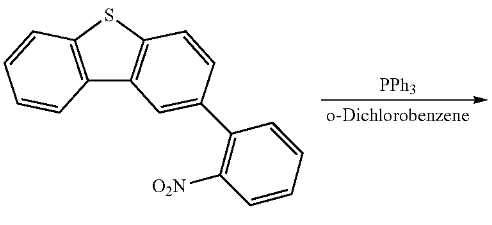

3-2

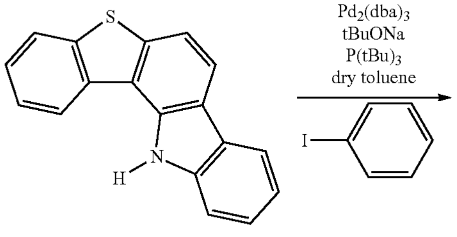

3-3

-continued

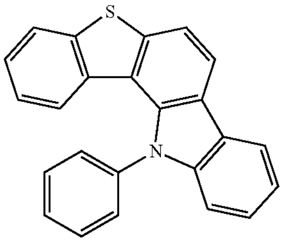

3-4

A solution of the intermediate 3-4 (2.8 g, 1 eq) in anhydrous DMF (60 ml) was purged with argon gas, and NBS (1.66 g, 1.15 eq) dissolved in anhydrous DMF (10 ml) was slowly added dropwise at 0° C. After slowly raising the temperature to room temperature, the mixture was stirred for 6 h and a formed precipitate was filtered to obtain an intermediate 3-5 (2.3 g).

A mixture of the intermediate 3-5 (1 g, 1 eq), 4,4,4',4',5,5',5'-octamethyl-2,2'-bi (1,3,2-dioxaborane) (0.88 g, 1.5 eq), Pd(dppf)$Cl_2$ (0.05 g, 0.03 eq), and KOAc (0.68 g, 3 eq) in anhydrous 1,4-dioxane (25 ml) was purged with argon gas and then refluxed at 100° C. for 12 h. After cooling to room temperature, it was filtered through silica gel. Filtered materials were extracted with distilled water and dichloromethane. The obtained organic layer was dried over anhydrous magnesium sulfate, filtered, and concentrated to obtain an intermediate 3-6 (0.68 g).

A synthetic process of the intermediate 3-6 is briefly summarized in Scheme 14 below.

[Scheme 14]

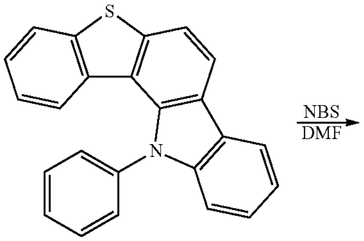

3-4

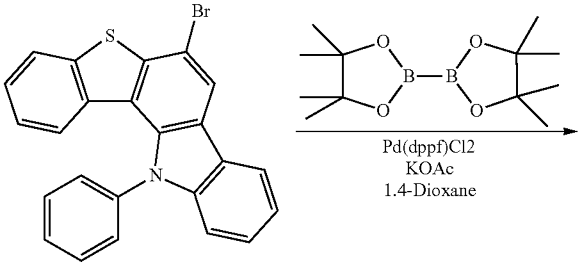

3-5

-continued

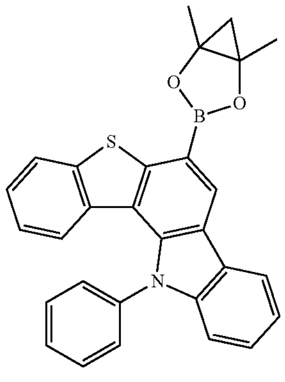

3-6

A mixture of the intermediate 3-6 (0.6 g, 1 eq), 1-bromo-2-nitrobenzene (0.31 g, 1.3 eq), and $K_2CO_3$ (0.4 g, 2 eq) in toluene (15 ml), ethanol (5 ml), and water (10 ml) was purged with argon gas, $Pd(PPh_3)_4$ (0.14 g, 0.05 eq) was added, and then the mixture was refluxed at 100° C. for 12 h. The mixture was extracted with dichloromethane and water, dried over anhydrous magnesium sulfate, filtered, and concentrated. A residue was purified by silica gel column chromatography to obtain an intermediate 3-7 (0.55 g).

A mixture of the intermediate 3-7 (0.5 g, 1 eq) and triphenylphosphine (0.72 g, 2.5 eq) in o-dichlorobenzene (10 ml) was purged with argon gas and refluxed at 193° C. for 24 h. The mixture was extracted with dichloromethane and water, dried over anhydrous magnesium sulfate, filtered, and concentrated. A residue was purified by silica gel column chromatography to obtain an intermediate 3-8 (0.26 g).

A synthetic process of the intermediate 3-8 is briefly summarized in Scheme 15 below.

[Scheme 15]

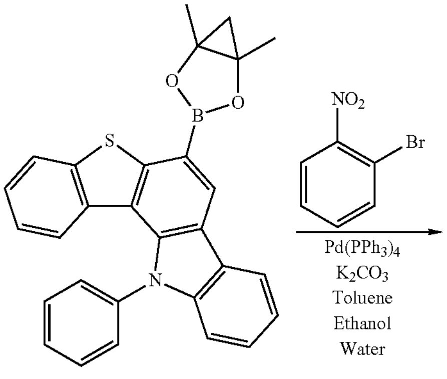

3-6

-continued

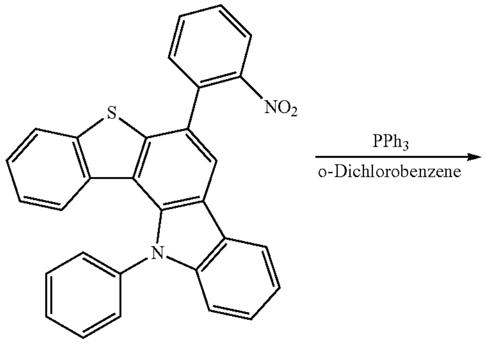

3-7

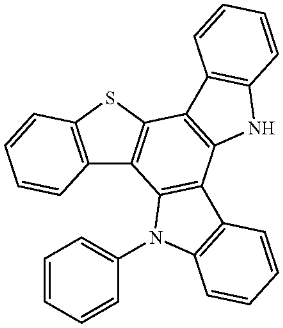

3-8

A mixture of 7-bromo-5,9-dioxa-13b-boranaphtho[3,2,1-de]anthracene (DBA-Br, 0.2 g, 1 eq), the intermediate 3-8 (0.27 g, 1.1 eq), t-$Bu_3P{\cdot}HBF_4$ (10 mg, 0.08 eq), and NaOtBU (0.11 g, 2 eq) in toluene was purged with argon gas, $Pd_2(dba)_3$ (10 mg, 0.02 eq) was added, and then the mixture was refluxed at 112° C. for 10 h. The mixture was extracted with dichloromethane and water, dried over anhydrous magnesium sulfate, filtered, and concentrated. A residue was purified by silica gel column chromatography to obtain a Compound 5 (0.1 g).

A synthetic process of the Compound 5 is briefly summarized in Scheme 16 below.

[Scheme 16]

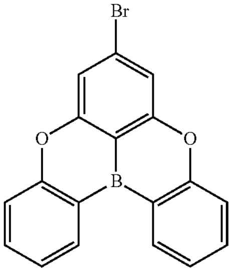

+

DBA-Br

-continued

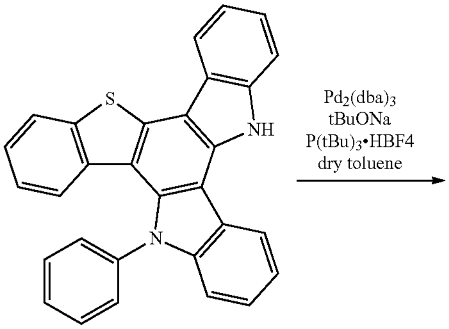

3-8

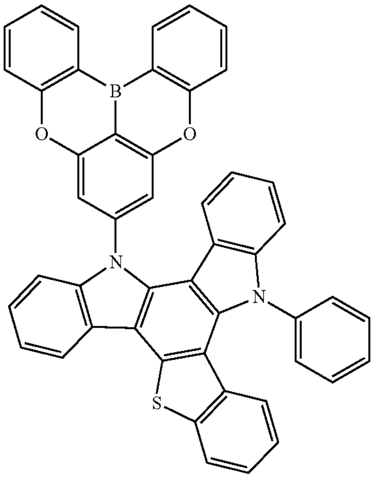

Compound 5

Example 4: Synthesis of Compound 105

An intermediate TDBS-Br was obtained in the same manner as in Example 1. A synthetic process of the intermediate TDBS-Br is briefly summarized in Scheme 17 below.

[Scheme 17]

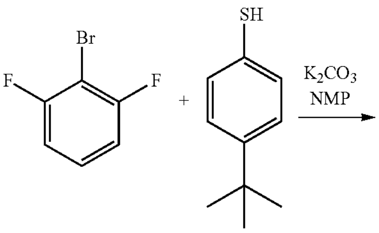

-continued

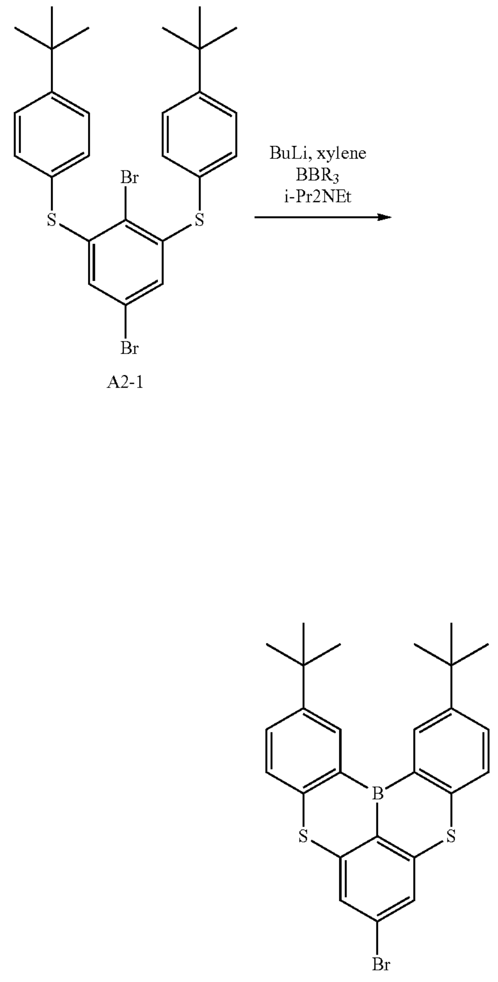

A2-1

TDBS-Br

Compound 105 was obtained in the same manner as in Example 1. A synthetic process of the Compound 105 is briefly summarized in Scheme 18 below.

[Scheme 18]

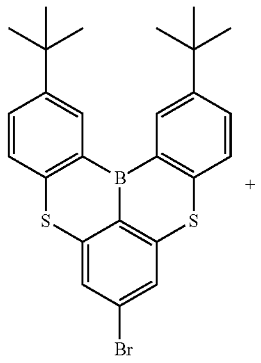

TDBS-Br

-continued

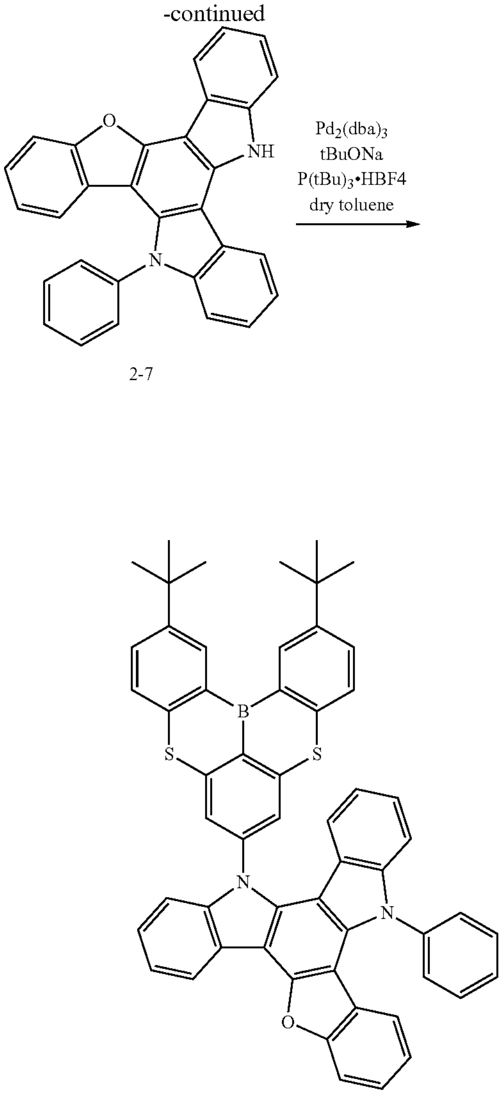

2-7

Compound 105

Experimental Example

Physical properties of Compound 1, Compound 4, Compound 5 and Compound 105 prepared according to Examples 1 to 4 were evaluated. The measured physical properties are a UV-Vis absorption spectrum and a photoluminescence spectrum at room temperature, and the UV-Vis absorption spectrum was measured by diluting the mixture to a concentration of $10x^{-4}$ M in a toluene solvent using JASCOV-750. A photoluminescence spectrum at room temperature was measured using JASCO-FP 8500 equipment under the same conditions. An absolute photoluminescence quantum yield (PLQY) value was measured using an integrating sphere built into JASCO-FP 8500 equipment after preparing a thin film by doping DBFPO with 20% by weight of the compound. Time-resolved photoluminescence (TRPL) was measured by diluting to a concentration of $10x^{-4}$ M in a toluene solvent using Hamamatsu C11367 equipment. The measurement results are shown in Table 1 and FIGS. 1 to 4.

TABLE 1

| Classification | Comparative Example 1 | Example 1 | Example 2 | Example 3 | Example 4 |
|---|---|---|---|---|---|
| Compounds | DBA-DI | Compound 1 | Compound 4 | Compound 5 | Compound 105 |
| Maximum luminescence spectrum | 467 nm | 427 nm | 446 nm | 445 nm | 456 nm |
| Triplet energy | 2.93 eV | 2.97 eV | 2.95 eV | 2.84 eV | 2.80 eV |
| Singlet-triplet energy | 0.18 eV | 0.22 eV | 0.18 eV | 0.29 eV | 0.28 eV |
| PLQY | 0.95 | 0.93 | 0.95 | 0.95 | 0.94 |
| Triplet exciton lifetime | 0.8 μs | 3.4 μs | 1.6 μs | 1.2 μs | 1.3 μs |

FIG. 4 is a graph showing the normalized UV-Vis intensity and electroluminescence intensity of Compound 1 of Example 1, Compound 14 of Example 2, and DBA-DI of Comparative Example 1; and it was confirmed that the compounds of Examples, compared to Comparative Example 1, had a wide overlapping area so that energy could be transmitted more effectively, and thus were suitable for a hyperfluorescence OLED.

A ITO glass substrate was cut into a 50 mm×50 mm×0.7 mm size, washed with acetone, isopropyl alcohol, and distilled water for 10 minutes each, irradiated with ultraviolet rays for 30 minutes, exposed to ozone and cleaned, and then the ITO glass substrate was mounted in a vacuum deposition device.

On the ITO glass substrate, HATCN (7 nm)/TAPC (50 nm)/DCDPA (10 nm)/DBFPO (host), and 20% by weight of Compound 1, Compound 4 or Compound 5 (dopant) (25 nm)/DBFPO (5 nm)/TPBi (20 nm)/LiF (1.5 nm)/Al (100 nm) were stacked in this order to prepare an OLED. Measurement results of the OLED are shown in Table 2.

TABLE 2

| Classification | Comparative Example 1 | Example 1 | Example 2 | Example 3 |
|---|---|---|---|---|
| Compounds | DBA-DI | Compound 1 | Compound 4 | Compound 5 |
| Maximum EQE (%) | 28.1 | 25.8 | 27.8 | 27.2 |
| Maximum electroluminescence wavelength (nm) | 489 | 447 | 468 | 465 |
| CIE coordinates | (0.16, 0.39) | (0.15, 0.07) | (0.15, 0.13) | (0.15, 0.15) |

On the ITO glass substrate, HATCN (7 nm)/TAPC (50 nm)/DCDPA (10 nm)/DBFPO (host), and 30% by weight of Compound 1, Compound 4 or Compound 5 (dopant) and 1% by weight of Compound F-27 (25 nm)/DBFPO (5 nm)/TPBi (20 nm)/LiF (1.5 nm)/Al (100 nm) were stacked in this order to prepare a delayed fluorescence light sensitive OLED. Measurement results of the OLED are shown in Table 3 and FIG. 5.

TABLE 3

| Classification | Comparative Example 1 | Example 1 | Example 2 | Example 3 |
|---|---|---|---|---|
| Compounds | DBA-DI | Compound 1 | Compound 4 | Compound 5 |
| Maximum electroluminescence wavelength (nm) | 489 | 458 | 458 | 458 |
| Full width at half maximum (nm) | 69 | 29 | 29 | 30 |
| CIE coordinates | (0.16, 0.36) | (0.14, 0.08) | (0.14, 0.08) | (0.14, 0.09) |

When looking at the electroluminescence spectrum of a delayed fluorescence compound OLED manufactured using Compounds 1, 4 and 5 and Compound F-27 fluorescence dopant, in the case of Comparative Example 1, it was confirmed that since emission wavelength is located at a long wavelength, energy does not transfer well to the fluorescence dopant, and thus, a plurality of delayed fluorescence spectra are emitted. However, in the case of Examples, it was confirmed that the shape of the electroluminescence spectrum of the fluorescence dopant appeared clearly, and this is because most of the exciton energy was well transferred to the fluorescence dopant due to the improved color properties.

The foregoing description of the present invention is for illustrative purposes, and it will be understood by those skilled in the art that embodiments can be easily modified into other specific forms without changing the spirit and essential properties of the invention. Therefore, it should be understood that the embodiments described above are illustrative in all respects and not restrictive. For example, each component described as a single type may be implemented in a distributed form, and likewise components described as distributed may be implemented in a combined form.

The scope of the present invention is indicated by the following claims, and all changes or modifications derived from the meaning and scope of the claims and their equivalents should be construed as being included in the scope of the present invention.

The invention claimed is:

1. A delayed fluorescence compound represented by Chemical Formula 1 below:

[Chemical Formula 1]

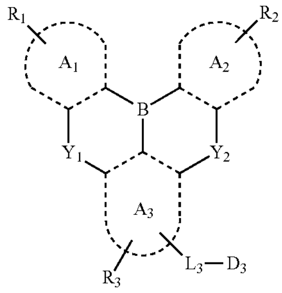

in Chemical Formula 1, $D_3$ is represented by Chemical Formula 2 below,

[Chemical Formula 2]

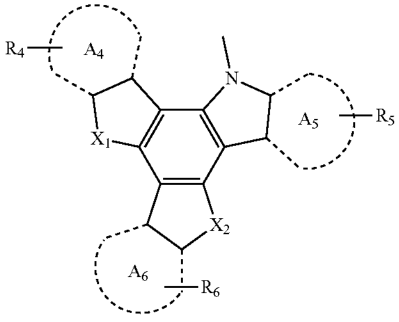

in the above Chemical Formulae, $A_1$ to $A_6$ are each independently a ring structure selected from a substituted or unsubstituted $C_5$-$C_{60}$ carbocyclic group, a substituted or unsubstituted $C_2$-$C_{60}$ heterocyclic group, a $C_6$-$C_{60}$ aryl group, and a $C_5$-$C_{60}$ heteroaryl group, $X_1$ and $X_2$ are each independently O, N—$R_7$, $C(R_8)_2$, or S; at least one of $X_1$ and $X_2$ is not N—$R_7$; $Y_1$ and $Y_2$ are each independently selected from O or S; $L_3$ is a single bond or $C_6$-$C_{60}$ arylene; $R_1$ to $R_6$ are each independently selected from hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted monovalent non-aromatic condensed polycyclic group, and a substituted or unsubstituted monovalent non-aromatic heterocondensed polycyclic group; and $R_7$ and $R_8$ are each independently selected from hydrogen, deuterium, a substituted or unsubstituted $C_1$-$C_{60}$ alkyl group, a substituted or unsubstituted $C_3$-$C_{10}$ cycloalkyl group, a substituted or unsubstituted $C_6$-$C_{60}$ aryl group, and a substituted or unsubstituted $C_6$-$C_{60}$ heteroaryl group.

2. The delayed fluorescence compound of claim 1, wherein the delayed fluorescence compound is any one of compounds represented by the following Chemical Formulas T-1 to T-144:

Compound T-1

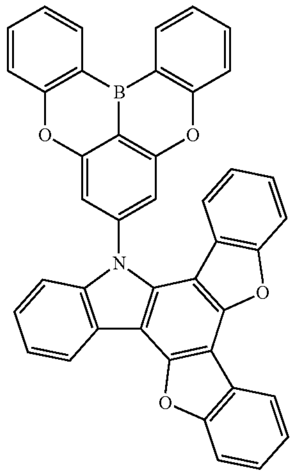

Compound T-2

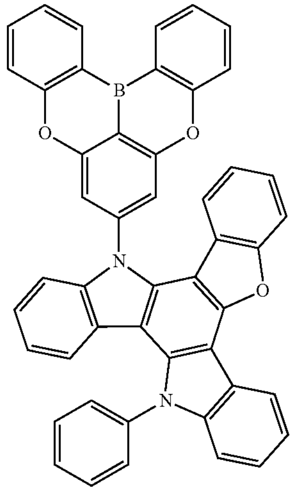

Compound T-3

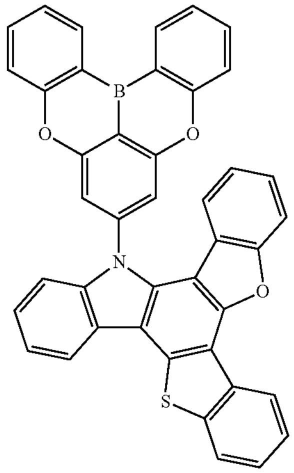

Compound T-4
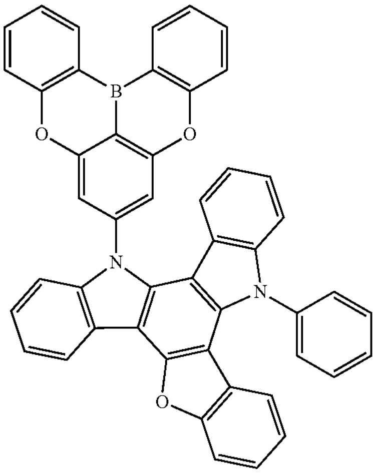
Compound T-5
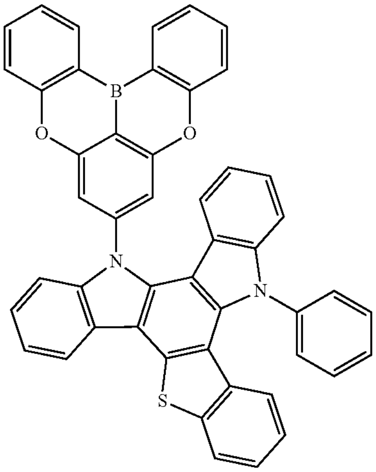
Compound T-6
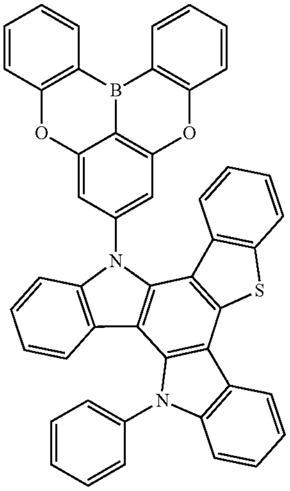
Compound T-7
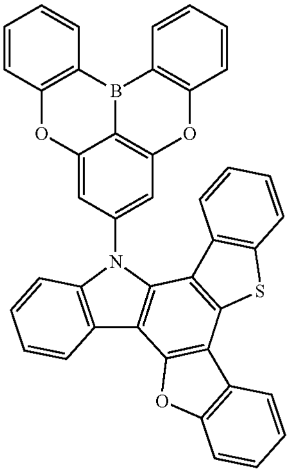
Compound T-8
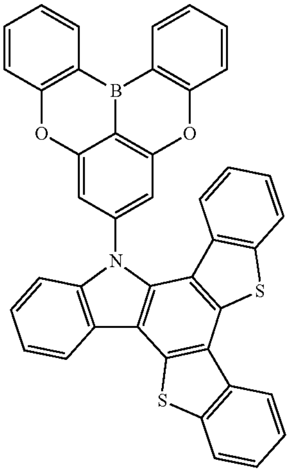
Compound T-9
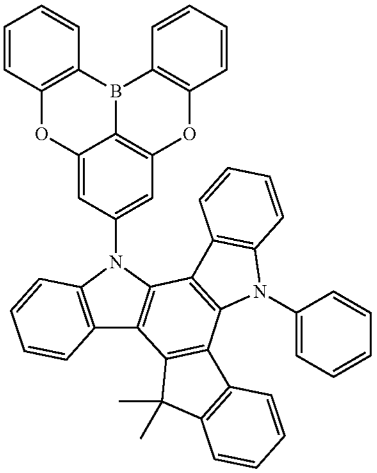

-continued
Compound T-10
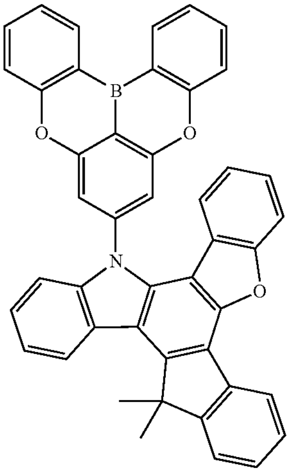
Compound T-11
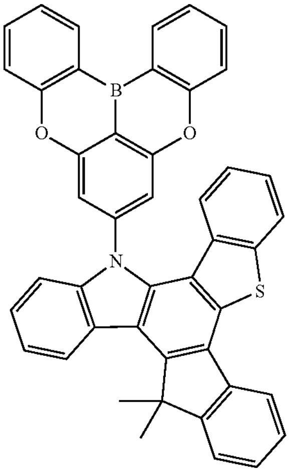
Compound T-12
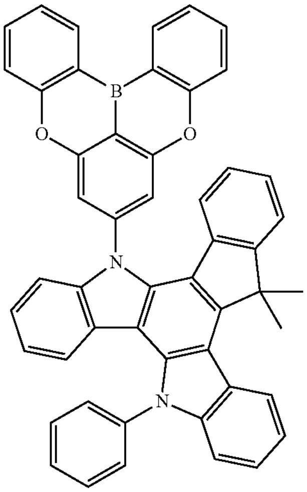
-continued
Compound T-13
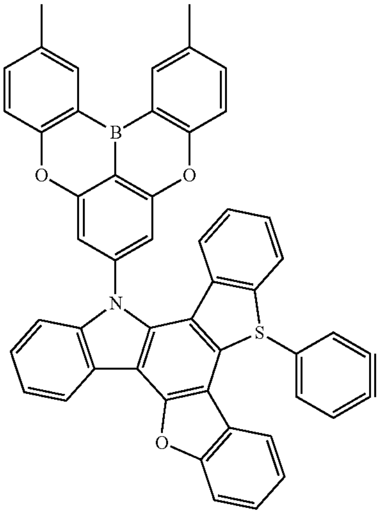
Compound T-14
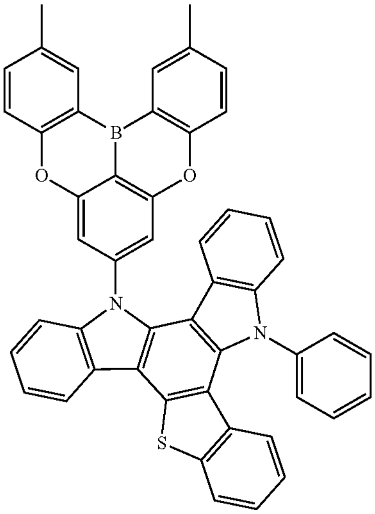
Compound T-15
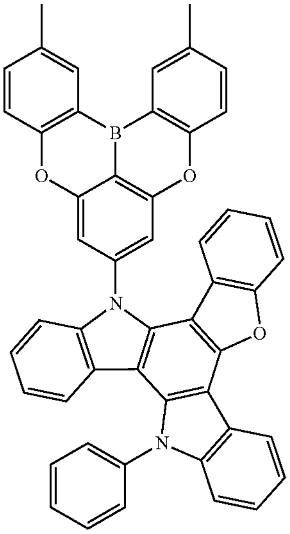

-continued
Compound T-16
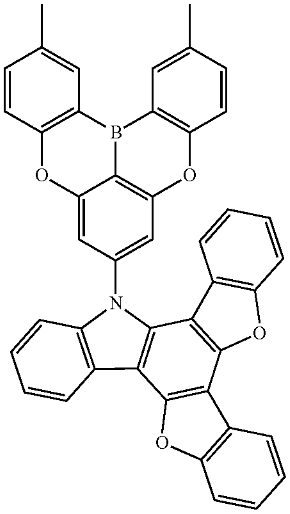
Compound T-17
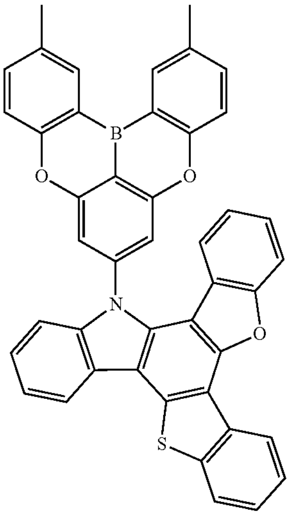
Compound T-18
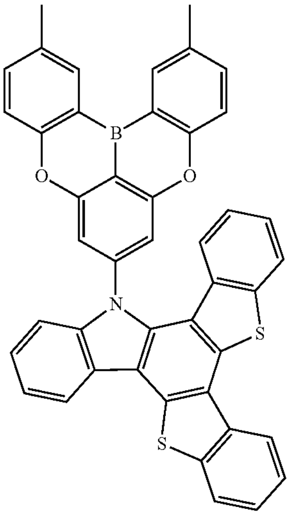
-continued
Compound T-19
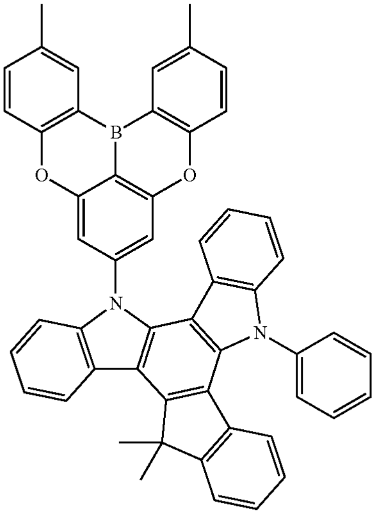
Compound T-20
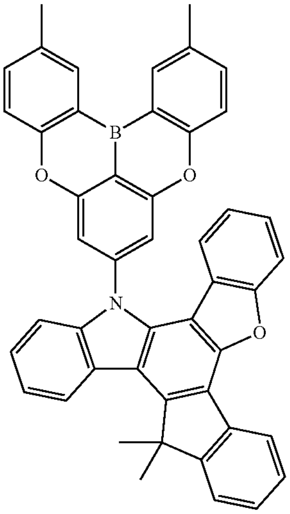
Compound T-21
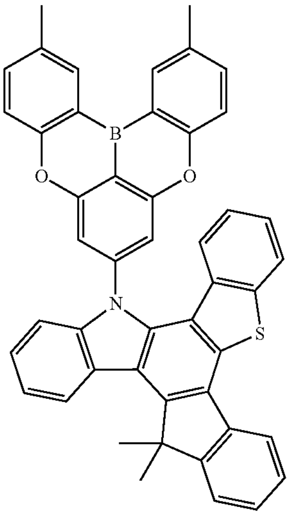

-continued
Compound T-22
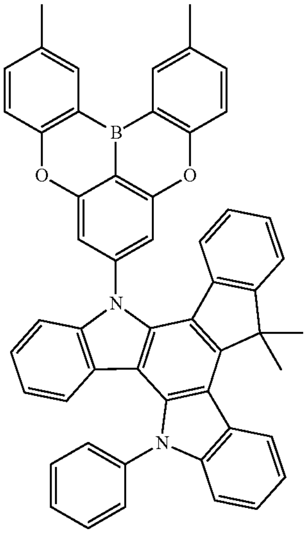
Compound T-23
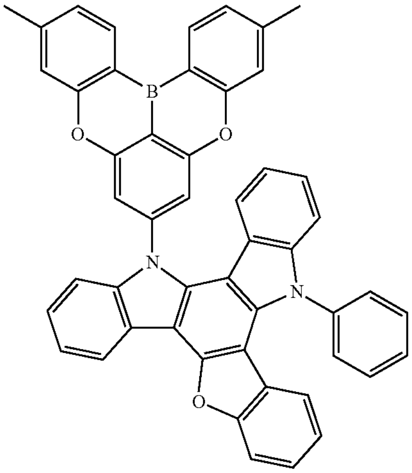
Compound T-24
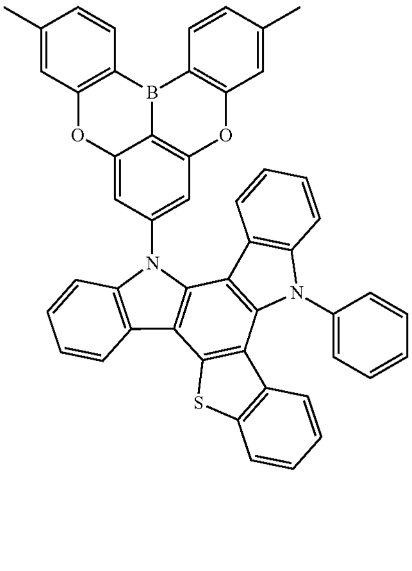
-continued
Compound T-25
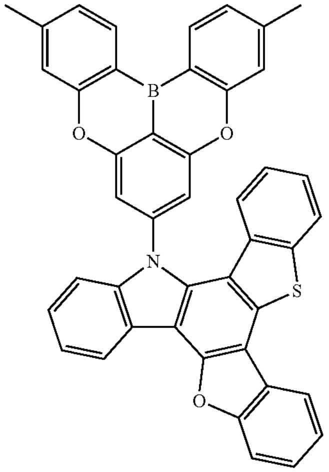
Compound T-26
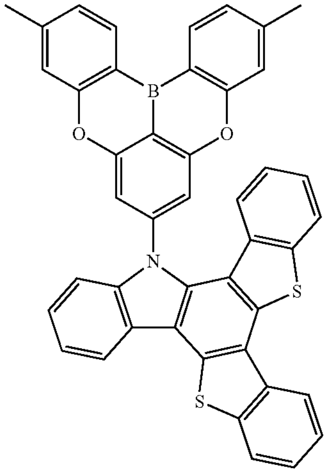
Compound T-27
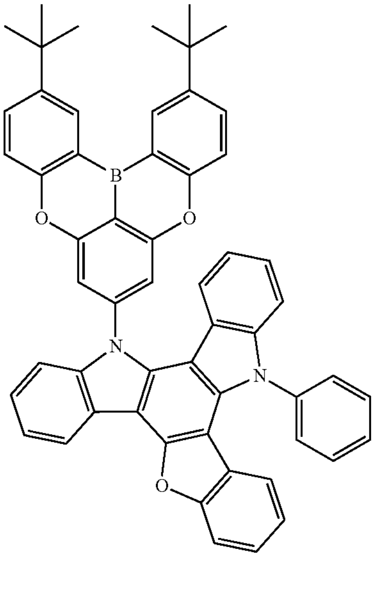

-continued
Compound T-28
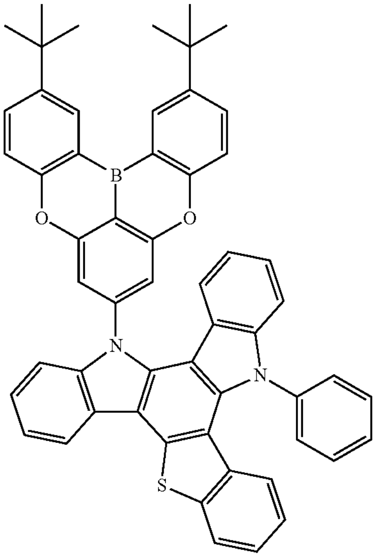
Compound T-29
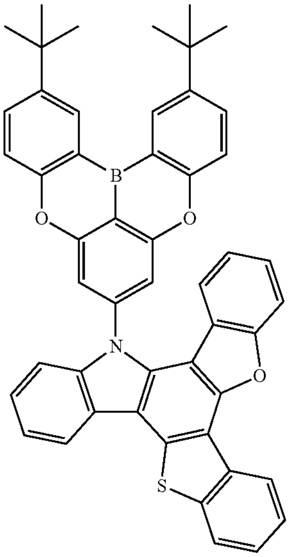
-continued
Compound T-30
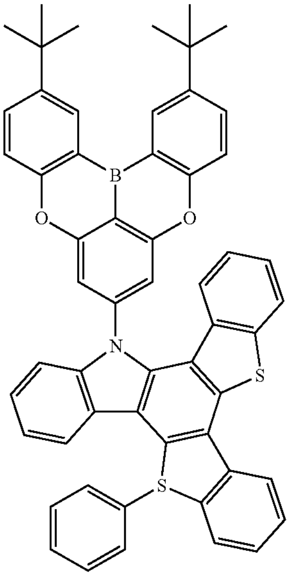
Compound T-31
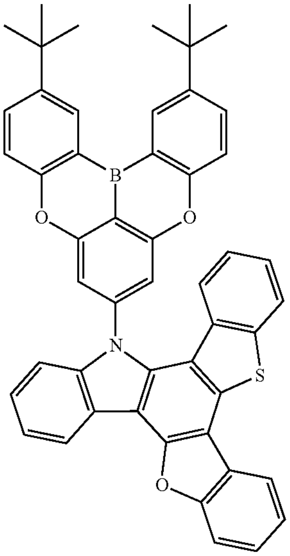

-continued
Compound T-32
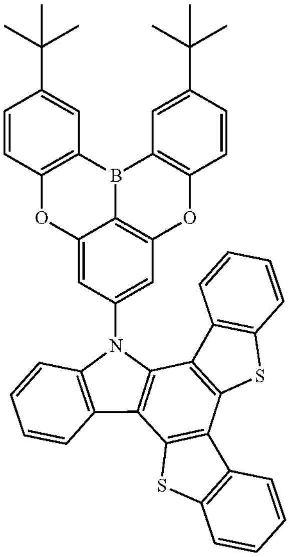
Compound T-33
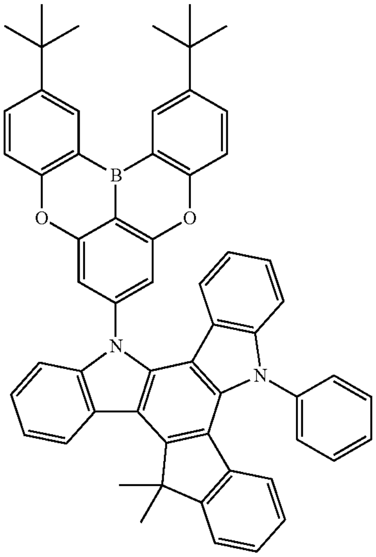
-continued
Compound T-34
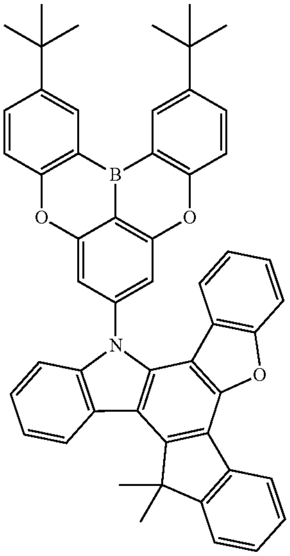
Compound T-35
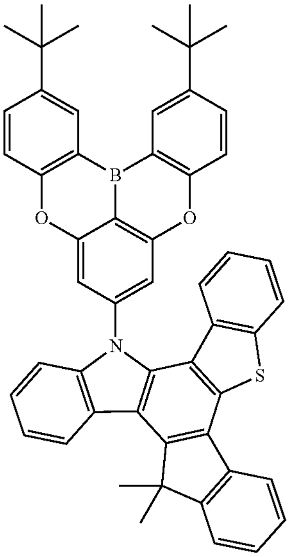

-continued
Compound T-36
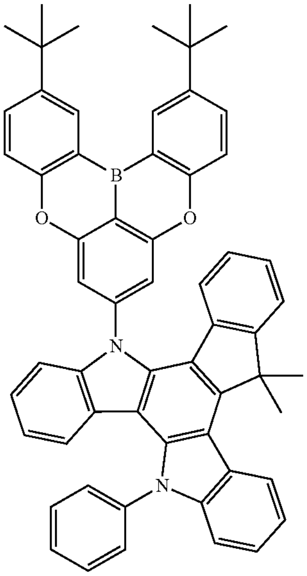
Compound T-37
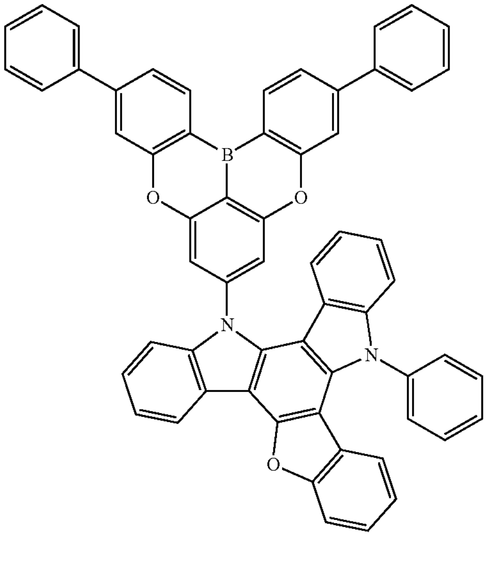
-continued
Compound T-38
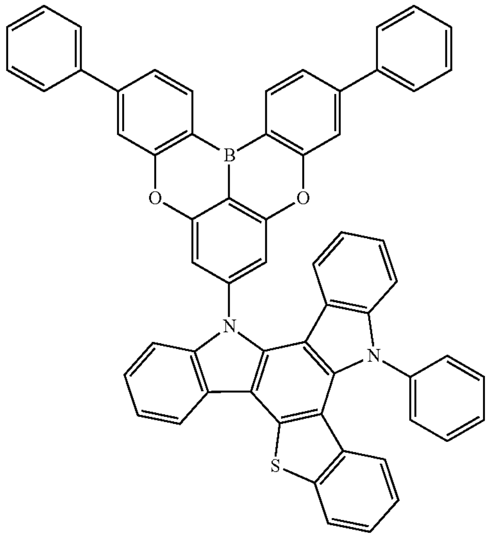
Compound T-39
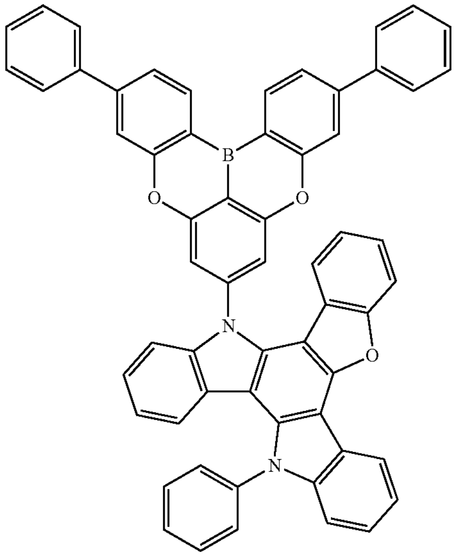

Compound T-40
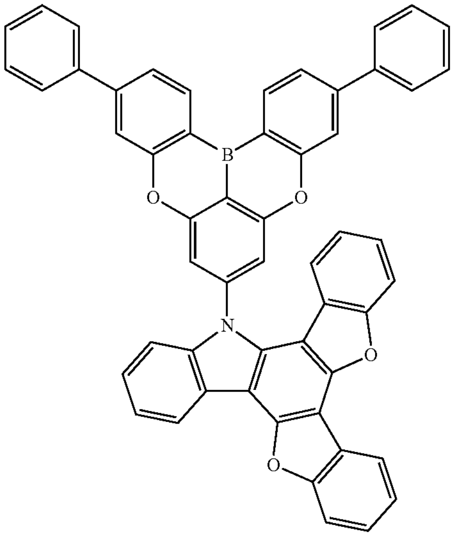
Compound T-41
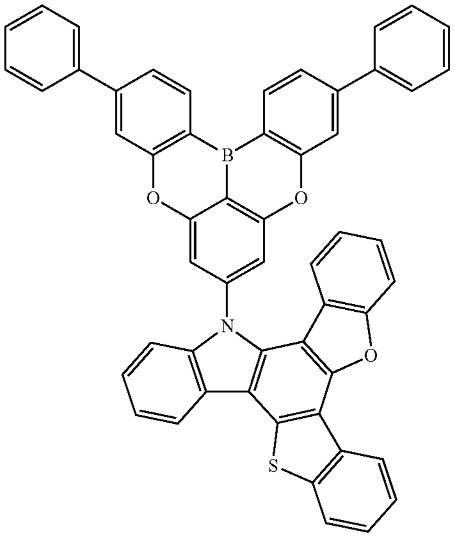
Compound T-42
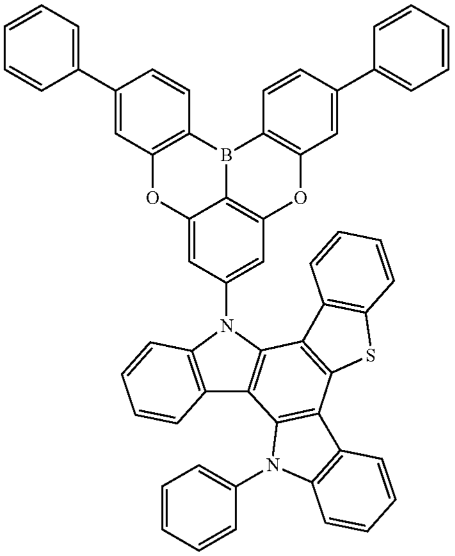
Compound T-43
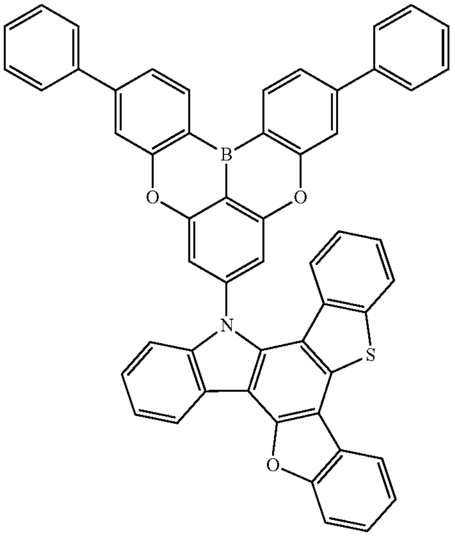

-continued
Compound T-44
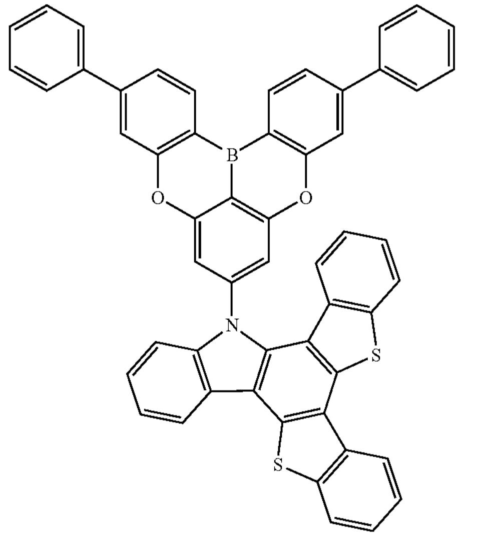
Compound T-45
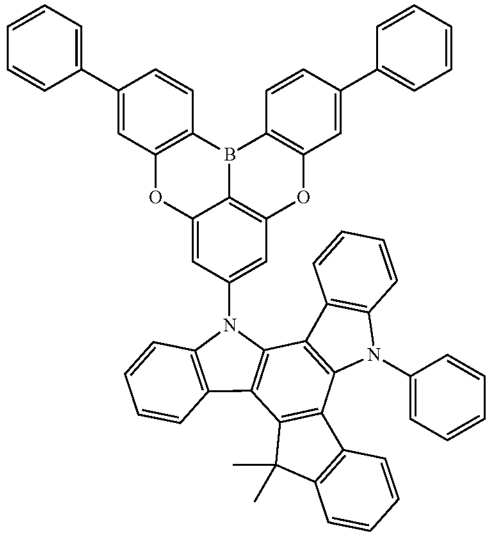
Compound T-46
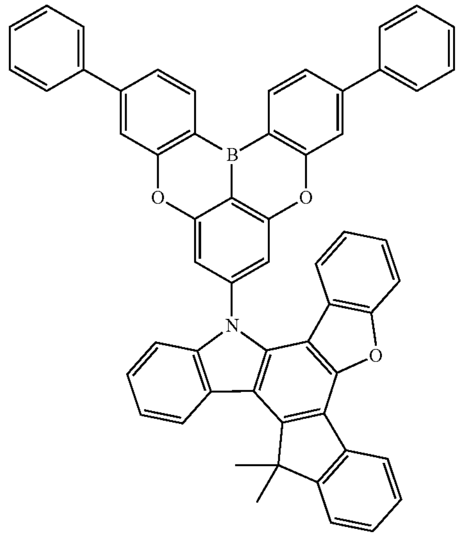
-continued
Compound T-47
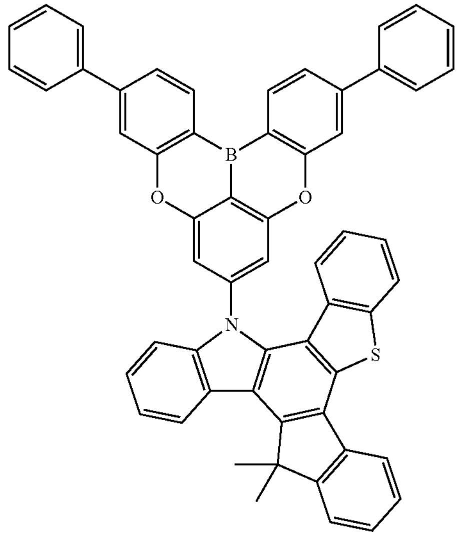
Compound T-48
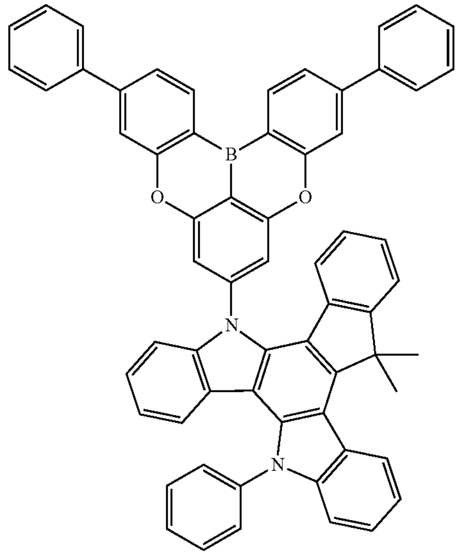
Compound T-49
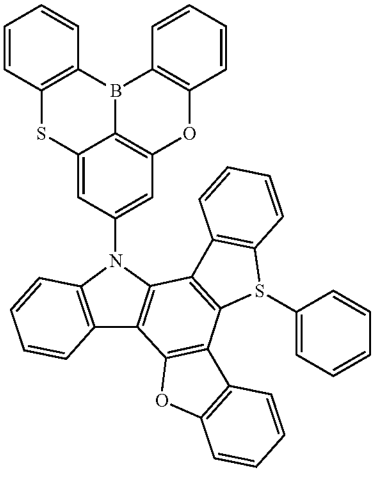

-continued
Compound T-50
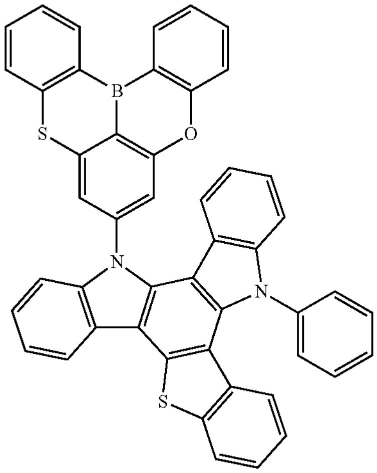
Compound T-51
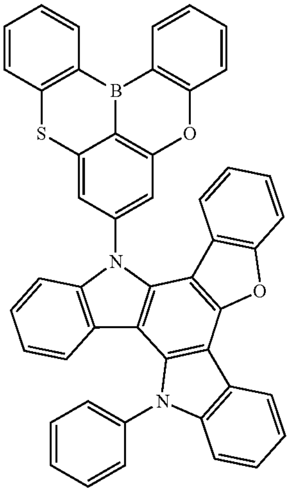
Compound T-52
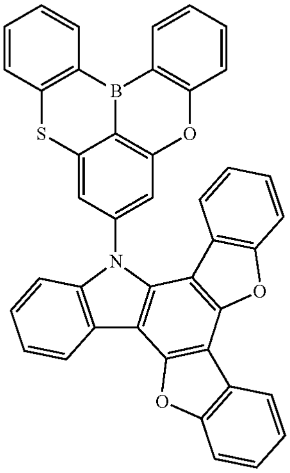
-continued
Compound T-53
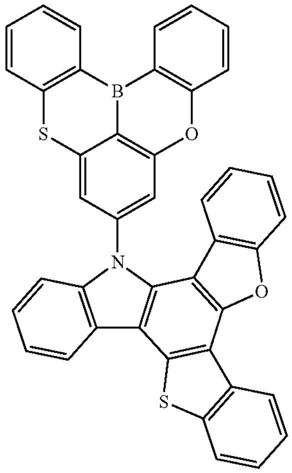
Compound T-54
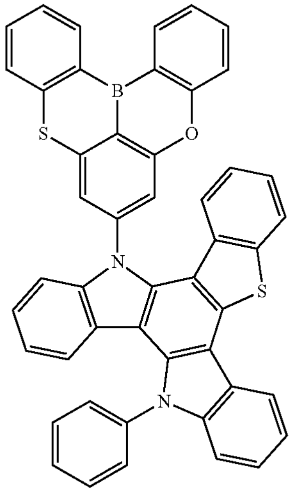
Compound T-55
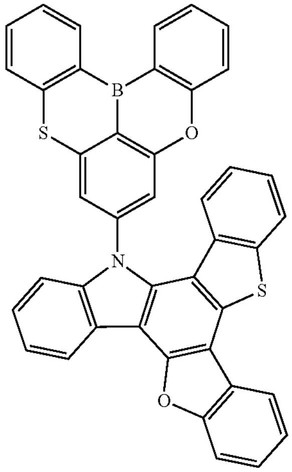

-continued
Compound T-56
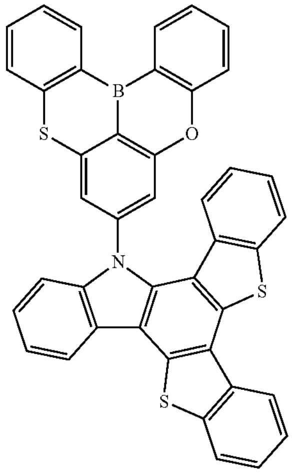
Compound T-57
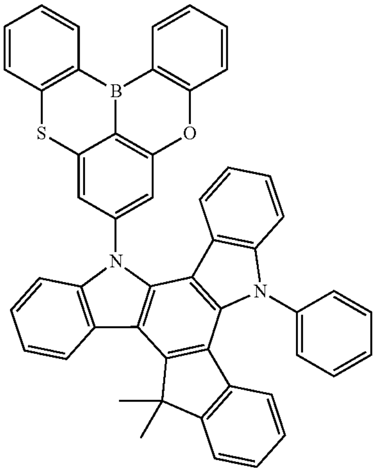
Compound T-58
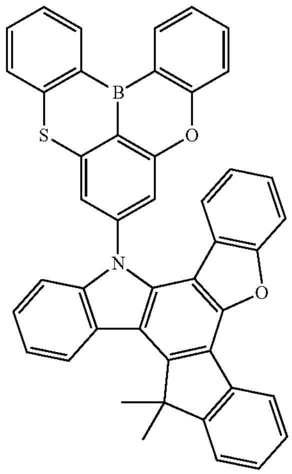
-continued
Compound T-59
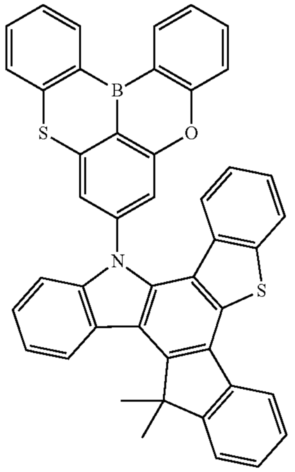
Compound T-60
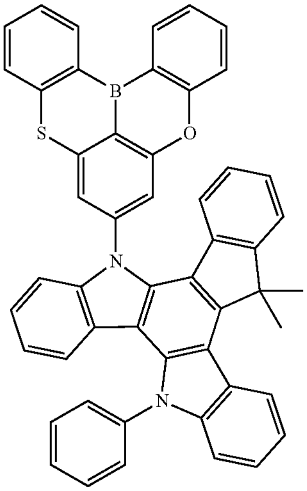
Compound T-61
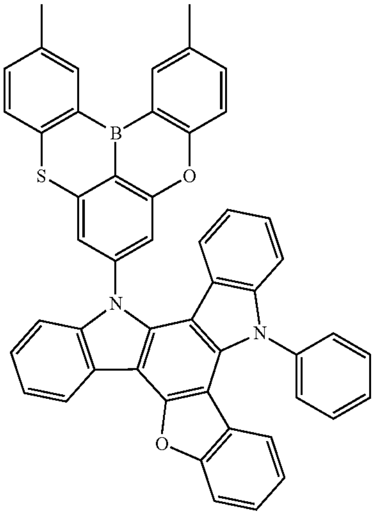

-continued
Compound T-62
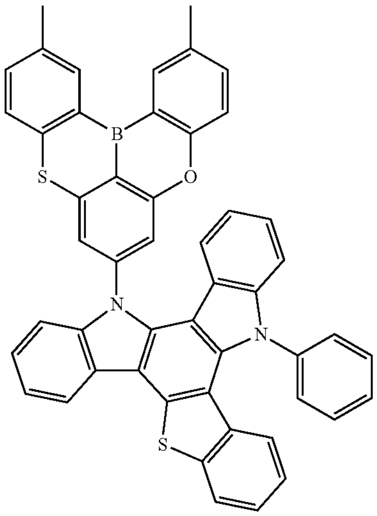
Compound T-63
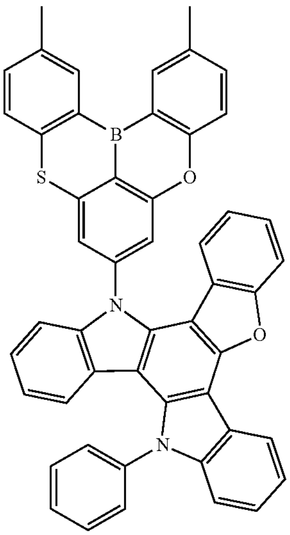
Compound T-64
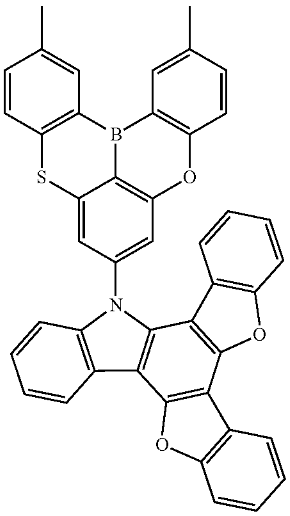
-continued
Compound T-65
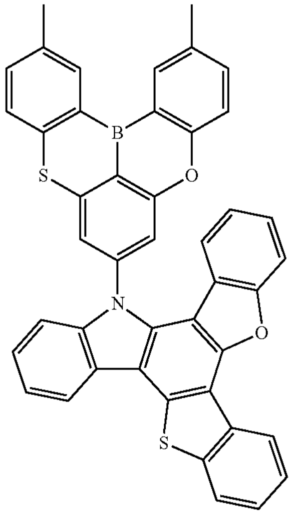
Compound T-66
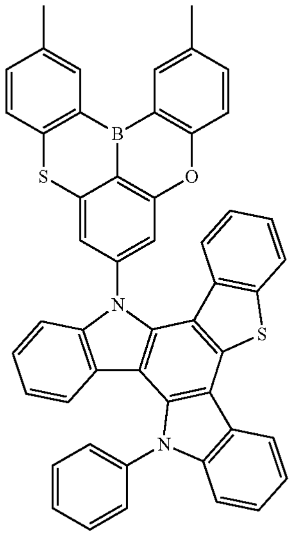
Compound T-67
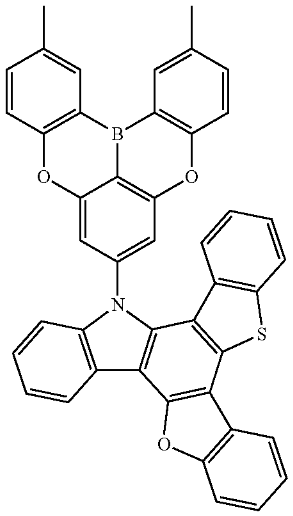

-continued
Compound T-68
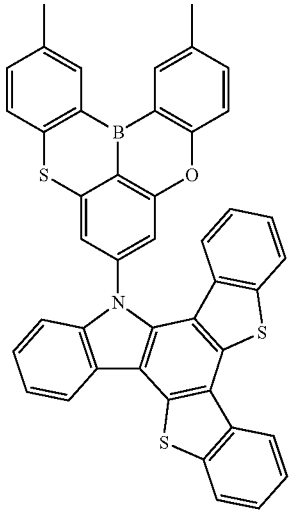
Compound T-69
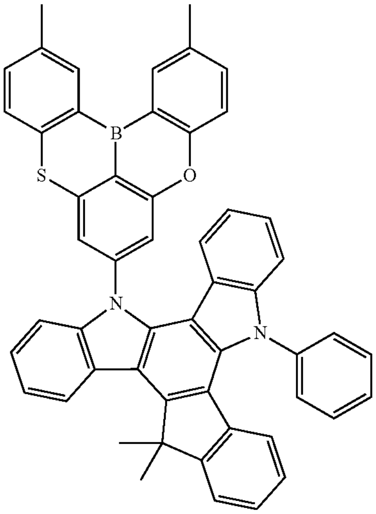
Compound T-70
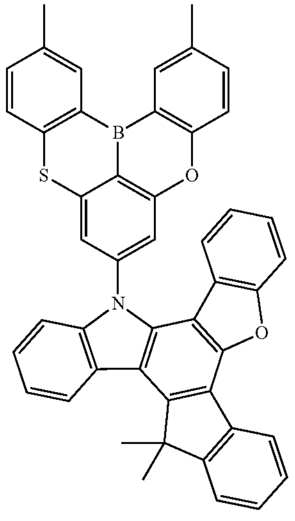
-continued
Compound T-71
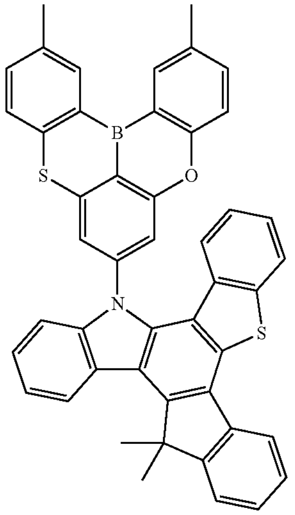
Compound T-72
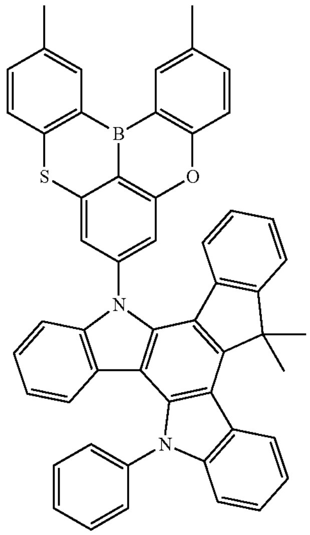
Compound T-73
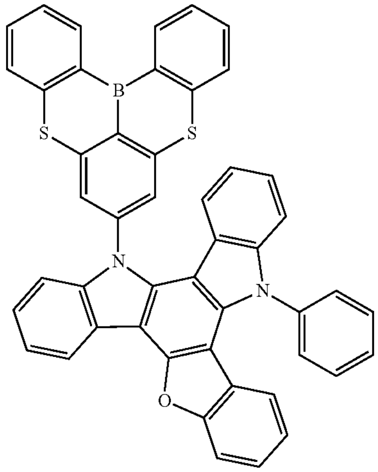

-continued
Compound T-74
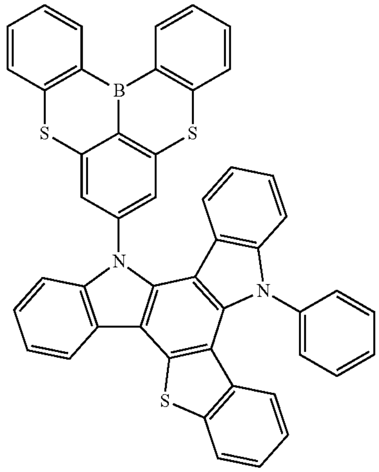
Compound T-75
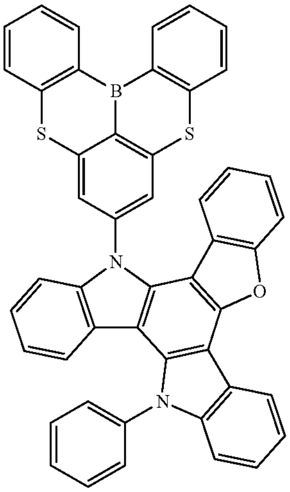
Compound T-76
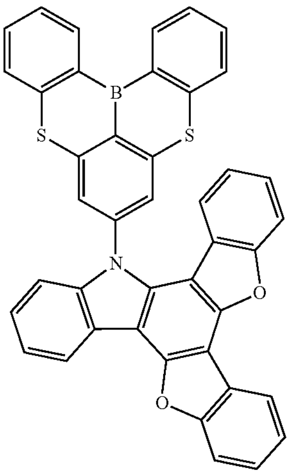
-continued
Compound T-77
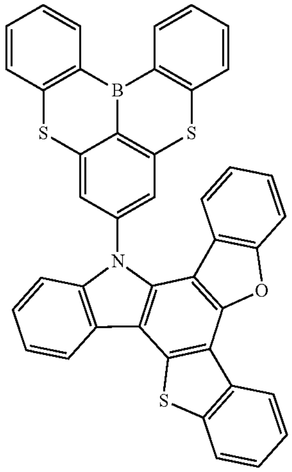
Compound T-78
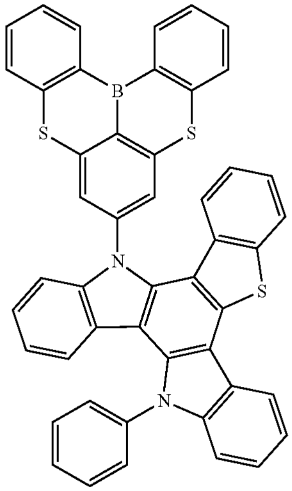
Compound T-79
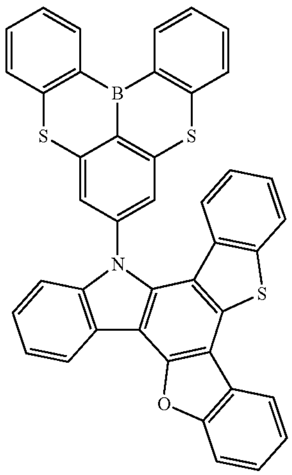

Compound T-80
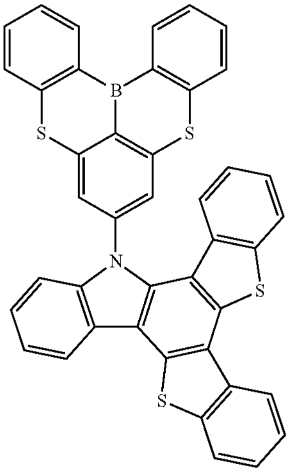
Compound T-81
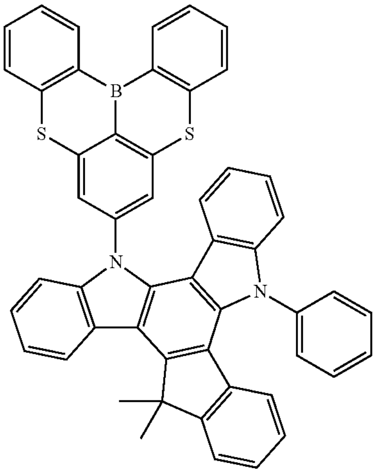
Compound T-82
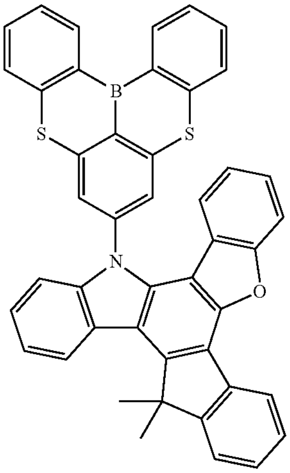
Compound T-83
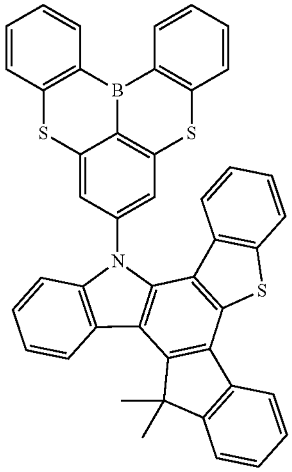
Compound T-84
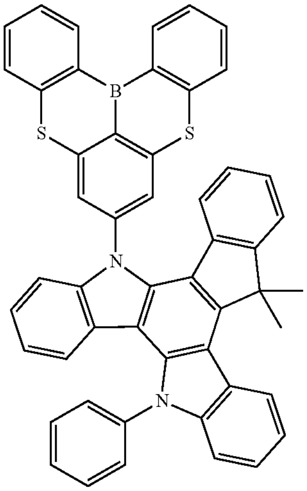
Compound T-85
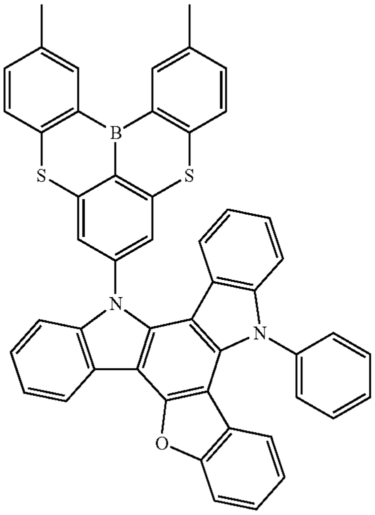

-continued
Compound T-86
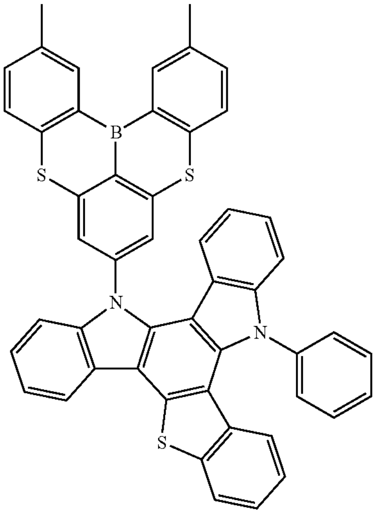
Compound T-87
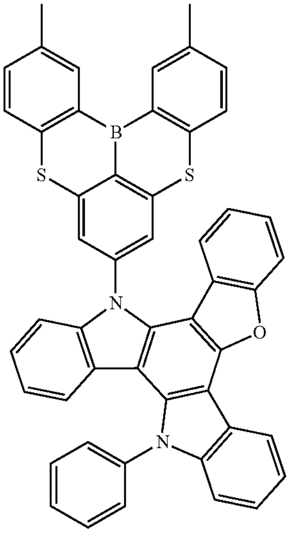
Compound T-88
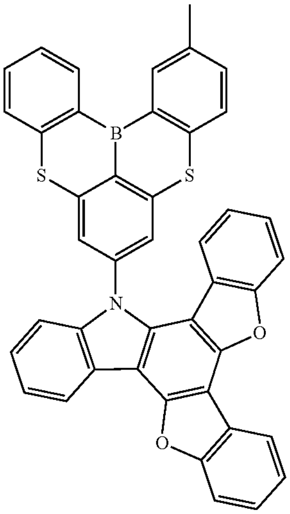
-continued
Compound T-89
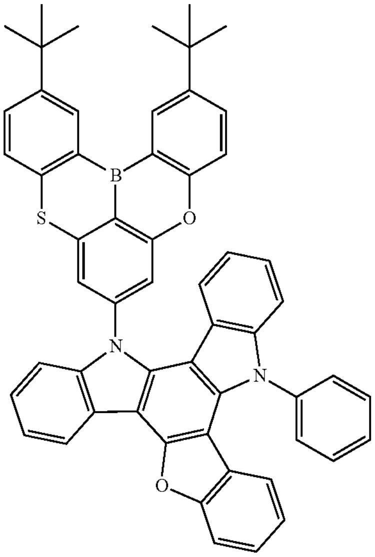
Compound T-90
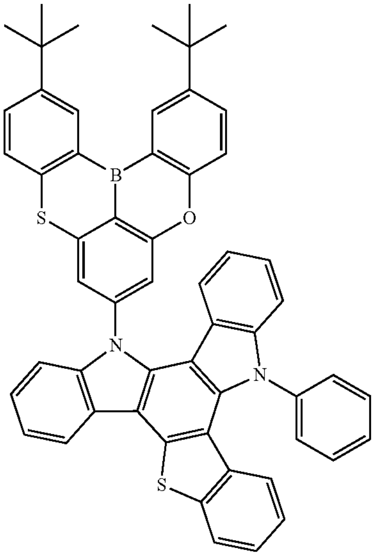

-continued
Compound T-91
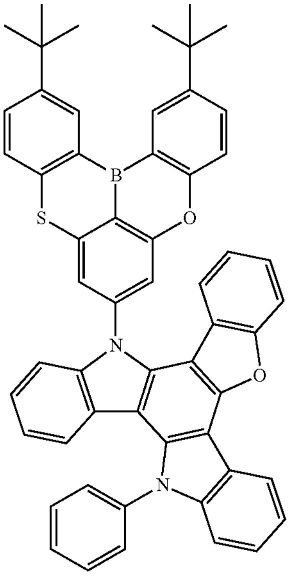
Compound T-92
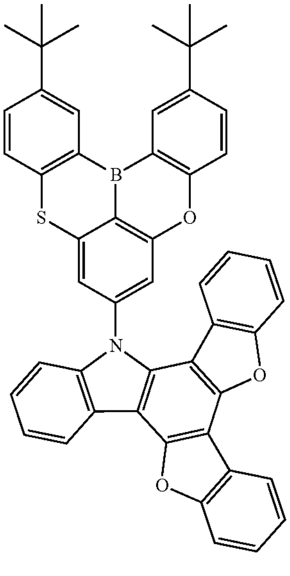
-continued
Compound T-93
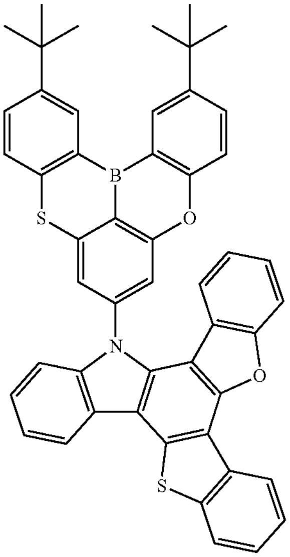
Compound T-94
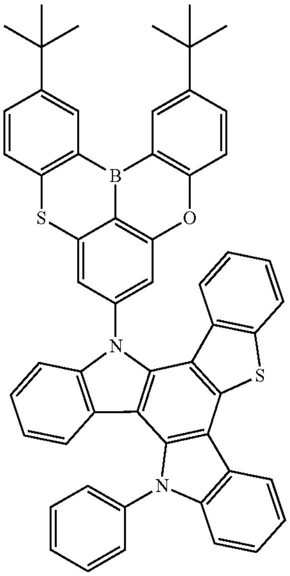

-continued
Compound T-95
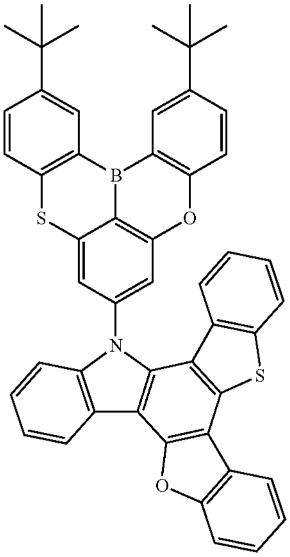
Compound T-96
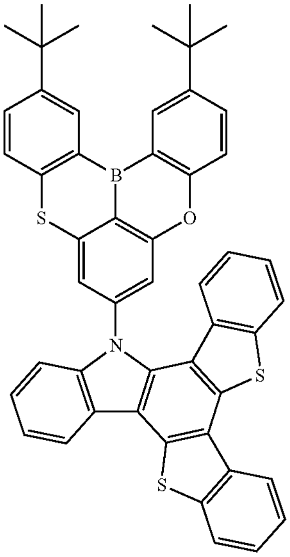
Compound T-97
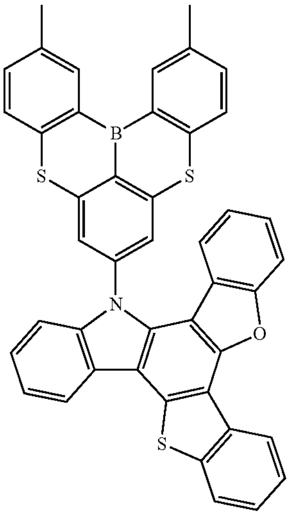
-continued
Compound T-98
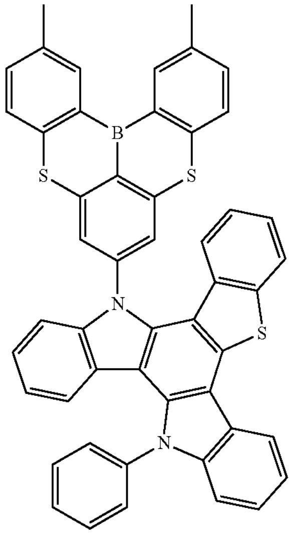
Compound T-99
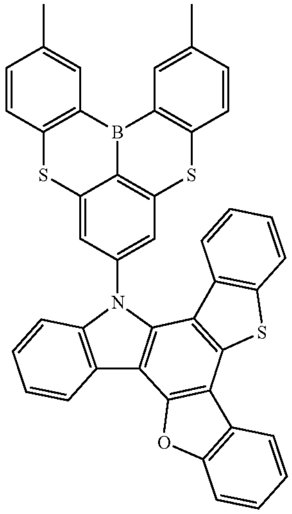
Compound T-100
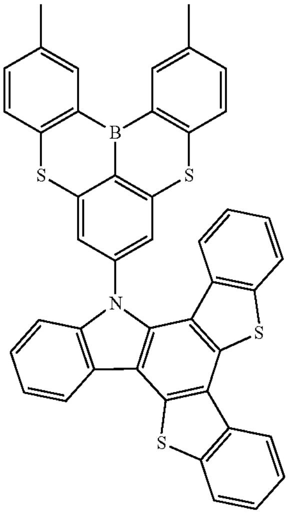

-continued
Compound T-101
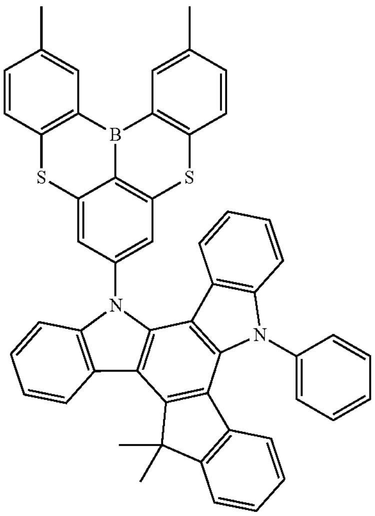
Compound T-102
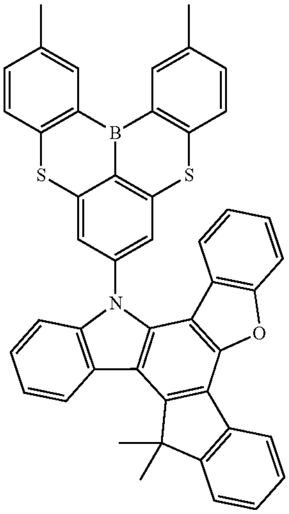
Compound T-103
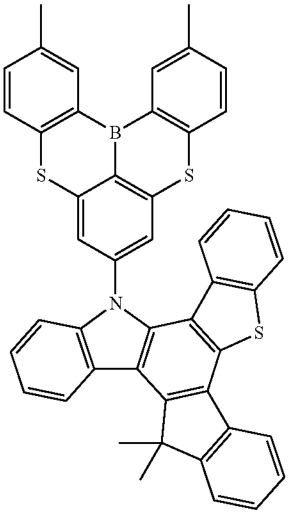
-continued
Compound T-104
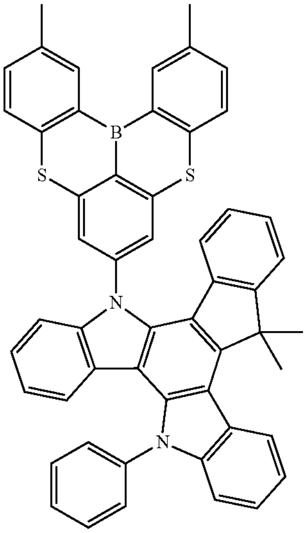
Compound T-105
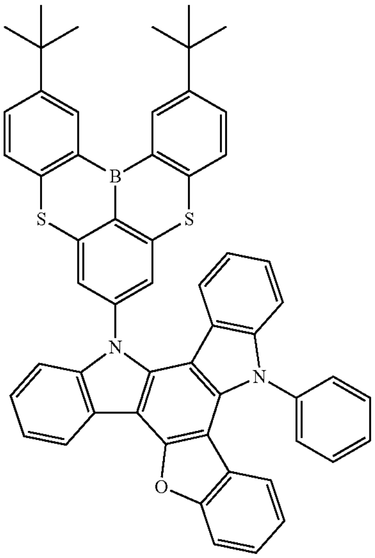
Compound T-106
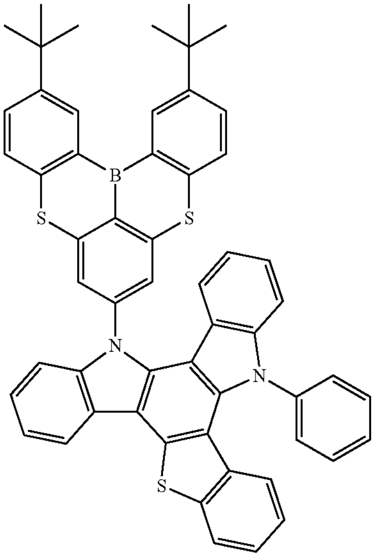

-continued
Compound T-107
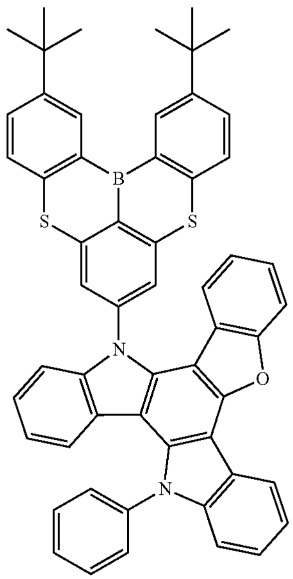
Compound T-108
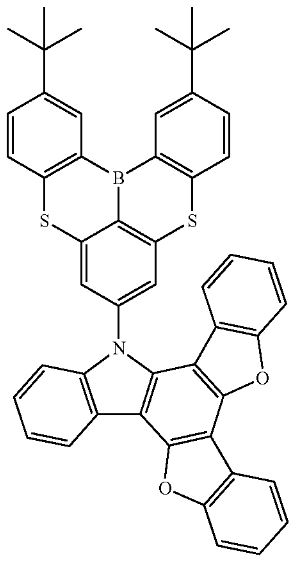
-continued
Compound T-109
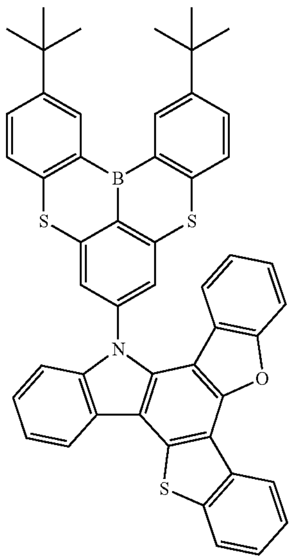
Compound T-110
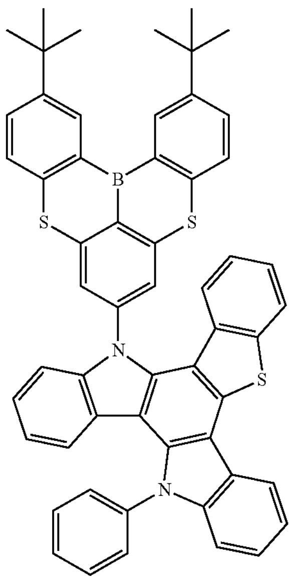

-continued
Compound T-111
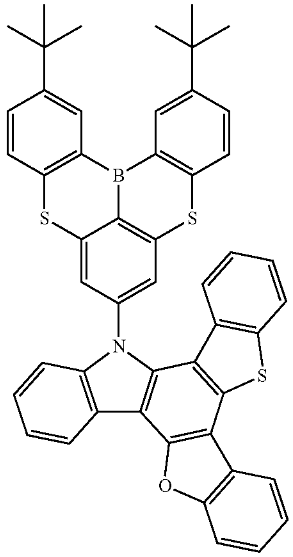
Compound T-112
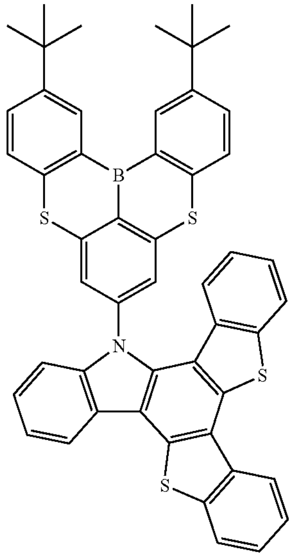
Compound T-113
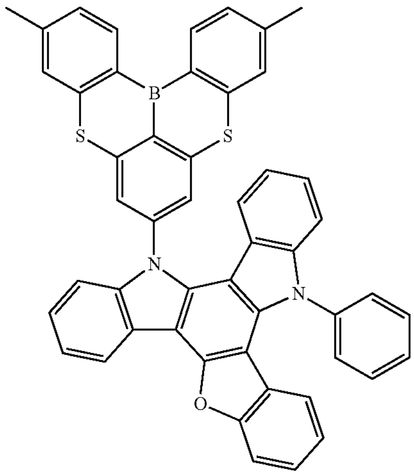
-continued
Compound T-114
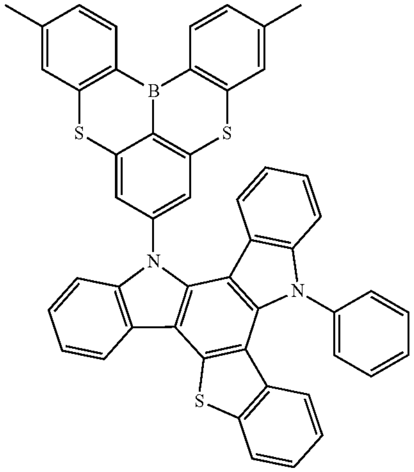
Compound T-115
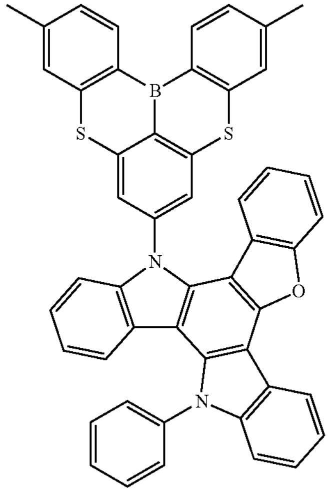
Compound T-116
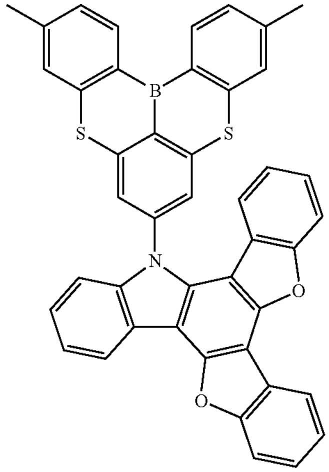

-continued
Compound T-117
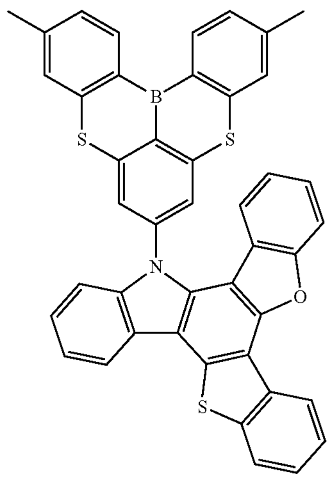
Compound T-118
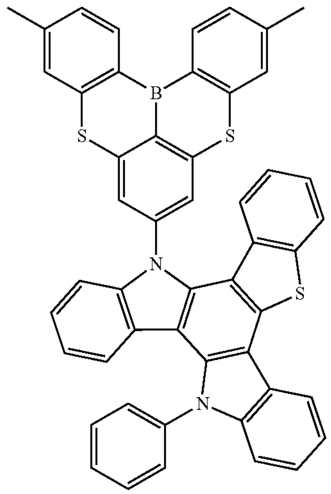
Compound T-119
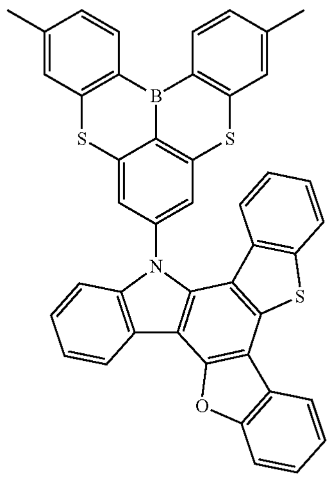
-continued
Compound T-120
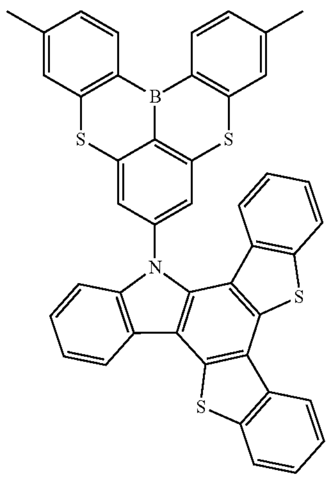
Compound T-121
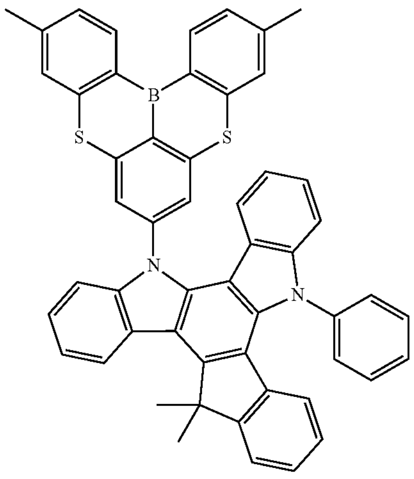
Compound T-122
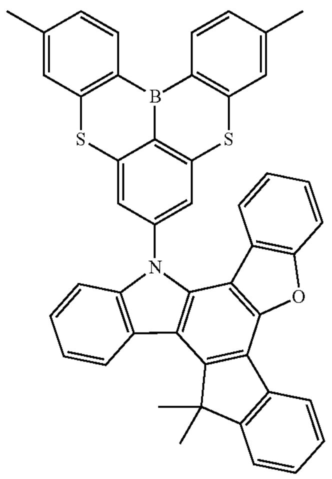

-continued
Compound T-123
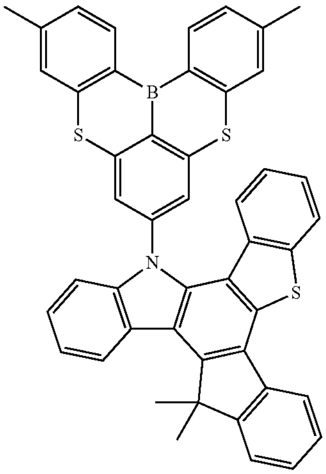
Compound T-124
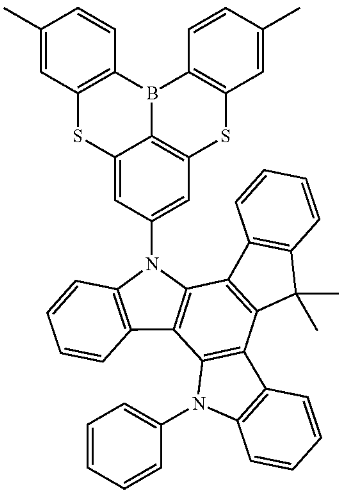
Compound T-125
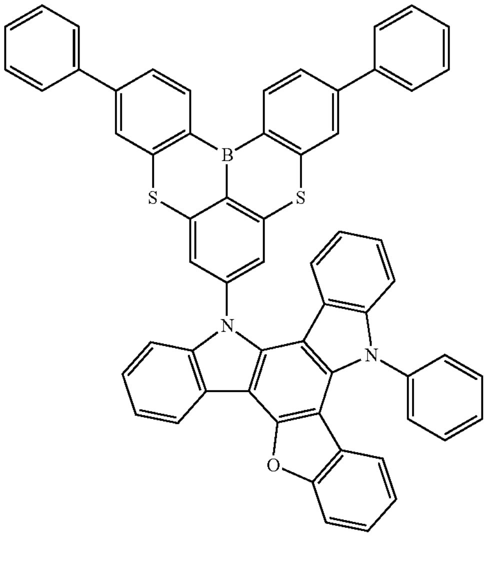
-continued
Compound T-126
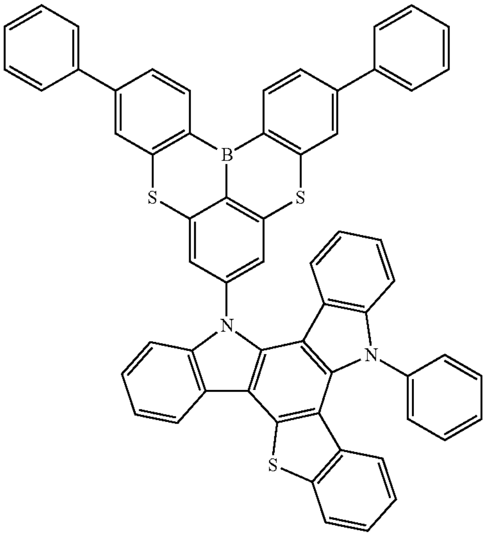
Compound T-127
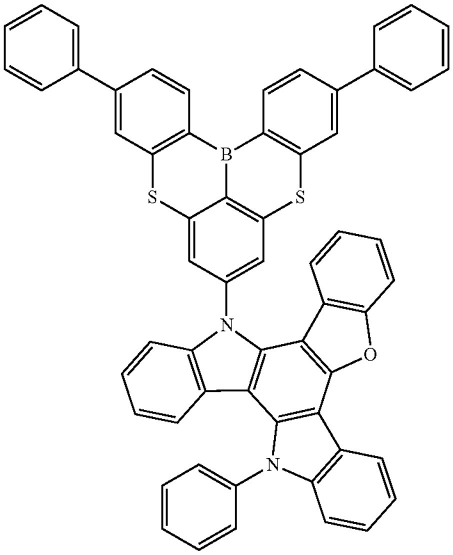

-continued
Compound T-128
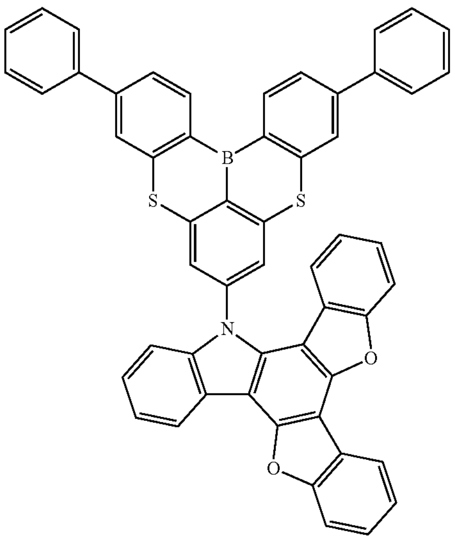
Compound T-129
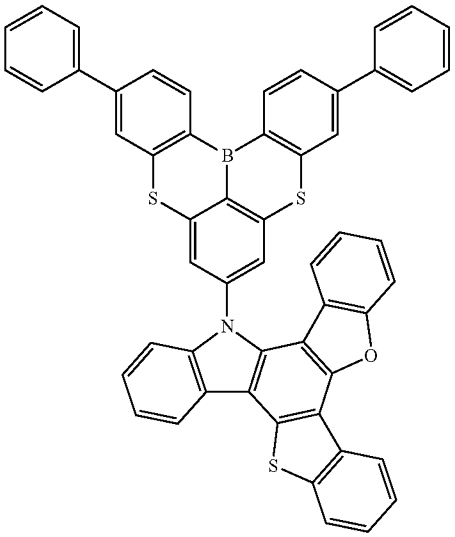
-continued
Compound T-130
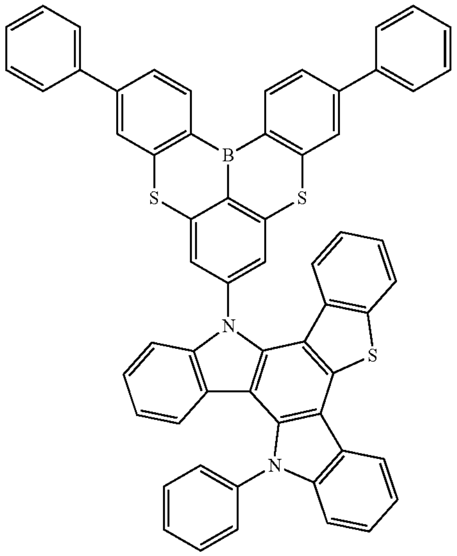
Compound T-131
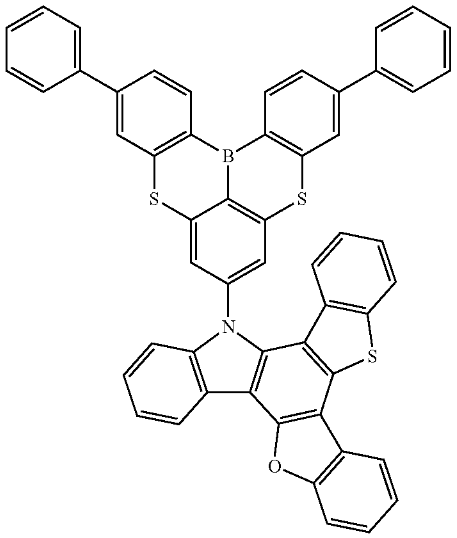

-continued
Compound T-132
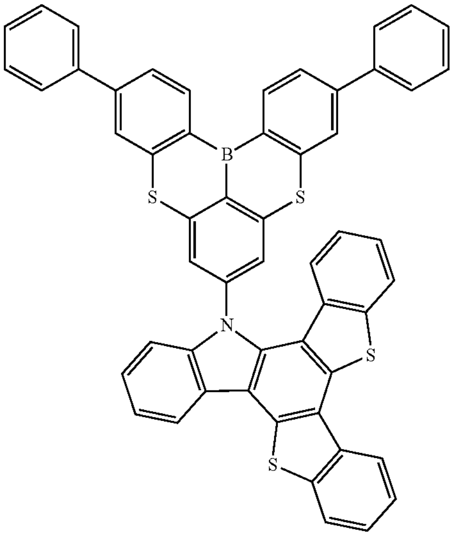
Compound T-133
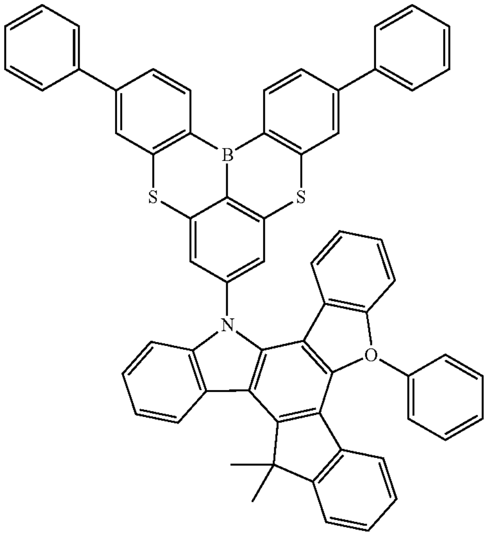
Compound T-134
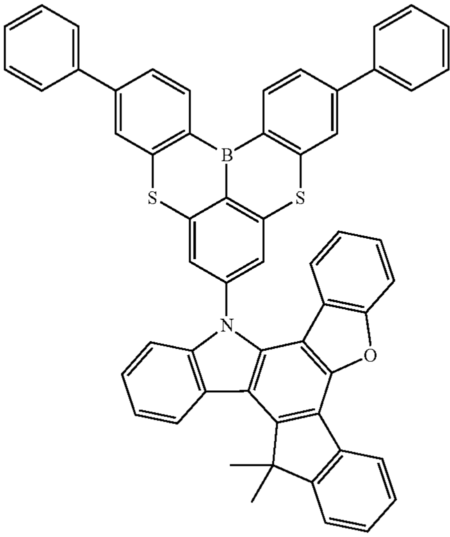
-continued
Compound T-135
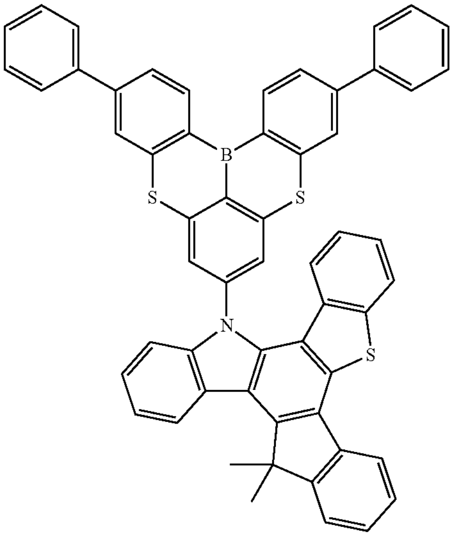
Compound T-136
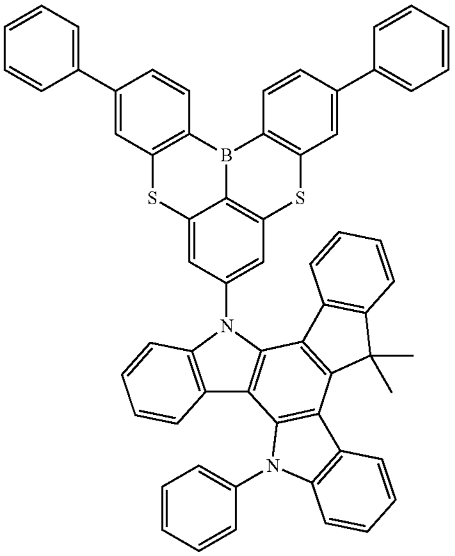

-continued
Compound T-137
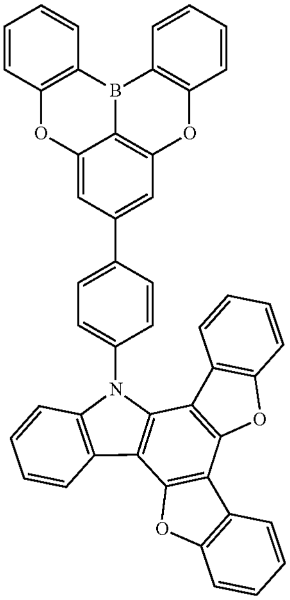
Compound T-138
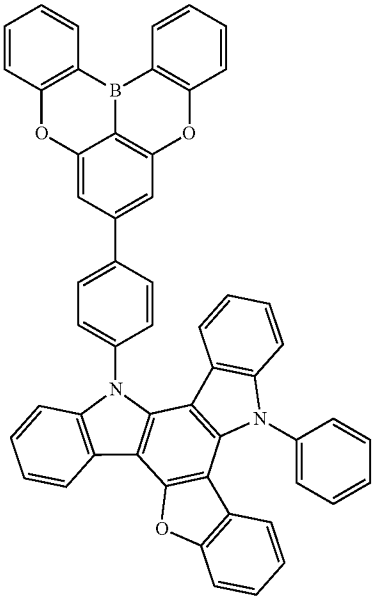
-continued
Compound T-139
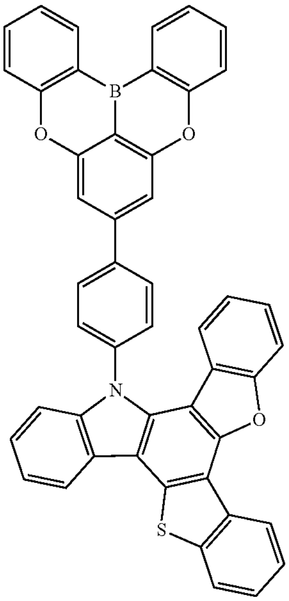
Compound T-140
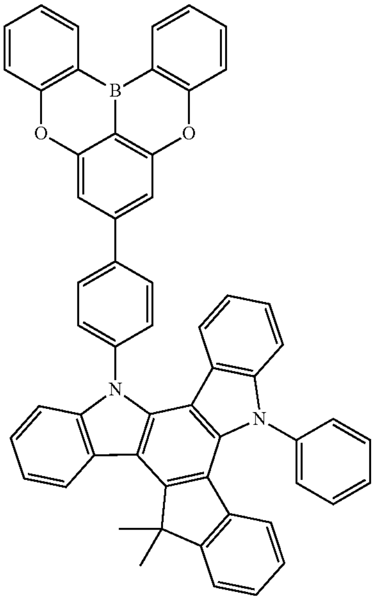

-continued

Compound T-141

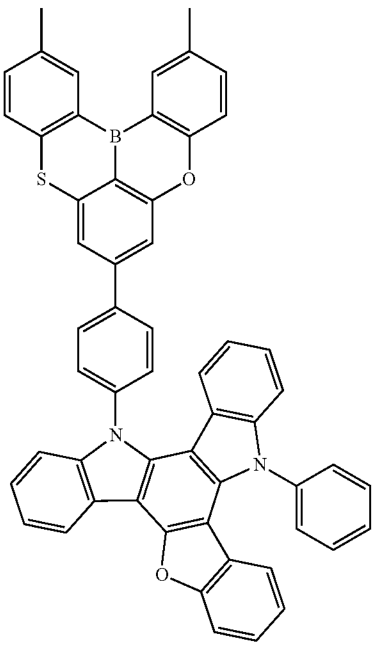

Compound T-142

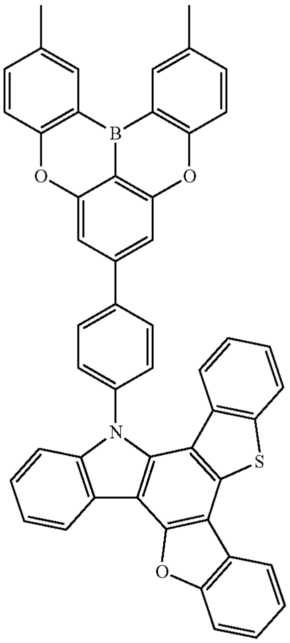

-continued

Compound T-143

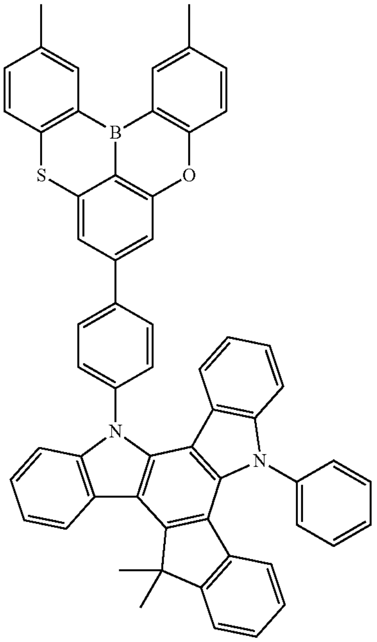

Compound T-144

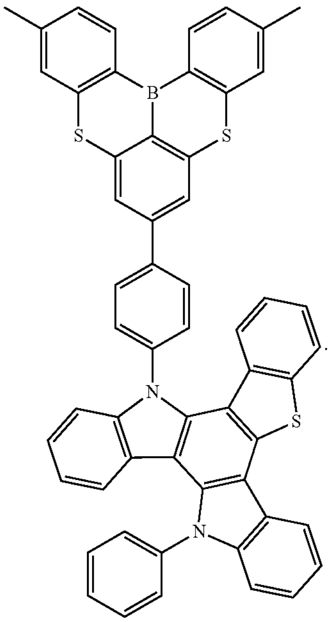

3. An organic light-emitting device comprising:

a first electrode;

a second electrode provided to face the first electrode; and one or more organic material layers interposed between the first electrode and the second electrode, wherein one or more of the organic material layers include one or more of the delayed fluorescence compounds according to claim 1.

4. The organic light-emitting device of claim 3, wherein one or more of the organic material layers include a fluorescence compound represented by Chemical Formula 3 below:

[Chemical Formula 3]

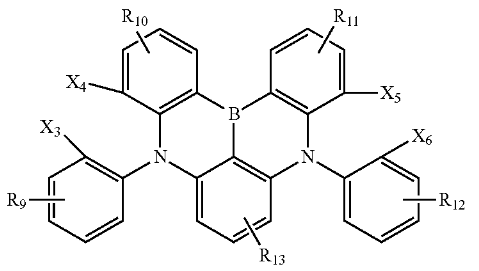

in Chemical Formula 3, $R_9$ to $R_{13}$ are each independently selected from hydrogen, deuterium, —F, —Cl, —Br, —I, a hydroxyl group, a cyano group, a nitro group, an amino group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted monovalent non-aromatic condensed polycyclic group, and a substituted or unsubstituted monovalent non-aromatic heterocondensed polycyclic group; and $X_3$ to $X_6$ are each independently hydrogen or bind together to form a ring.

5. The organic light-emitting device of claim 4, wherein the fluorescence compound represented by Chemical Formula 3 is represented by any one of the following Chemical Formulas F-1 to F-35:

Compound F-1

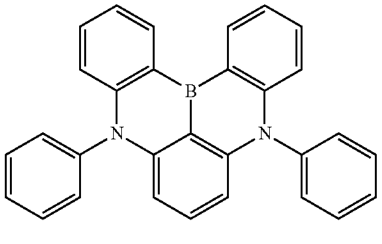

Compound F-2

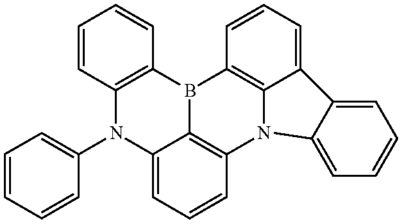

-continued

Compound F-3

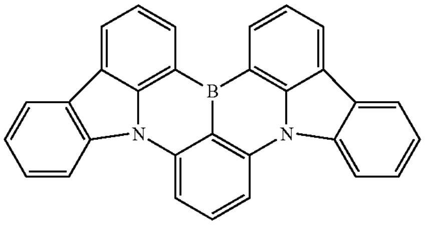

Compound F-4

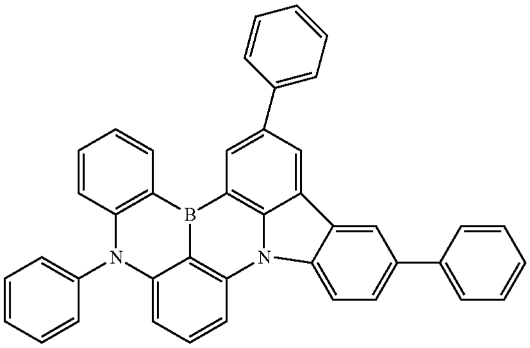

Compound F-5

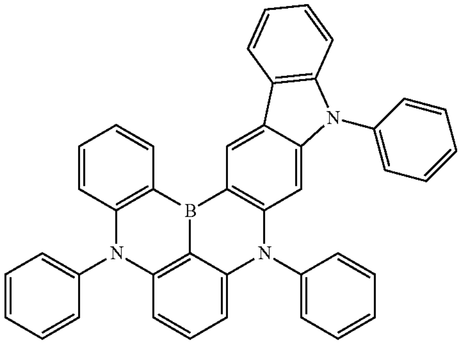

Compound F-6

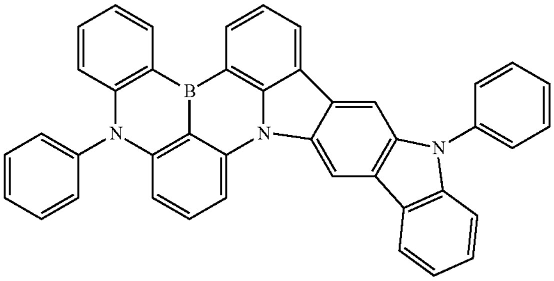

Compound F-7

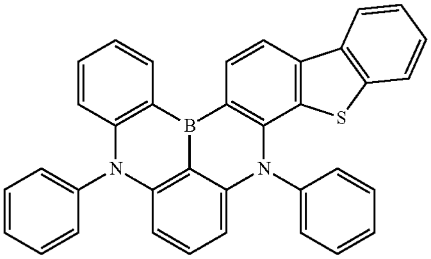

-continued
Compound F-8
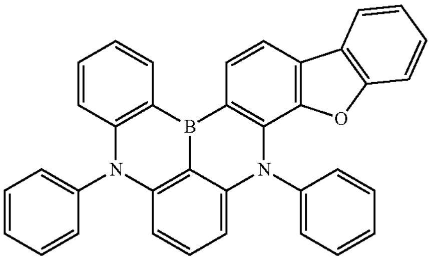
Compound F-9
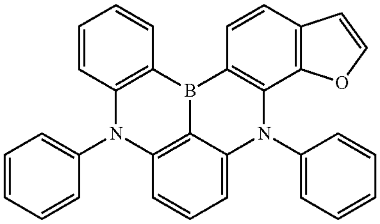
Compound F-10
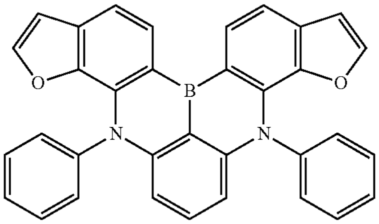
Compound F-11
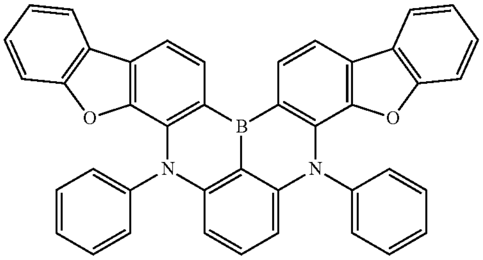
Compound F-12
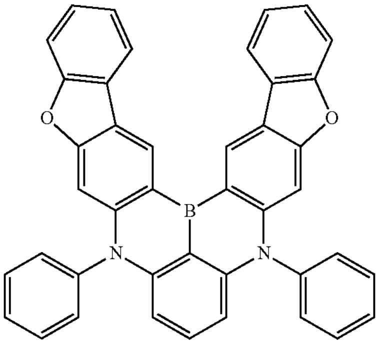
-continued
Compound F-13
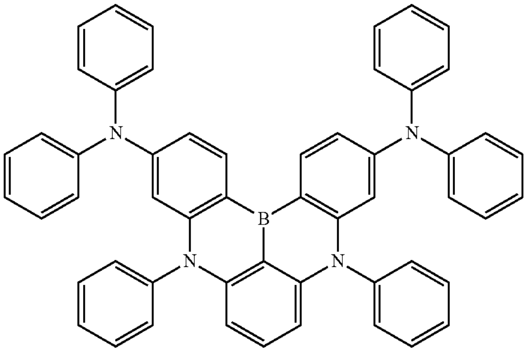
Compound F-14
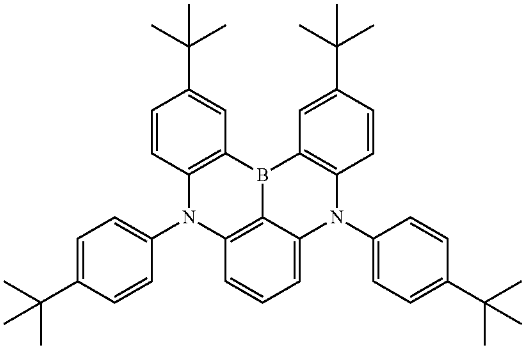
Compound F-15
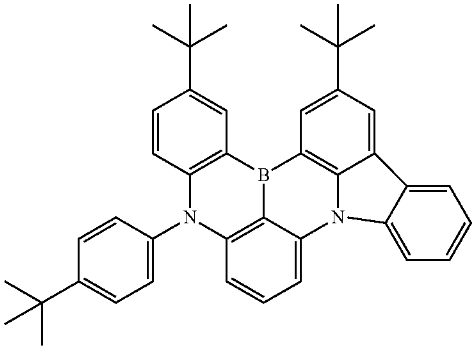
Compound F-16
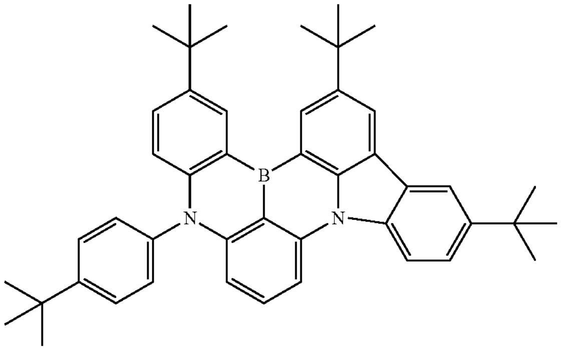

-continued
Compound F-17
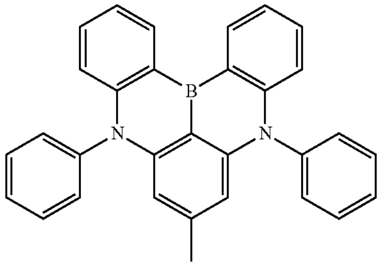
Compound F-18
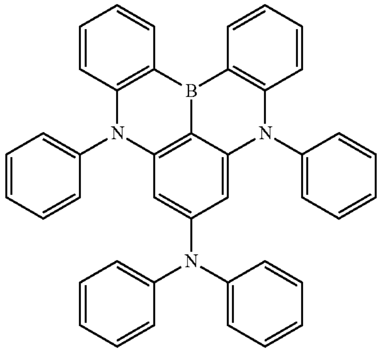
Compound F-19
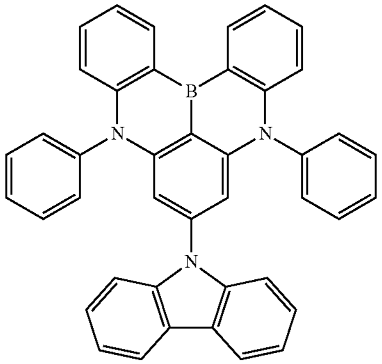
Compound F-20
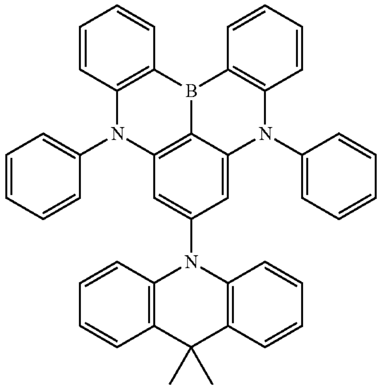
-continued
Compound F-21
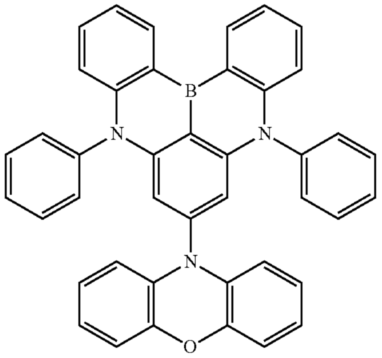
Compound F-22
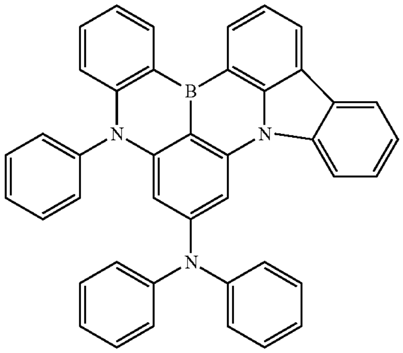
Compound F-23
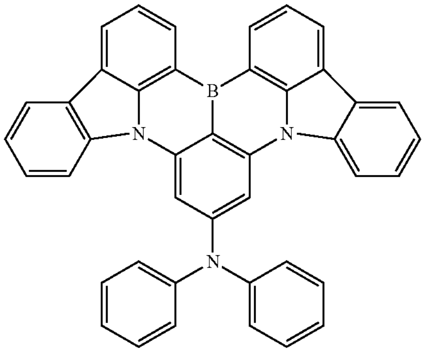
Compound F-24
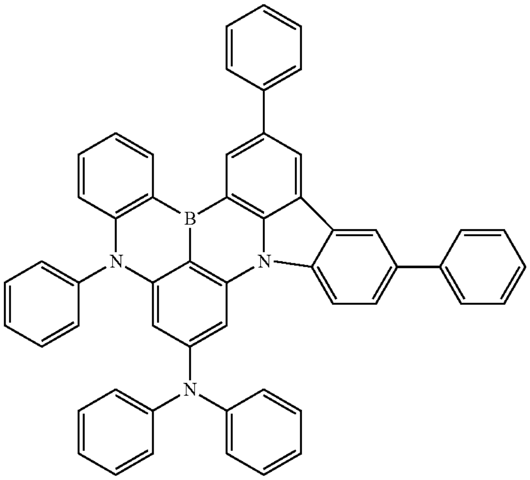

-continued
Compound F-25
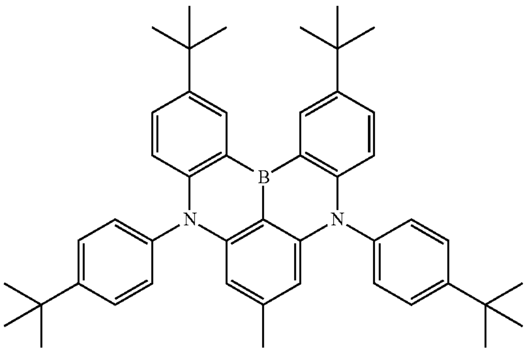
Compound F-26
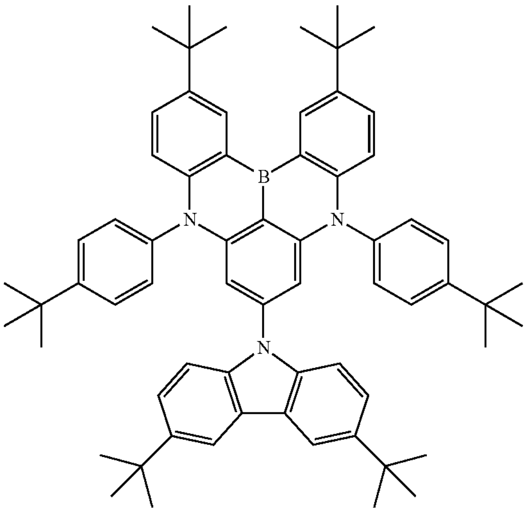
Compound F-27
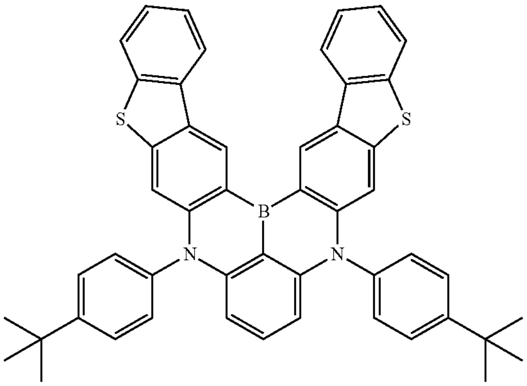
Compound F-28
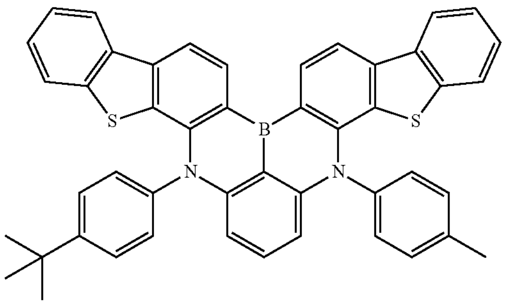
-continued
Compound F-29
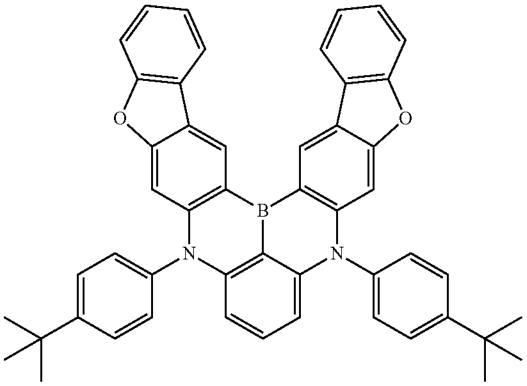
Compound F-30
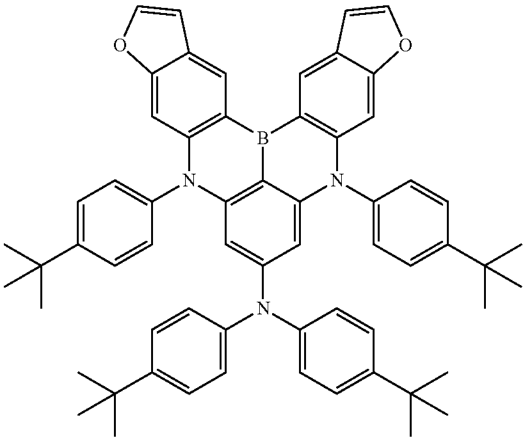
Compound F-31
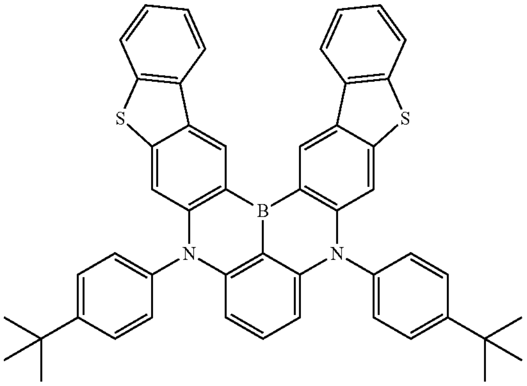
Compound F-32
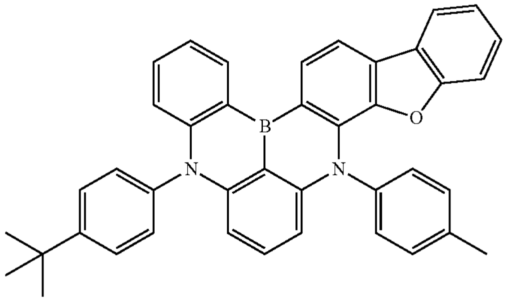

-continued

Compound F-33

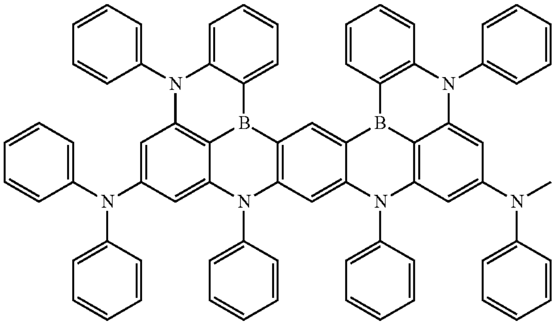

Compound F-34

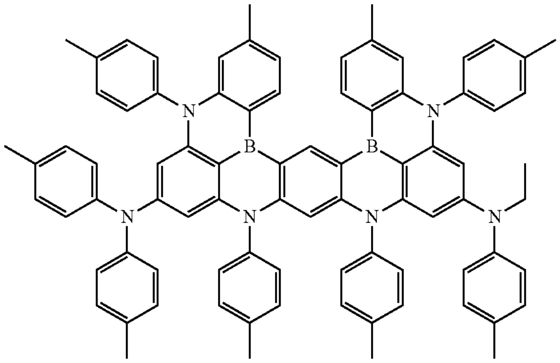

-continued

Compound F-35

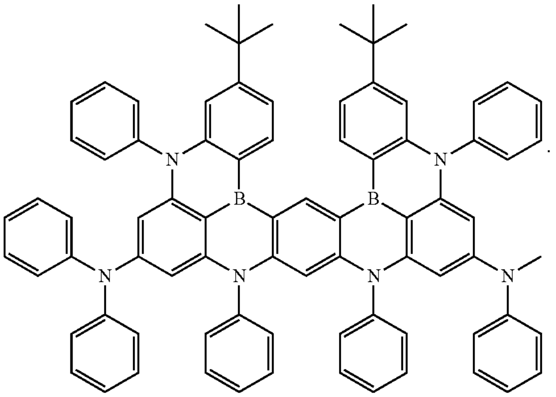

6. The organic light-emitting device of claim 3, wherein the first electrode is an anode, the second electrode is a cathode, and the organic material layer comprises: a light-emitting layer comprising the one or more of the delayed fluorescence compounds; a hole transport region interposed between the first electrode and the light-emitting layer and including at least one of a hole injection layer, a hole transport layer, and an electron blocking layer; and an electron transport region interposed between the light-emitting layer and the second electrode and including at least one of a hole blocking layer, an electron transport layer, and an electron injection layer.

7. The organic light-emitting device of claim 4, wherein the first electrode is an anode, the second electrode is a cathode, and the organic material layer comprises: a light-emitting layer including the one or more of the delayed fluorescence compounds and the fluorescence compound represented by Chemical Formula 3; a hole transport region interposed between the first electrode and the light-emitting layer and including at least one of a hole injection layer, a hole transport layer, and an electron blocking layer; and an electron transport region interposed between the light-emitting layer and the second electrode and including at least one of a hole blocking layer, an electron transport layer, and an electron injection layer.

* * * * *